(12) United States Patent
Cibere et al.

(10) Patent No.: US 9,279,727 B2
(45) Date of Patent: Mar. 8, 2016

(54) METHODS, APPARATUS AND MEDIA FOR DETERMINING A SHAPE OF AN IRRADIANCE PULSE TO WHICH A WORKPIECE IS TO BE EXPOSED

(75) Inventors: Joseph Cibere, Burnaby (CA); David Malcolm Camm, Vancouver (CA)

(73) Assignee: Mattson Technology, Inc., Fremont, CA (US)

( * ) Notice: Subject to any disclaimer, the term of this patent is extended or adjusted under 35 U.S.C. 154(b) by 359 days.

(21) Appl. No.: 13/824,269

(22) PCT Filed: Oct. 14, 2011

(86) PCT No.: PCT/CA2011/001161
§ 371 (c)(1),
(2), (4) Date: Aug. 1, 2013

(87) PCT Pub. No.: WO2012/048419
PCT Pub. Date: Apr. 19, 2012

(65) Prior Publication Data
US 2013/0306871 A1    Nov. 21, 2013

Related U.S. Application Data

(60) Provisional application No. 61/393,836, filed on Oct. 15, 2010.

(51) Int. Cl.
*G01J 5/02*    (2006.01)
*H01L 21/67*    (2006.01)
*H01L 21/66*    (2006.01)

(52) U.S. Cl.
CPC ............. *G01J 5/02* (2013.01); *H01L 21/67115* (2013.01); *H01L 21/67248* (2013.01); *H01L 22/12* (2013.01); *H01L 22/20* (2013.01)

(58) Field of Classification Search
CPC ............ H01L 21/67115; H01L 21/324; H01L 21/67248; C21D 11/00
See application file for complete search history.

(56) References Cited

U.S. PATENT DOCUMENTS

| | | | |
|---|---|---|---|
| 2,794,938 A | 6/1957 | Moerkens | |
| 3,963,945 A | 6/1976 | Colyn | |

(Continued)

FOREIGN PATENT DOCUMENTS

| | | |
|---|---|---|
| JP | 60-258928 | 12/1985 |
| JP | 61-198735 | 9/1986 |

(Continued)

OTHER PUBLICATIONS

International Search Report for International Application No. PCT/CA2011/001161, mailed on Jan. 19, 2012.

(Continued)

*Primary Examiner* — David J Makiya
*Assistant Examiner* — Kenneth J Malkowski
(74) *Attorney, Agent, or Firm* — Knobbe, Martens, Olson & Bear, LLP

(57) ABSTRACT

A method and system for determining a shape of an irradiance pulse to which a semiconductor wafer is to be exposed during a thermal cycle are disclosed. The method includes receiving, with a processor circuit, thermal cycle parameters specifying requirements of the thermal cycle, and determining, with the processor circuit, a shape of a heating portion of the irradiance pulse. Determining includes optimizing at least one parameter of a flux profile model of the heating portion of the irradiance pulse to satisfy the requirements while minimizing frequency-domain energy spectral densities of the flux profile model at resonant frequencies of the wafer, to minimize vibration of the wafer at the resonant frequencies when the wafer is exposed to the irradiance pulse.

81 Claims, 12 Drawing Sheets

(56) References Cited

U.S. PATENT DOCUMENTS

| | | |
|---|---|---|
| 4,255,046 A | 3/1981 | Corona |
| 4,539,431 A | 9/1985 | Moddel et al. |
| 4,698,486 A | 10/1987 | Sheets |
| 4,789,992 A | 12/1988 | Wickersheim et al. |
| 4,881,013 A | 11/1989 | Kataoka et al. |
| 5,001,327 A | 3/1991 | Hirasawa et al. |
| 5,188,458 A | 2/1993 | Thompson et al. |
| 5,343,012 A | 8/1994 | Hardy et al. |
| 5,430,271 A | 7/1995 | Orgami et al. |
| 5,497,051 A | 3/1996 | Langhans et al. |
| 5,561,735 A | 10/1996 | Camm |
| 5,660,472 A | 8/1997 | Peuse et al. |
| 5,747,944 A | 5/1998 | Harada |
| 5,755,511 A | 5/1998 | Peuse et al. |
| 5,823,681 A | 10/1998 | Cabib et al. |
| 5,841,110 A | 11/1998 | Nenyei et al. |
| 5,848,842 A | 12/1998 | Peuse et al. |
| 6,056,434 A | 5/2000 | Champetier |
| 6,154,241 A | 11/2000 | Matsukawa et al. |
| 6,179,466 B1 | 1/2001 | Peuse et al. |
| 6,303,411 B1 | 10/2001 | Camm et al. |
| 6,350,326 B1 | 2/2002 | McCay et al. |
| 6,366,308 B1 | 4/2002 | Hawryluk et al. |
| 6,391,690 B2 | 5/2002 | Miyasaka |
| 6,534,752 B2 | 3/2003 | Camm et al. |
| 6,594,446 B2 | 7/2003 | Camm et al. |
| 6,621,199 B1 | 9/2003 | Parfuniuk et al. |
| 6,630,991 B2 | 10/2003 | Kitamura et al. |
| 6,660,572 B2 | 12/2003 | Miyasaka |
| 6,671,235 B1 | 12/2003 | Hawryluk et al. |
| 6,716,748 B2 | 4/2004 | Kersch |
| 6,798,142 B2 | 9/2004 | Eguchi |
| 6,849,831 B2 | 2/2005 | Timans et al. |
| 6,855,916 B1 | 2/2005 | Matthews et al. |
| 6,888,319 B2 | 5/2005 | Inochkin et al. |
| 6,897,130 B2 | 5/2005 | Miyauchi et al. |
| 6,941,063 B2 | 9/2005 | Camm et al. |
| 6,963,692 B2 | 11/2005 | Camm et al. |
| 6,970,644 B2 | 11/2005 | Koren et al. |
| 7,001,829 B1 | 2/2006 | Yamazaki |
| 7,184,657 B1 | 2/2007 | Camm et al. |
| 7,186,981 B2 | 3/2007 | Shepard et al. |
| 7,223,660 B2 | 5/2007 | Hwang |
| 7,269,343 B2 | 9/2007 | Koren et al. |
| 7,358,200 B2 | 4/2008 | Yoo |
| 7,371,998 B2 | 5/2008 | Harris et al. |
| 7,616,872 B2 | 11/2009 | Camm et al. |
| 2002/0113060 A1 | 8/2002 | Sandhu |
| 2004/0178553 A1 | 9/2004 | Camm et al. |
| 2004/0188396 A1* | 9/2004 | Talwar ............... B23K 26/032 219/121.65 |
| 2004/0263090 A1 | 12/2004 | Erlbacher et al. |
| 2005/0018196 A1 | 1/2005 | Kusuda |
| 2005/0018748 A1 | 1/2005 | Ringermacher et al. |
| 2005/0062388 A1 | 3/2005 | Camm et al. |
| 2005/0063448 A1 | 3/2005 | Kusuda |
| 2005/0063453 A1 | 3/2005 | Camm et al. |
| 2005/0133167 A1* | 6/2005 | Camm ............. H01L 21/67115 156/345.51 |
| 2005/0179354 A1 | 8/2005 | Camm et al. |
| 2006/0096677 A1 | 5/2006 | Camm et al. |
| 2006/0201927 A1 | 9/2006 | Gat et al. |
| 2007/0052373 A1 | 3/2007 | Hui et al. |
| 2007/0069161 A1* | 3/2007 | Camm ............... F27B 17/0025 250/504 R |
| 2008/0273867 A1* | 11/2008 | Camm ............. H01L 21/67115 392/416 |
| 2008/0284837 A1 | 11/2008 | Cordingley et al. |
| 2009/0067823 A1 | 3/2009 | Kusuda |
| 2009/0103906 A1 | 4/2009 | Kusuda |
| 2009/0166351 A1 | 7/2009 | Yokomori |
| 2009/0263112 A1 | 10/2009 | Kiyama et al. |
| 2009/0285568 A1 | 11/2009 | Kiyama et al. |
| 2010/0111513 A1 | 5/2010 | Nishihara et al. |

FOREIGN PATENT DOCUMENTS

| | | |
|---|---|---|
| JP | 62-015826 | 1/1987 |
| JP | 62-112322 | 5/1987 |
| JP | 63-188940 | 8/1988 |
| JP | 2-294027 | 12/1990 |
| JP | 03-221821 | 9/1991 |
| JP | 5-216099 | 8/1993 |
| JP | 6-4002 | 1/1994 |
| JP | 6-147891 | 5/1994 |
| JP | 07-201765 | 8/1995 |
| JP | 08-255800 | 10/1996 |
| JP | 10-070085 | 3/1998 |
| JP | 10-504-936 | 5/1998 |
| JP | 2000-003875 | 1/2000 |
| JP | 2001-304971 | 10/2001 |
| JP | 03-007632 | 1/2003 |
| JP | 2003-7633 | 1/2003 |
| JP | 2005-079336 | 3/2005 |
| JP | 2005-243797 | 9/2005 |
| WO | WO 97/22142 | 6/1997 |
| WO | WO 03/060447 | 7/2003 |
| WO | WO 2004/057650 | 7/2004 |
| WO | WO 2005/029014 | 3/2005 |

OTHER PUBLICATIONS

Barak, "Optimal Design of Pulse Forming Networks and Flash Lamps for Thermal Flash Process," pp. 79-88, 12th IEEE International Conference on Advanced Thermal Processing of Semiconductors—RTP 2004.

Correra et al., "Incoherent-Light-Flash Annealing of Phosphorus-Implanted Silicon," Appl. Phys. Lett., vol. 37, No. 1, pp. 55-57, Jul. 1, 1980.

England et al., "Time-Resolved Reflectivity Measurements of Temperature Distribution During Swept-Line Electron-Beam Heating of Silicon," J. App. Phys., vol. 70, No. 1, pp. 389-397, Jul. 1, 1991.

Gold et al. "Calculation of Solid-Phase Reaction Rates Induced by a Scanner cw Laser," J. Appl. Phys., vol. 51, No. 2, pp. 1256-1258, Feb. 1990.

Liau et al., "Laser Annealing for Solid-Phase Thin-Film Reactions," Appl. Phys. Lett., vol. 34, No. 3, pp. 221-223, Feb. 1, 1979.

Matsumoto et al., High-Temperature Scanning cw Laser-Induced Diffusion of Arsenic and Phosphorus in Silicon, Appl. Phys. Lett., vol. 37, No. 9, pp. 821-824, Nov. 1, 1980.

Onizawa et al., "A Proposal of New Concept Milli-Second Annealing: Flexibly-Shaped-Pulse Flash Lamp Annealing (FSP-FLA) for Fabrication of Ultra Shallow Junction with Improvement of Metal gate High-k CMOS Performance," Semiconductor Leading Edge Technologies, Jan. 4-8, 2008, VLSI Conference.

Xu et al. "Measurement of Solid-Liquid Interface Temperature During Pulsed Excimer Laser Melting of Polycrystalline Silicon Films," Applied Physical Letters, vol. 65, No. 14, pp. 1745-1747, Oct. 3, 1994.

* cited by examiner

METHODS, APPARATUS AND MEDIA FOR DETERMINING A SHAPE OF AN IRRADIANCE PULSE TO WHICH A WORKPIECE IS TO BE EXPOSED

CROSS-REFERENCE TO RELATED APPLICATION

This application claims the benefit of priority from U.S. Patent Application No. 61/393,836 filed on Oct. 15, 2010, which is hereby incorporated herein by reference.

BACKGROUND

1. Technical Field

The present application relates to heat-treating of workpieces such as semiconductor wafers, and more particularly, to methods, apparatus and computer-readable media for determining a shape of an irradiance pulse to which a workpiece such as a semiconductor wafer is to be exposed during a thermal cycle.

2. Description of Related Art

Numerous applications involve heat-treating a workpiece. For example, in the manufacture of semiconductor chips such as microprocessors and other computer chips, a semiconductor wafer such as a silicon wafer is subjected to an ion implantation process, which introduces impurity atoms or dopants into a surface region of a device side of the wafer. The ion implantation process damages the crystal lattice structure of the surface region of the wafer, and leaves the implanted dopant atoms in interstitial sites where they are electrically inactive. In order to move the dopant atoms into substitutional sites in the lattice to render them electrically active, and to repair the damage to the crystal lattice structure that occurs during ion implantation, it is necessary to anneal the surface region of the device side of the wafer by heating it to a high annealing temperature.

However, the high temperatures required to anneal the device side also tend to produce undesirable effects using existing technologies. For example, diffusion of the dopant atoms deeper into the silicon wafer tends to occur at much higher rates at high temperatures, with most of the diffusion occurring within close proximity to the high annealing temperature required to activate the dopants. Decades ago, diffusion was not as significant a barrier, and the relatively large and deep device sizes prevailing at those times could be manufactured by simply heating the entire wafer isothermally to an annealing temperature and then holding it at the annealing temperature for a relatively long time, such as minutes or even hours, for example.

However, in view of steadily increasing demand for greater performance and smaller device sizes, it is now necessary to produce increasingly shallow and abrupt junctions with controlled diffusion depths. As a result, diffusion depths which would have been considered negligible in the recent past are no longer tolerable today, and likewise, diffusion depths which are tolerable today will become unacceptable in the near future.

In light of the above difficulties, commonly owned U.S. Pat. Nos. 6,594,446, 6,941,063, 6,963,692, 7,445,382, 7,501,607 and 7,616,872 (which are hereby incorporated herein by reference) disclose various methods of annealing a semiconductor wafer, such as a flash-assisted rapid thermal processing (fRTP™) cycle, for example. An example of an fRTP™ cycle may involve pre-heating the entire wafer to an intermediate temperature at a ramp rate slower than the thermal conduction rate through the wafer, then heating the device side of the wafer at a rate much faster than the thermal conduction rate, which may be achieved by exposing the device side to an irradiance flash. As an illustrative example, the wafer may be pre-heated to an intermediate temperature such as 600° C. for example, by irradiating the substrate side with an arc lamp to heat the entire wafer at a rate such as 150° C. per second, for example. The device side may then be exposed to a high-intensity flash from a flash lamp, such as a one-millisecond flash, to heat only the device side to an annealing temperature such as 1300° C., for example. Due to the rapid heating rate of the device side during the flash (in excess of $10^5$° C./s), the bulk of the wafer remains at the intermediate temperature, and acts as a heat sink to rapidly cool the device side following the flash. Due to the rapidity of the flash-heating stage and the subsequent cooling stage, the device side of the wafer spends far less time at or near the annealing temperature in comparison to traditional isothermal heating cycles in which the entire wafer is heated to the annealing temperature. As a result, dopant activation and crystal lattice repair are achieved with far less undesirable dopant diffusion than traditional isothermal heating cycles.

Such flash-assisted annealing methods, which involve rapidly heating the device side of the wafer to a substantially higher temperature than the bulk of the wafer, tend to cause the device side to thermally expand at a greater rate than the rest of the wafer. This rapid expansion of the device side relative to the bulk of the wafer may cause the wafer to deform rapidly and significantly.

Due to the extreme rapidity at which the device side of the wafer is heated (in the course of a 1-millisecond flash, for example, much faster than a typical thermal conduction time in the wafer), the deformation of the wafer may occur sufficiently rapidly that the edges of the wafer tend to move rapidly downward. If the wafer is supported by conventional support pins near its edges, the thermal deformation of the wafer may apply large downward forces to the support pins, potentially damaging or destroying both the pins and the wafer. Such forces may also cause the wafer to launch itself vertically upward from the support pins, which may result in further damage to the wafer as the wafer falls back down and strikes the pins. If the wafer is supported by support pins located further radially inward, the edges of the wafer may rapidly deform downward and strike a support plate above which the wafer is supported, potentially damaging or destroying the wafer. In addition, due to the rapidity at which such thermal deformation occurs, the initial velocities imparted to the various regions of the wafer tend to cause the wafer to overshoot the equilibrium minimum stress shape and rapidly oscillate or vibrate, resulting in additional stress and potentially damaging or destroying the wafer.

Commonly owned U.S. Pat. No. 7,501,607 discloses use of gas pressure between the wafer and a support plate above which it is supported, to dampen such motion and vibration of the wafer. Other approaches to suppressing or accommodating such motion and vibration are disclosed in commonly owned pending U.S. Patent Application Publication Nos. US 2004/0178553 and US 2008/0157452 (which are hereby incorporated herein by reference), for example.

SUMMARY OF THE DISCLOSURE

The present inventors have devised ways to significantly reduce the wafer vibration which results from such flash-assisted rapid thermal processing (fRTP) cycles, while still achieving the above-noted advantages of such fRTP cycles. Using a method referred to by the present inventors as Resonant Frequency Content Reduction, an irradiance pulse or flash can be shaped so as to achieve the required dopant activation with minimal or controlled amounts of diffusion, but with reduced excitation of the relevant resonant vibration modes of the wafer in comparison to conventional irradiance pulse shapes.

One illustrative embodiment relates to a method of determining a shape of an irradiance pulse to which a workpiece is to be exposed during a thermal cycle. The method includes receiving, with a processor circuit, thermal cycle parameters specifying requirements of the thermal cycle, and determining, with the processor circuit, a shape of a heating portion of the irradiance pulse. Determining includes optimizing at least one parameter of a flux profile model of the heating portion of the irradiance pulse to satisfy the requirements while minimizing frequency-domain energy spectral densities of the flux profile model at resonant frequencies of the workpiece, to minimize vibration of the workpiece at the resonant frequencies when the workpiece is exposed to the irradiance pulse.

Advantageously, such a method can achieve the specified thermal cycle requirements with significantly reduced workpiece vibration, and therefore with a significantly reduced likelihood of workpiece damage or breakage resulting from such vibration, in comparison to conventional irradiance pulse shapes.

The workpiece may include a semiconductor wafer having a device side which is to be exposed to the irradiance pulse during the thermal cycle.

In accordance with another illustrative embodiment, there is provided an apparatus for determining a shape of an irradiance pulse to which a workpiece is to be exposed during a thermal cycle. The apparatus includes a processor circuit configured to receive thermal cycle parameters specifying requirements of the thermal cycle. The processor circuit is further configured to determine a shape of a heating portion of the irradiance pulse, by optimizing at least one parameter of a flux profile model of the heating portion of the irradiance pulse to satisfy the requirements while minimizing frequency-domain energy spectral densities of the flux profile model at resonant frequencies of the workpiece, to minimize vibration of the workpiece at the resonant frequencies when the workpiece is exposed to the irradiance pulse.

The processor circuit may be programmed or otherwise configured to cause the various methods described herein to be carried out. The apparatus may further include other elements such as a user input device, an irradiance system and a monitoring system in communication with the processor circuit. The processor circuit may be configured to communicate with, control or co-operate with such elements to cause the various methods described herein to be carried out.

For example, the apparatus may further include an irradiance system in communication with the processor circuit, and the processor circuit may be configured to control the irradiance system to generate the irradiance pulse, incident on the wafer. The irradiance system may include a current amplifier in electrical communication with at least one flash lamp, and the processor circuit may be configured to generate the irradiance pulse by controlling the current amplifier. The current amplifier may include a switch mode power supply. The current amplifier may have negligible noise at the resonant frequencies of the wafer.

As a further example, the apparatus may further include a monitoring system in communication with the processor circuit, and the processor circuit may be configured to cooperate with the monitoring system to monitor an effect of the irradiance pulse on the wafer in real time during the irradiance pulse. The processor circuit may be configured to control the irradiance system to modify the irradiance pulse in response to the monitored effect. The monitoring system may include a temperature measurement system configured to measure a surface temperature of the wafer during the irradiance pulse. Alternatively, or in addition, the monitoring system may include a wafer deformation system configured to monitor deformation of the wafer during the irradiance pulse.

In accordance with another illustrative embodiment, there is provided an apparatus for determining a shape of an irradiance pulse to which a workpiece is to be exposed during a thermal cycle. The apparatus includes means for receiving thermal cycle parameters specifying requirements of the thermal cycle, and means for determining a shape of a heating portion of the irradiance pulse. The means for determining may include means for optimizing at least one parameter of a flux profile model of the heating portion of the irradiance pulse to satisfy the requirements while minimizing frequency-domain energy spectral densities of the flux profile model at resonant frequencies of the workpiece, to minimize vibration of the workpiece at the resonant frequencies when the workpiece is exposed to the irradiance pulse.

In accordance with another illustrative embodiment, there is provided a non-transitory computer-readable medium for directing a processor circuit to determine a shape of an irradiance pulse to which a workpiece is to be exposed during a thermal cycle. The computer-readable medium stores instruction codes for configuring the processor circuit to receive thermal cycle parameters specifying requirements of the thermal cycle. The medium further stores instruction codes for configuring the processor circuit to determine a shape of a heating portion of the irradiance pulse, by optimizing at least one parameter of a flux profile model of the heating portion of the irradiance pulse to satisfy the requirements while minimizing frequency-domain energy spectral densities of the flux profile model at resonant frequencies of the workpiece, to minimize vibration of the workpiece at the resonant frequencies when the workpiece is exposed to the irradiance pulse.

In accordance with another illustrative embodiment, there is provided a method of determining a shape of an irradiance pulse to which a workpiece is to be exposed during a thermal cycle. The method includes receiving, with a processor circuit, thermal cycle parameters specifying requirements of the thermal cycle. The method further includes determining, with the processor circuit, a shape of a heating portion of the irradiance pulse. Determining includes identifying at least one parameter of a flux profile model of the heating portion of the irradiance pulse to satisfy the requirements, wherein the flux profile model includes a function whose rate of change in the time domain increases monotonically from commencement until at least a time at which a value of the function reaches 25% of its peak value.

In accordance with another illustrative embodiment, there is provided an apparatus for determining a shape of an irradiance pulse to which a workpiece is to be exposed during a thermal cycle. The apparatus includes a processor circuit configured to receive thermal cycle parameters specifying requirements of the thermal cycle. The processor circuit is further configured to determine a shape of a heating portion of the irradiance pulse, by identifying at least one parameter of a flux profile model of the heating portion of the irradiance pulse to satisfy the requirements. The flux profile model includes a function whose rate of change in the time domain increases monotonically from commencement until at least a time at which a value of the function reaches 25% of its peak value.

The apparatus may further include other elements such as a user input device, an irradiance system and a monitoring system in communication with the processor circuit. The processor circuit may be configured to communicate with, control or co-operate with such elements to cause the various methods described herein to be carried out.

In accordance with another illustrative embodiment, there is provided an apparatus for determining a shape of an irradiance pulse to which a workpiece is to be exposed during a thermal cycle. The apparatus includes means for receiving thermal cycle parameters specifying requirements of the thermal cycle, and means for determining a shape of a heating portion of the irradiance pulse. The means for determining includes means for identifying at least one parameter of a flux profile model of the heating portion of the irradiance pulse to satisfy the requirements, wherein the flux profile model includes a function whose rate of change in the time domain increases monotonically from commencement until at least a time at which a value of the function reaches 25% of its peak value.

In accordance with another illustrative embodiment, there is provided a non-transitory computer-readable medium for directing a processor circuit to determine a shape of an irradiance pulse to which a workpiece is to be exposed during a thermal cycle. The computer-readable medium stores instruction codes for configuring the processor circuit to receive thermal cycle parameters specifying requirements of the thermal cycle. The medium further stores instruction codes for configuring the processor circuit to determine a shape of a heating portion of the irradiance pulse, by identifying at least one parameter of a flux profile model of the heating portion of the irradiance pulse to satisfy the requirements, wherein the flux profile model includes a function whose rate of change in the time domain increases monotonically from commencement until at least a time at which a value of the function reaches 25% of its peak value.

In accordance with another illustrative embodiment, there is provided a method of generating an irradiance pulse to which a workpiece is to be exposed during a thermal cycle. The method includes controlling a power supply including a current amplifier having negligible noise at resonant frequencies of the workpiece to supply an electrical pulse to an arc lamp to generate the irradiance pulse.

In accordance with another illustrative embodiment, there is provided an apparatus for generating an irradiance pulse to which a workpiece is to be exposed during a thermal cycle. The apparatus includes a processor circuit and an irradiance system in communication with the processor circuit. The irradiance system includes at least one arc lamp and a power supply including a current amplifier having negligible noise at resonant frequencies of the workpiece. The processor circuit is configured to control the current amplifier to supply an electrical pulse to the arc lamp to generate the irradiance pulse.

The apparatus may further include other elements such as a user input device and a monitoring system in communication with the processor circuit. The processor circuit may be configured to communicate with, control or co-operate with such elements to cause the various methods described herein to be carried out.

In accordance with another illustrative embodiment, there is provided an apparatus for generating an irradiance pulse to which a workpiece is to be exposed during a thermal cycle. The apparatus includes means for irradiating the workpiece, and means for supplying an electrical pulse to the means for irradiating to generate the irradiance pulse. The means for supplying has negligible noise at resonant frequencies of the workpiece. The apparatus further includes means for controlling the means for supplying to supply an electrical pulse to the means for irradiating, to generate the irradiance pulse.

In accordance with another illustrative embodiment, there is provided a method of determining an optimal shape of a temporal temperature evolution of a workpiece to result from exposure of the workpiece to an irradiance pulse during a thermal cycle. The method includes receiving, with a processor circuit, thermal cycle parameters specifying requirements of the thermal cycle. The method further includes determining, with the processor circuit, the optimal shape of the temporal evolution of the workpiece. Determining the optimal shape includes optimizing at least one parameter of a flux profile model of a heating portion of the irradiance pulse to satisfy the requirements while minimizing frequency-domain energy spectral densities of the flux profile model at resonant frequencies of the workpiece, to minimize vibration of the workpiece at the resonant frequencies when the workpiece is exposed to the irradiance pulse.

Other aspects and features of illustrative embodiments will become apparent to those ordinarily skilled in the art upon review of the following description of such embodiments in conjunction with the accompanying figures.

BRIEF DESCRIPTION OF THE DRAWINGS

In drawings which illustrate embodiments.

DETAILED DESCRIPTION

Figure 1:
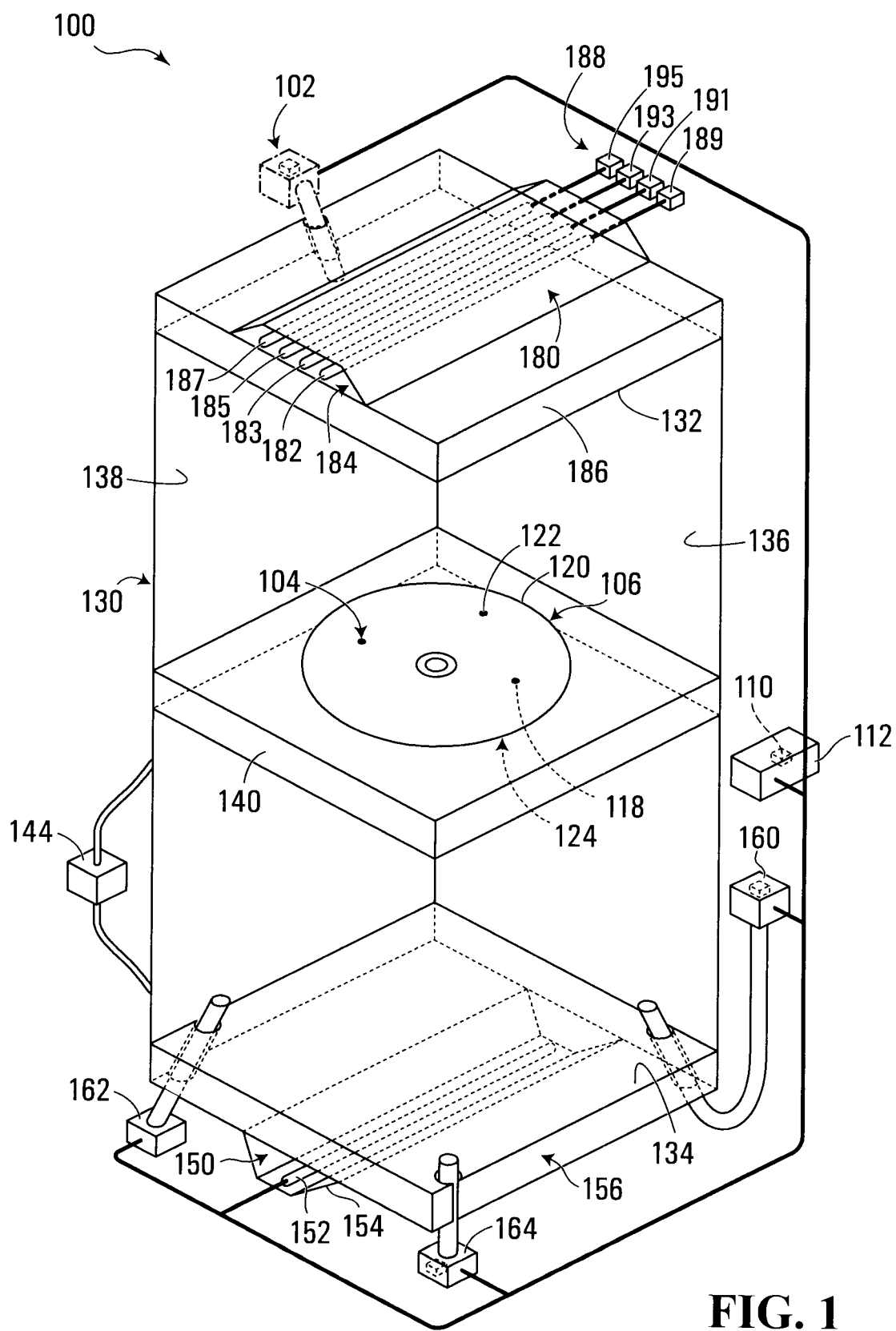
FIG. 1 is a perspective view of a flash-assisted rapid thermal processing (fRTP™) apparatus according to a first embodiment, shown with two vertical front-side walls removed.

Referring to FIG. 1, an apparatus for determining a shape of an irradiance pulse to which a workpiece is to be exposed during a thermal cycle, according to a first embodiment of the disclosure, is shown generally at 100. In this embodiment, the apparatus includes a processor circuit 110, which is configured to receive thermal cycle parameters specifying requirements of the thermal cycle. In this embodiment, the processor circuit 110 is further configured to determine a shape of a heating portion of the irradiance pulse, by optimizing at least one parameter of a flux profile model of the heating portion of the irradiance pulse to satisfy the requirements while minimizing frequency-domain energy spectral densities of the flux profile model at resonant frequencies of the workpiece 106, to minimize vibration of the workpiece at the resonant frequencies when the workpiece is exposed to the irradiance pulse.

Workpiece

Referring to FIG. 1, in the present embodiment, the workpiece 106 has a first surface 104 and a second surface 118. More particularly, in this embodiment the workpiece 106 includes a semiconductor wafer 120, its first surface 104 includes a topside or device side 122 of the wafer 120, and its second surface 118 includes a backside or substrate side 124 of the wafer 120. In this embodiment, it is the device side 122 which is to be exposed to the irradiance pulse during the thermal cycle, and the processor circuit 110 is configured to determine the shape of the heating portion of the irradiance pulse by optimizing the at least one parameter of the flux profile model of the heating portion of the irradiance pulse to satisfy the requirements while minimizing frequency-domain energy spectral densities of the flux profile model at resonant frequencies of the wafer 120, to minimize vibration of the wafer 120 at the resonant frequencies when the device side 122 of the wafer 120 is exposed to the irradiance pulse.

More particularly, in this embodiment the wafer 120 includes a 300 mm diameter silicon semiconductor wafer for use in the manufacture of semiconductor chips, such as microprocessors, for example. In this embodiment, prior to the insertion of the wafer 120 into the apparatus 100, the device side 122 of the wafer is subjected to an ion implantation process, which introduces impurity atoms or dopants into a surface region of the device side of the wafer. The ion implantation process damages the crystal lattice structure of the surface region of the wafer, and leaves the implanted dopant atoms in interstitial sites where they are electrically inactive. In order to move the dopant atoms into substitutional sites in the lattice to render them electrically active, and to repair the damage to the crystal lattice structure that occurs during ion implantation, the surface region of the device side of the wafer is annealed by heat-treating it as described herein.

In general, the resonant frequencies of the wafer 120 can be described with reference to the wafer's vibration modes, where vibration mode (m,n) denotes a vibration mode having m nodal diameters and n nodal circles. Of particular interest in the present embodiment, the resonant frequencies of the wafer 120 include circular vibration mode frequencies of approximately 113 Hz (mode (0,1)), 476 Hz (mode (0,2)), and 1080 Hz (mode (0,3)), when the wafer is at room temperature; it will be appreciated that the resonant frequencies will tend to change with temperature. In the present embodiment, the resonant frequencies of the wafer further include a diameter mode frequency of approximately 60 Hz (mode (2,0)) when the wafer is at room temperature, although this diameter mode is not expected to be strongly excited if the wafer is uniformly irradiated by the flash. Although the specific vibration modes mentioned above are believed to be among the most susceptible to excitation by the flash for the purposes of the present embodiment, it will be appreciated that the resonant frequencies of the wafer 120 may theoretically include an infinite number of additional vibration modes. More generally, in other embodiments, the specific vibration modes and frequencies of the wafer or other workpiece will depend upon the material properties and thickness of the workpiece, and likewise, boundary conditions (e.g., how the wafer is supported) will also influence the susceptibility of specific vibration modes to excitation. However, as discussed below in connection with underlying principles, it is not necessary to know the resonant frequencies of the workpiece 106 in advance. Thus, the methods and systems disclosed herein are applicable to other types of semiconductor wafers with different resonant frequencies.

More generally, embodiments of the present disclosure have applications beyond mere activation of implanted dopants and therefore the workpiece 106 may alternatively include a wafer that is to be annealed for different purposes. For example, other embodiments of the methods and systems exemplified herein may be applied to thermally process layers of metals, oxides, nitrides, silicides, silicates or hafniates on regions of the wafer. Similarly, other embodiments may also be used to thermally oxidize or to thermally nitridize regions of the wafer, or to drive chemical vapor deposition of layers on the wafer, or to drive solid state reactions within the bulk and the near surface regions of the wafer, to name but a few examples.

More generally still, it is expected that many types of workpieces that include a base material coated with a plurality of layers of differing materials may benefit from embodiments of the methods exemplified herein. In this regard, the base material may include a semiconductor such as silicon, silicon carbide or gallium arsenide for example, but alternatively, may include a magnetic medium used to fabricate memory media or magnetic read/write heads, or may include an optically transparent substrate used to fabricate flat panel displays or solar cells, for example. Such workpieces may or may not have been subjected to a surface modification process such as pre-amorphization, and the layers may be either laterally continuous or discontinuous (as a result of intentional patterning) across the surfaces of the base material, or a combination of continuous and discontinuous layers.

More broadly, however, the workpiece 106 need not be any of the above types of workpieces, but may alternatively include any other type of workpiece that would benefit from the methods and systems claimed and exemplified herein.

Irradiance Pulse and Thermal Cycle Parameters

Figure 6:
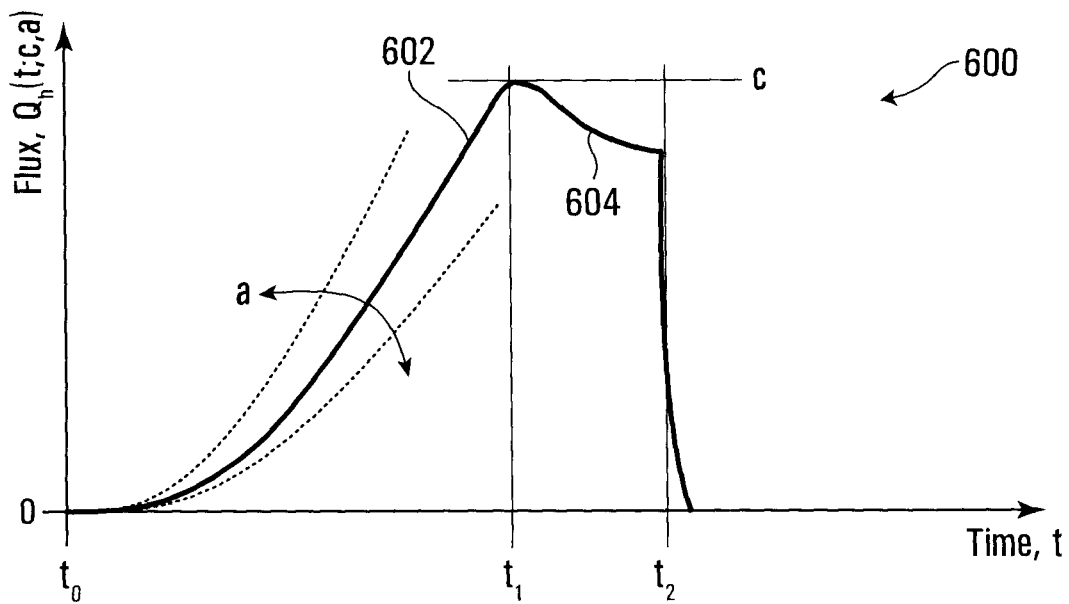
FIG. 6 is a graphical representation of an irradiance pulse in the time domain.
Figure 7:
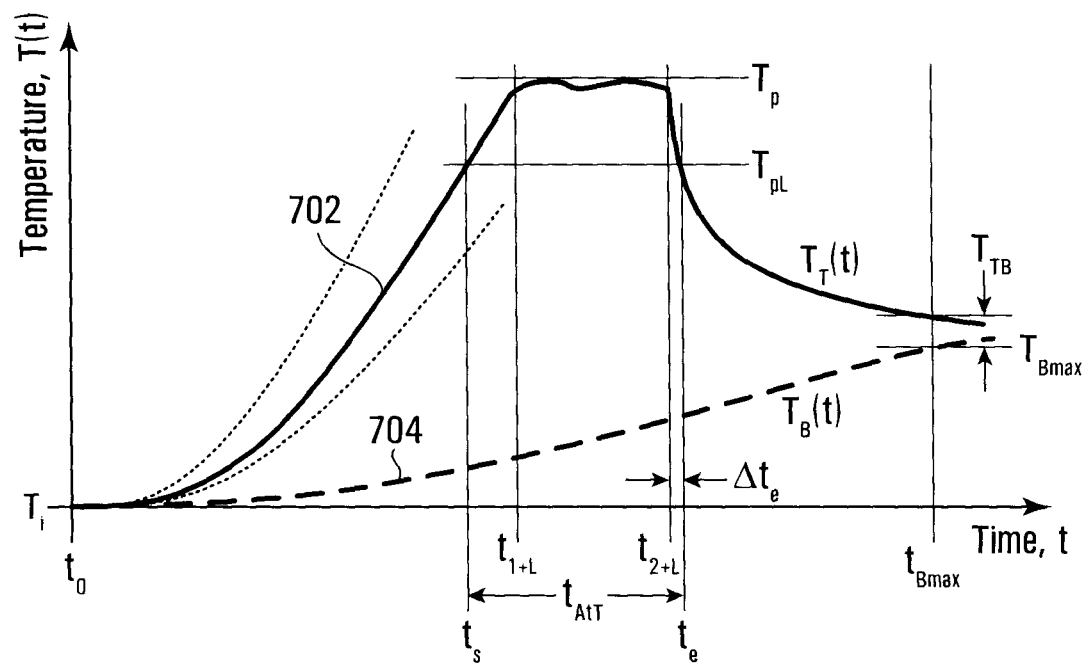
FIG. 7 is a graphical representation of a temperature profile in the time domain of a surface of a semiconductor wafer exposed to the irradiance pulse of FIG. 6.

Referring to FIGS. 1, 6 and 7, an irradiance pulse according to the present embodiment is shown generally at 600 in FIG. 6. FIG. 7 shows a topside temperature curve 702 representing the temperature $T_T(t)$ of the device side 122 when exposed to the irradiance pulse 600, and a backside temperature curve 704 representing the temperature $T_B(t)$ of the substrate side 124 when exposed to the irradiance pulse 600. FIG. 7 also shows an illustrative set of user-specified thermal cycle parameters, including an intermediate temperature $T_i$, a peak device side temperature $T_P$, a time-at-temperature $t_{atT}$, and a maximum backside temperature $T_{BMAX}$, as discussed below.

In this embodiment, it is assumed that at time $t_0=0$ at which the irradiance pulse 600 commences, the wafer 120 has already been pre-heated to the intermediate temperature $T_i$, which is shown as the y-axis intercept of the curves 702 and 704 in FIG. 7. The irradiance pulse 600 includes a heating portion 602, and a sustaining portion 604 which immediately follows the heating portion 602.

The heating portion 602, which in this embodiment occurs between times $t_0$ and $t_1$ in FIG. 6, serves to increase the temperature of the device side 122 from the intermediate temperature $T_i$ to the desired peak device side temperature $T_P$.

It will be appreciated that in practice, the temperature of the device side 122 will slightly lag the irradiance flux with which it is irradiated by a lag time L, such that the peak device side temperature $T_P$ will occur at time $t_1$+L rather than at time $t_1$ at which the peak irradiance flux occurs. However, the lag time L is typically small compared to the rise time $t_1$ of the heating portion 602, and is effectively disregarded in the pulse shape optimization routine of the present embodiment discussed below. Alternatively, the lag time L may be considered in other embodiments.

The sustaining portion 604, which in this embodiment occurs between time $t=t_1$ and time $t=t_2$ in FIG. 6, serves to sustain the temperature $T_T(t)$ of the device side 122 within a predefined range from the peak device side temperature $T_P$, for a time-at-temperature interval $t_{atT}$ following arrival of the device side 122 within the predefined range from the peak device side temperature $T_P$. More particularly, in this embodiment the predefined range is defined by a lower temperature boundary value $T_{PL}$, such that the sustaining portion 604 maintains the temperature $T_T(t)$ of the device side within a range of $T_{PL} \leq T_T(t) \leq T_P$, for at least a time-at-temperature interval of $t_{atT}$. The time-at-temperature interval $t_{atT}$ commences at a time $t_s$ preceding the peak temperature time $t_1$+L, and ends at a time $t_e$ subsequent to the time $t_2$+L at which the device side 122 begins to react to the discontinuance at time $t_2$ of the sustaining portion 604. A temperature drop-off time interval $\Delta t_e = t_e - (t_2 + L)$ denotes the time interval during which the device side temperature falls from the peak temperature $T_P$ to the lower temperature boundary value $T_{PL}$, following discontinuance of the sustaining portion 604.

In this embodiment, the maximum backside temperature $T_{BMAX}$ does not refer to the global maximum of the temperature of the substrate side 124; rather, the maximum backside temperature $T_{BMAX}$ specifies a maximum permitted temperature of the substrate side 124 at a time $t_{BMAX}$ after the end of the irradiance pulse 600, at which a sufficient amount of heat has conducted from the device side into the bulk of the wafer to cause a difference between the device side and substrate side temperatures to fall to a value less than or equal to a predefined threshold value $T_{TB}$ shown in FIG. 7.

As an arbitrary example, an illustrative thermal cycle may require an intermediate temperature of $T_i$=700° C., a peak temperature of $T_P$=1,300° C., a time-at-temperature of $t_{atT}$=0.7 ms, and a maximum backside temperature of $T_{BMAX}$=897° C.

In this embodiment, a number of parameters are associated with the heating portion 602 of the irradiance pulse 600, including a bandwidth parameter a associated with a rise rate of the heating portion 602, a scaling parameter c associated with a peak magnitude of the heating portion of the irradiance pulse, and the rise time parameter $t_1$ representing a time interval between the commencement of the irradiance pulse and the peak magnitude of the pulse. In some embodiments, the parameters associated with the heating portion may also include the intermediate or initial temperature $T_i$ of the wafer 120 immediately before the commencement of the irradiance pulse. Alternatively, different numbers or types of parameters may be substituted.

Heat-Treating System

Referring to FIGS. 1, 2, 3 and 6, in this embodiment, in addition to determining the shape of the irradiance pulse 600, the apparatus 100 also generates the irradiance pulse 600 incident upon the workpiece 106 during the thermal cycle. Alternatively, however, the determination of the shape of the irradiance pulse and the generation of the irradiance pulse may be performed by different apparatus.

Thus, in the present embodiment, the apparatus 100 further includes a heat-treating system in communication with the processor circuit 110. More particularly, in this embodiment the heat-treating system includes a backside irradiance system 150 and a topside irradiance system 180, and the processor circuit 110 is configured to control the topside irradiance system 180 to generate the irradiance pulse 600, incident on the wafer 120.

Generally, except as discussed herein, the hardware of the apparatus 100 of the present embodiment is identical to the heat-treating apparatus described in commonly owned PCT international patent application publication no. WO 2009/137940 A1, which in turn is similar to the hardware of the heat-treating apparatus described in commonly owned U.S. Patent Application Publication No. US 2007/0069161, both of which are hereby incorporated herein by reference. Therefore, for conciseness, numerous details of the apparatus 100 disclosed in WO 2009/137940 and US 2007/0069161 are omitted.

As discussed in greater detail in US 2007/0069161, in this embodiment the apparatus 100 includes a chamber 130. The chamber 130 includes top and bottom selectively radiation-absorbing walls 132 and 134, which include selectively absorbing water-cooled windows 186 and 156, respectively. The chamber 130 also includes specularly reflective side walls, two of which are shown at 136 and 138 and the other two of which are removed for illustrative purposes. The workpiece 106 may be supported above a quartz window of an internal support plate 140 of the chamber 130, by a plurality of quartz pins (not shown), and may be lowered into and raised out of position for heat-treatment by a plurality of additional retractable pins (not shown). The support plate 140 may include a generally planar support plate as disclosed in commonly owned U.S. Pat. No. 7,501,607, or a non-planar support plate as disclosed in commonly owned U.S. Patent Application Publication No. US 2008/0157452, both of which are hereby incorporated herein by reference, for example. Alternatively, the workpiece may be supported by a workpiece support system (not shown) similar to those disclosed in U.S. Patent Application Publication No. US 2004/0178553, which is incorporated herein by reference, or by any other suitable means. A cooling system 144, which in this embodiment includes a circulated water cooling system, serves to cool the various surfaces of the chamber 130.

In the present embodiment, the heating system of the apparatus 100 includes the backside irradiance system 150 for heating the backside 124 of the wafer 120. The backside irradiance system 150 includes a high-intensity arc lamp 152 and a reflector system 154 disposed beneath the water-cooled window 156, as described in greater detail in US 2007/0069161. In this embodiment, the backside irradiance system 150 further includes a backside irradiance power supply system 252 for supplying electrical power to the arc lamp 152 in response to control signals received from the processor circuit 110.

In the present embodiment, the heating system of the apparatus 100 further includes the topside irradiance system 180. In this embodiment, the topside irradiance system 180 includes a flash lamp system. More particularly, in this embodiment the topside irradiance system 180 includes first, second, third and fourth flash lamps 182, 183, 185 and 187 and a reflector system 184, positioned immediately above the water-cooled window 186 of the chamber 130.

Alternatively, fewer than four flash lamps, such as a single flash lamp for example, may be employed. Conversely, more than four flash lamps, such as an array of a much larger number of flash lamps for example, may be employed.

In this embodiment, each of the flash lamps 182, 183, 185 and 187 includes a liquid-cooled flash lamp manufactured by Mattson Technology Canada, Inc. of Vancouver, Canada, similar to those described in commonly owned U.S. Pat. No. 7,781,947, which is incorporated herein by reference. In this regard, it has been found that this particular type of flash-lamp provides numerous advantages over more conventional flash-lamps, including improved consistency and repeatability of thermal processing, for example. Alternatively, other types of flash lamps may be substituted. More generally, other types of irradiance pulse generators, such as a microwave pulse generator or a pulsed or scanning laser for example, may be substituted for the flash lamps.

In the present embodiment, the reflector system 184 is configured to uniformly irradiate the device side 122 of the wafer 120 when the two outer flash lamps, i.e. the first and fourth flash lamps 182 and 187, are fired simultaneously. In this embodiment, the reflector system 184 is also configured to uniformly irradiate the device side 122 of the wafer 120 when either of the two inner flash lamps, i.e. either the second flash lamp 183 or the third flash lamp 185, is fired in isolation. An example of such a reflector system is manufactured by Mattson Technology Canada, Inc. of Vancouver, Canada, as a component of their flash-assisted rapid thermal processing (fRTP™) system.

Figure 2:
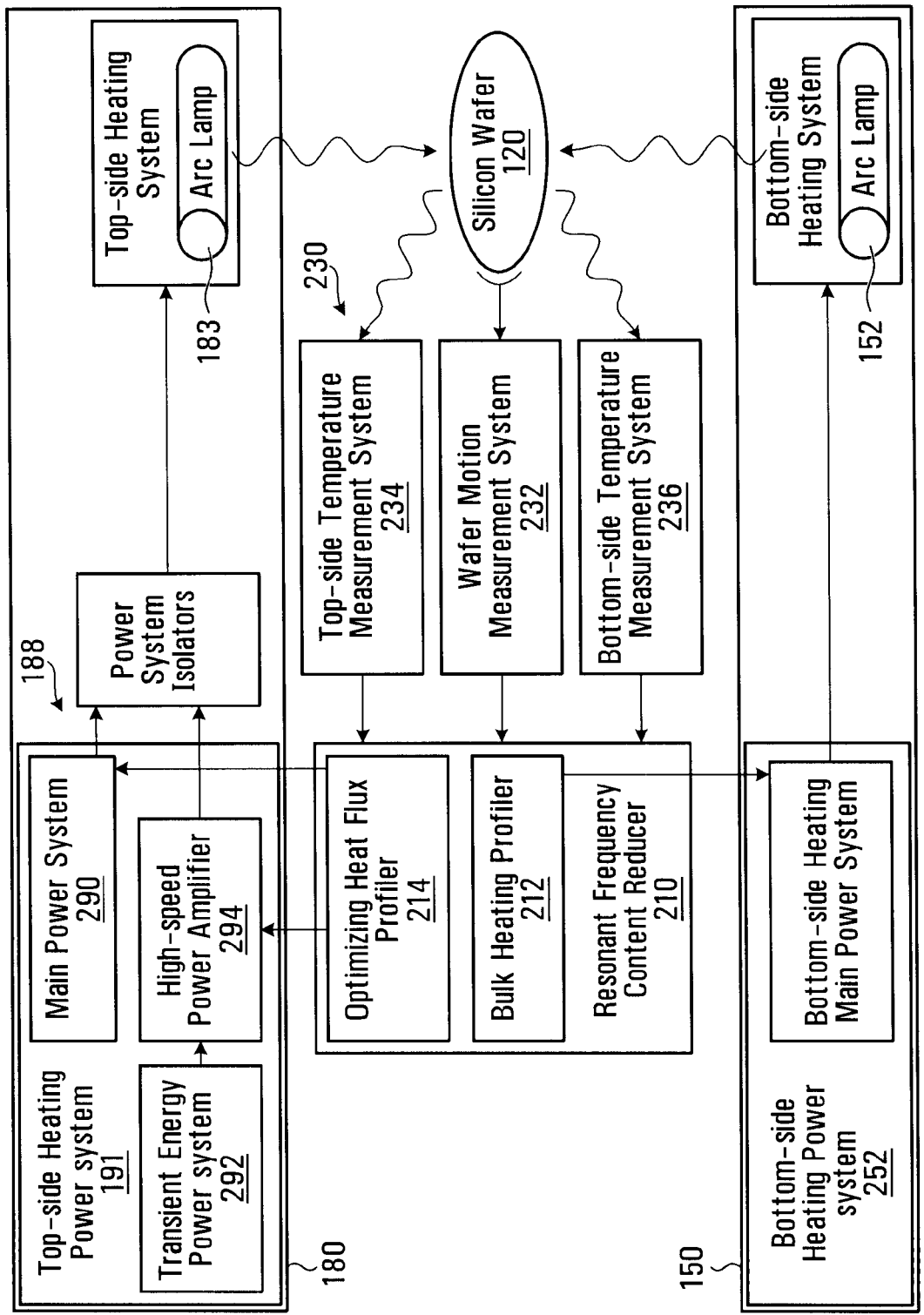
FIG. 2 is a block diagram of the apparatus of FIG. 1.

In the present embodiment, the topside irradiance system 180 further includes a power supply system 188 for supplying electrical power to the flash lamps 182, 183, 185 and 187 to produce the irradiance flash. In this embodiment, the power supply system 188 includes individual electrical power supply systems 189, 191, 193 and 195, for supplying electrical power to the individual flash lamps 182, 183, 185 and 187, respectively. For ease of illustration, only a single flash lamp 183 and its power supply system 191 are shown in FIG. 2 and discussed in detail herein, it being understood that the other flash lamps 182, 185 and 187 and their respective power supply systems 189, 193 and 195 are similar.

In this embodiment, the power supply system 191 includes a main power supply 290, which enables the flash lamp 183 to operate in a direct current, steady state mode, if desired. Thus, in addition to rapidly heating the device side 122 of the wafer 120 with one or more irradiance flashes, the flash lamps can also effectively act as DC arc lamps to continuously irradiate the device side (with considerably less power than during the flashes). Thus, in further alternative embodiments, other types of non-pulsed irradiance sources may supplement or may be substituted for one or more of the flash lamps.

In this embodiment, the power supply system 191 further includes a transient energy power system 292. More particularly, in this embodiment the transient energy power system 292 includes a pulsed discharge unit that may be pre-charged then abruptly discharged in order to supply input power to its corresponding flash lamp 183 to produce a desired irradiance flash. More particularly still, in the present embodiment, each of the pulsed discharge units includes a pair of capacitors (not shown), capable of being charged at a high voltage to store the largest amount of electrical energy that may be required from its corresponding flash lamp for a particular application, and capable of discharging such stored energy to its respective flash lamp within a short period of time, such as 0.5 ms, for example, although longer discharge times may be achieved by controlling the discharge as described herein. Thus, in this embodiment the topside irradiance system 180 is capable of discharging its stored energy through the flash lamps 182, 183, 185 and 187 in an irradiance pulse having a total duration less than a thermal conduction time of the workpiece 106. In general, the total energy stored for a particular optimized irradiance pulse will depend upon the user-specified thermal cycle parameters, and can exceed 1000 kJ for some applications. In embodiments such as the present embodiment in which a capacitive energy storage system is employed, the capacitor charging voltages will be set to store sufficient energy to operate the flash lamps to produce the optimized irradiance pulse and to operate any intervening electrical components, accounting for any inherent inefficiencies in the particular system. Alternatively, larger or smaller power supplies, or other types of power supplies, may be substituted.

In this embodiment, the topside irradiance system 180, or more particularly the power supply system 191, includes a current amplifier in electrical communication with the flash lamp 183, and the processor circuit 110 is configured to generate the irradiance pulse 600 by controlling the current amplifier. More particularly, in this embodiment the current amplifier includes a high-speed power amplifier 294. More particularly still, in this embodiment the high-speed power amplifier 294 includes a switch mode power supply. In this regard, the power supply system 191 differs from that disclosed in the above-noted commonly owned patent application publication nos. WO 2009/137940 US 2007/0069161, insofar as the switching mechanisms and power control circuits to actuate discharge of the capacitors and to achieve real-time feedback control of the flash, have been replaced with the high-speed power amplifier 294. Advantageously, the high-speed power amplifier 294 enables the processor circuit 110 to control and adjust the temporal shape of the electrical pulse discharged by the transient energy power system to the flash lamp 183, thereby controlling and adjusting the temporal shape of the irradiance pulse produced by the flash lamp. By providing such a high-speed power amplifier for each of the flash lamps, the flash lamps may advantageously be controlled as desired for a given application: for example, the flash lamps may be controlled to simultaneously produce identical irradiance pulse shapes, or may be individually controlled to simultaneously or sequentially produce identical or different pulse shapes, so that the superposition of the irradiance pulses represents a desired temporal irradiance profile. The high-speed power amplifiers also facilitate real-time feedback control of the irradiance flash, as discussed below, if such feedback control is desired for a given application.

In this embodiment, the current amplifier, or more particularly, the high-speed power amplifier 294, includes a plurality of individual controllers arranged in parallel. More particularly, in this embodiment each of the individual controllers includes a ZILLA™ model Z2K-HV controller manufactured by Café Electric, LLC of Corvallis, Oreg., capable of controlling up to 2000 amps of current at input voltages up to 375 Volts, and capable of producing a peak power output of up to 640 kilowatts. In this embodiment, ten such individual controllers are used for each flash lamp. Alternatively, however, the high-speed power amplifier 294 may include any other suitable single device or combination of devices capable of controlling the required electrical discharges for a particular application. Also in this embodiment, the high-speed power amplifier 294 has negligible noise at the above-noted resonant frequencies of the wafer 120. Similarly, in the present embodiment, the transient energy power system 292 and main power supply 290 also have negligible noise at the wafer's resonant frequencies. Advantageously, therefore, the above-noted vibrational modes of the wafer 120 will not be inadvertently excited by the power supply system 191.

Monitoring System

Referring to FIGS. 1, 2, 3 and 6, in this embodiment, the apparatus 100 further includes a monitoring system shown generally at 230, in communication with the processor circuit 110. In this embodiment, the processor circuit 110 is configured to cooperate with the monitoring system 230 to monitor an effect of the irradiance pulse 600 on the wafer in real time during the irradiance pulse, and the processor circuit 110 is configured to control the topside irradiance system 180 to modify the irradiance pulse 600 in response to the monitored effect.

More particularly, in this embodiment, the monitoring system 230 includes a wafer deformation measuring system 232, configured to monitor deformation of the wafer 120 during the heating portion 602 of the irradiance pulse 600.

In this embodiment, the wafer deformation measuring system 232 is identical to that disclosed in the above-noted commonly owned PCT publication no. WO 2009/137940, which is incorporated herein by reference. Therefore, for conciseness, numerous details of the structure, configuration and operation of the wafer deformation measuring system 232 are not repeated herein. Briefly, the wafer deformation measuring system 232 includes an image source and a detector configured to detect a reflection of the image source by a surface of the wafer. More particularly, in this embodiment the image source includes a diagnostic illumination source 160, and the detector includes an imaging device 162 configured to detect a reflection of the diagnostic illumination source 160 by the backside surface 124 of the wafer 120. More particularly still, in this embodiment the imaging device 162 includes a 320×256 pixel Indium-Gallium-Arsenide (InGaAs) photodiode array, which has a 12-bit sensitivity. The camera also includes focussing optics (not shown), and further includes a narrow-band filter centered about 1450 nm, so that the camera is sensitive only to a diagnostic wavelength of 1450 nm and a very narrow bandwidth (e.g. ±15 nm) centered thereabout. Also in this embodiment, the diagnostic illumination source 160 includes a short-arc xenon arc lamp, operable to continuously project a known scene such as a set of grid lines onto the backside surface 124 of the wafer 120 as described in the "Other Illustrative Alternatives" section of WO 2009/137940. In the present embodiment, the devices 160, 162 and 164 are all positioned so as to bypass the water-cooled window 156, so that the water-cooled window 156 does not filter illuminating radiation produced by the diagnostic illumination source 160, nor does it filter radiation received by the imaging device 162 or the fast radiometer 164. A synchronizer is also provided to synchronize the operation of the diagnostic illumination source 160 and the imaging device 162, as described in greater detail in U.S. Pat. No. 7,445,382. In this embodiment, as discussed in greater detail in the "Other Illustrative Alternatives" section of the above-noted PCT publication no. WO 2009/137940, the diagnostic illumination source 160 and the imaging device 162 cooperate with the processor circuit 110 to estimate a set of normals to the backside surface 124 by projecting the known scene (in this case a set of grid lines) onto the backside surface 124 and measuring the reflection of the known scene by the backside surface. (Alternatively, if desired, the diagnostic illumination source 160 may be configured to produce a diagnostic flash at the diagnostic wavelength of 1450 nm, and the imaging device 162 may cooperate with the processor circuit 110 to measure a radius of curvature of the wafer 120 by comparing an image of the diagnostic illumination source reflected by the backside 124 of the wafer 120 when in an initial undeformed state, to an image of the diagnostic illumination source reflected by the backside 124 when in a subsequent deformed state, as described in connection with the primary embodiment of WO 2009/139740.) If desired, the processor circuit 110 may be configured to use the measured deformation to generate a deformation correction to be applied to reflectivity measurements of the wafer 120, as described in greater detail in WO 2009/137940.

In this embodiment, the monitoring system 230 further includes a temperature measurement system configured to measure a surface temperature of the wafer 120 during the irradiance pulse. More particularly, in this embodiment the monitoring system includes a topside temperature measurement system 234, configured to measure a surface temperature of the device side 122 of the wafer 120. More particularly still, in this embodiment the topside temperature measurement system 234 includes an ultrafast radiometer 102, identical to the ultrafast radiometer disclosed in the above-noted U.S. Pat. No. 7,445,382. In this embodiment, the ultrafast radiometer 102 is configured to cooperate with the processor circuit 110 to produce real-time temperature measurements of the device side 122 of the wafer 120 during the irradiance pulse 600 at a sampling rate of 100 kHz, so that the device side temperature is measured once every ten microseconds. Alternatively, faster or slower sampling rates may be employed if desired, such as the 1 MHz sampling rate disclosed in the above-noted U.S. Pat. No. 7,445,382, for example.

In this embodiment, the monitoring system 230 further includes a backside temperature measurement system 236, configured to measure a temperature of the backside 124 of the wafer 120. More particularly, in this embodiment the backside temperature measurement system 236 includes a fast radiometer 164, as described in greater detail in the above-noted U.S. Pat. No. 7,445,382. In this embodiment, the processor circuit 110 is configured to cooperate with the fast radiometer 164 to produce real-time temperature measurements of the backside 124 of the wafer 120, at a sampling rate of 1 kHz. Alternatively, faster or slower sampling rates may be substituted.

Alternatively, for embodiments in which closed-loop feedback control of the irradiance pulse 600 is not desired, the topside temperature measurement system 234 and the backside temperature measurement system 236 may be omitted.

RTP System Computer (RSC)

Figure 3:
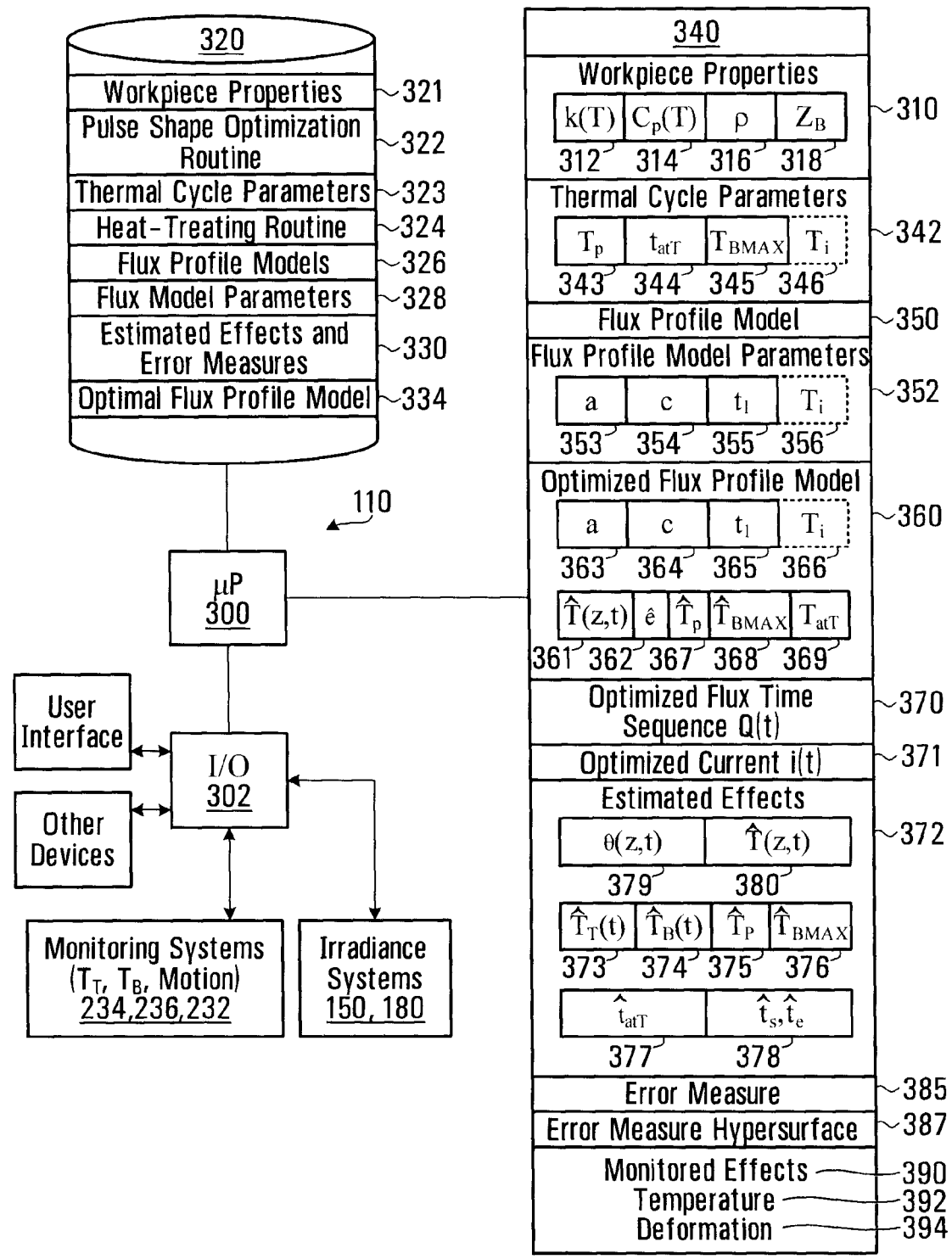
FIG. 3 is a block diagram of a processor circuit of the apparatus of FIG. 1.

Referring to FIGS. 1, 2 and 3, the RTP System Computer (RSC) 112 is shown in greater detail in FIG. 3. In this embodiment, the RSC includes the processor circuit 110, which in the present embodiment includes a microprocessor 300. More generally, however, in this specification, the term "processor circuit" is intended to broadly encompass any type of device or combination of devices which the present specification and common general knowledge would enable the notional person of ordinary skill in the art to substitute for the microprocessor 300 to perform the functions described herein. Such devices may include (without limitation) other types of microprocessors, microcontrollers, other integrated circuits, other types of circuits or combinations of circuits, logic gates or gate arrays, or programmable devices of any sort, for example, either alone or in combination with other such devices located at the same location or remotely from each other.

In the present embodiment, the microprocessor 300 is in communication with a storage device 320, which in this embodiment includes a hard disk drive. Generally, in this embodiment, the storage device 320 acts as a non-transitory computer-readable medium, storing instruction codes for directing the processor circuit 110 to cause the various functions disclosed herein to be carried out. Thus, in this embodiment the storage device 320 stores various routines, each routine including instruction codes which program or configure the processor circuit 110 to cause the various methods described herein to be carried out. More particularly, in this embodiment the storage device 320 stores a pulse shape optimization routine 322 and a heat-treating routine 324, discussed in greater detail below. In this embodiment, the storage device 320 is also used to store various types of data received or used by the microprocessor 300. More particularly, in this embodiment the storage device 320 includes a flux profile models store 326, a flux profile model parameters store 328, and an estimated effects and error measures store 330. The flux profile models store 326 stores one or more possible flux profile models to be used in shaping the heating portion 602 of the irradiance pulse 600, and the flux profile model parameters store 328 stores a predefined set of initial values of flux profile model parameters for each of the flux profile models stored in the flux profile models store 326. For each flux profile model, the estimated effects and error measures store 330 stores values representing estimated effects that an irradiance pulse 600 including a heating portion 602 corresponding to the flux profile model would have upon the wafer 120, for typical flux profile model parameter values. If desired, the storage device 320 may also store additional routines and data for carrying out additional functions, such as any of the routines and data discussed in commonly owned publication nos. US 2007/0069161, US 2008/0273867, and WO 2009/137940, for example, all of which are incorporated herein by reference.

In the present embodiment, the microprocessor 300 is also in communication with a memory device, which in this embodiment includes a random access memory (RAM) 340. In this embodiment, the various routines stored in the storage device 320 configure the microprocessor 300 to define various stores and storage areas in the RAM for storing various properties or parameters measured, calculated or used by the microprocessor 300, including: a thermal cycle parameters store 342 for storing parameters defining requirements of a thermal cycle; a workpiece properties store 310 for storing material properties of the workpiece 106; a flux profile model store 350 for storing a representation of a flux profile model of the heating portion 602; a flux profile model parameters store 352 for storing current values of parameters of the flux profile model stored in the flux profile model store 350; an optimized flux profile model store 360 for storing optimized values of the parameters of the flux profile model and other values defining or associated with the optimized pulse shape; an optimized flux time sequence store 370 for storing a time sequence of flux values Q(t) representing an optimized irradiance pulse 600; an optimized current storage area 371 for storing a time sequence of electric current values i(t) for generating the optimized flux values Q(t); an estimated effects store 372 for storing estimated effects that an irradiance pulse 600 including a heating portion 602 corresponding to contents of the flux profile model and parameters stores 350 and 352 would have upon the wafer 120; an error measure store 385 for storing a measure of the errors between the estimated effects stored in the estimated effects store 372 and the thermal cycle requirements stored in the thermal cycle parameters store 342; an error measure hypersurface store 387 for storing co-ordinates of a multidimensional error hypersurface; and a monitored effects store 390 for storing real-time measurements of the effects of an actual irradiance pulse 600 upon the wafer. The RAM 340 may also include other stores and/or storage areas (not shown).

The microprocessor 300 of the present embodiment is in further communication with an input/output (I/O) interface 302, for communicating with various devices of the apparatus 100 shown in FIG. 1, including the topside temperature measurement system 234 and the topside irradiance system 180, as well as other system components such as the backside irradiance system 150, the diagnostic illumination source 160, the imaging device 162, the fast radiometer 164, and various user input/output devices (not shown) such as a keyboard, a mouse, a monitor, one or more disk drives such as a CD-RW drive and a floppy diskette drive, and a printer, for example. In this embodiment, the I/O interface 302 includes an optical-electrical converter, for communicating with at least some of these devices (such as the fast radiometer 164 of the backside measurement system 236 and the ultrafast radiometer 102 of the topside temperature measurement system 234, for example) via a fiber optic network (not shown), to avoid difficulties posed by electromagnetic interference and electrical noise resulting from large electric currents and sudden electrical discharges required by the backside irradiance system 150 and the topside irradiance system 180.

In this embodiment, the pulse shape optimization routine 322 and the heat-treating routine 324 configure the processor circuit 110 to act as a Resonant Frequency Content Reducer 210, including a bulk heating profiler 212 for controlling a near-isothermal pre-heating stage, and an optimizing heat flux profiler 214 for determining and generating an optimal irradiance pulse shape, as discussed in greater detail below under the heading, "Operation".

Underlying Principles

The present embodiment is intended to control and reduce the magnitude of wafer vibration induced by the irradiance pulse 600, as well as the underlying thermal stress resulting from the temperature differential between the device-side 122 and the backside 124 of the wafer 120, during an ultra-fast wafer anneal process in which the device side 122 is exposed to the irradiance pulse 600. Controlling and reducing the magnitude of vibration and thermal stress induced by the irradiance pulse tend to decrease the rate of wafer damage or breakage resulting from the irradiance pulse. In this specification, references to thermal stress mean the stress resulting from the vertical temperature differential between the device side 122 and the substrate side 124 of the wafer 120.

The present embodiment achieves control of wafer deformation and vibration by employing a method referred to by the present inventors as Resonant Frequency Content Reduction or mnemonic RFCR. In general, RFCR of the heat flux reduces the excitation of the relevant resonant or vibration modes of the wafer while achieving a peak wafer surface temperature with a significantly cooler bulk temperature to provide rapid cooling of the surface. Generally, for RFCR to reduce the excitation of the resonant modes of the wafer, the rate at which the wafer is heated by the irradiance pulse should be reduced. This requirement is in apparent conflict with the primary purpose of such ultra-fast anneal processes, which has traditionally been to heat the device side 122 as quickly as possible by delivering flux energy to the device side 122 much faster than such energy can conduct into the bulk of the wafer, so that the bulk remains comparatively cool and subsequently acts as a heat sink to rapidly cool the device side 122 after it has reached the required annealing temperature. RFCR allows the user to balance these conflicting requirements by modulating the heat flux in an optimized manner to achieve a rapid rate of heating while minimizing wafer vibration under the constraints of the specified thermal cycle requirements for a particular annealing cycle, which typically specify the required peak temperature $T_P$, the maximum bottom-side temperature $T_{BMAX}$ (or maximum increase in bottom-side temperature), and the time-at-temperature $t_{atT}$, meaning the time interval for which the temperature $T_T(t)$ of the device side 122 is to be maintained within a predefined range ($T_{PL} \leq T_T(t) \leq T_P$) from the peak temperature.

In illustrative embodiments, a distinguishing time domain characteristic of RFCR is that the resulting heat flux is typically a rapid but continuous and non-abrupt application of heat flux to the device side 122 of the wafer, which continues until the peak temperature is reached. The specific form of RFCR of the heat flux as a function of time is designed to control its energy content at the wafer's resonant frequencies while achieving the specified temperature annealing requirements. In general, the time domain representation of RFCR can be described using:

$$Q_h(t;c,a) = cf(t,a) \quad (1)$$

where $Q_h(t;c,a)$ is a heat flux model representing the heat flux applied to the device side 122 of the wafer 120 as a function of time t, with parameters c and a; and $f(t,a)$ is a flux profile model selected from a class of continuous time domain functions, for which energy density distribution as a function of frequency in the frequency domain is dependent on a bandwidth parameter a and scaling parameter c.

The bandwidth parameter a can be viewed as changing the frequency interval over which the energy distribution of $f(t,a)$ varies from its maximum value, at zero frequency, to a defined minimum value, such as 10% of the maximum value.

Although only a single bandwidth parameter, a, controls the frequency interval where the energy density distribution falls within the defined maximum and minimum values in the present embodiment, in other embodiments, any number of parameters may be employed to control this frequency interval or other practical aspects of the heat flux profile model. It is generally advantageous to use a minimal set of parameters to ease the process required to estimate optimal values for the heat flux model parameters.

Referring to FIGS. 6 and 7, an example of an irradiance pulse according to an illustrative heat flux profile model is shown generally at 600 in FIG. 6, and the resulting temperature profiles of the device side 122 and the backside 124 are shown generally at 702 and 704 in FIG. 7, to illustrate specific characteristics that are central to understanding how the optimization of the heat flux profile model parameters is achieved in the present embodiment. FIG. 7 also identifies the temperature annealing requirements specified by the thermal cycle parameters, including the peak device-side temperature $T_P$, the intermediate temperature $T_i$ immediately prior to exposure of the device side 122 to the irradiance pulse 600, the maximum backside temperature $T_{BMAX}$, and the time-at-temperature interval, $t_{atT}$. Although $T_i$ denotes the intermediate temperature of the wafer as measured from its backside 124 immediately preceding exposure to the irradiance pulse, the device-side intermediate temperature immediately preceding the pulse is typically within a few degrees of $T_i$, due to the fact that the pre-heating stage preceding the irradiance pulse typically involves comparatively slow, near-isothermal heating at ramp rates that do not usually exceed about 400° C./sec. This near-isothermal state in which the device-side and back-side temperatures are approximately equal, effectively implies that the mean temperature of the bulk of the wafer is also within a few degrees of $T_i$. At some point in time, $t=t_0$, in this state, the irradiance pulse 600 shown in FIG. 6 is applied to the device-side 122 of the wafer 120. In the present embodiment, the intermediate temperature $T_i$ is specified as one of the annealing requirements defined by the thermal cycle parameters. In other embodiments, however, $T_i$ may not be specified as an annealing requirement, in which case $T_i$ becomes a model parameter that can be adjusted to help achieve an optimal set of values to minimize wafer vibration and thermal stress. The maximum backside temperature $T_{BMAX}$ is associated with a point in time, $t_{BMAX}$, at which the device-side and backside temperatures are within a specified distance of each other, where the distance is defined as $T_{TB}=|T_T-T_B|$ and $|\bullet|$ is the absolute magnitude operator.

In this embodiment, FIG. 6 illustrates the influence that the heat flux profile model parameters have on the flux profile, including the bandwidth parameter a, the flux scaling parameter c, and a flux rise-time parameter $t_1$. The bandwidth parameter, a, effectively controls the characteristic "shape" of the rate of increasing flux, either providing faster or slower rates of increasing flux. The flux scaling parameter, c, controls the peak magnitude of the flux. The flux rise-time interval, $t_1$, determines the point in time where the flux is no longer required to be increasing; effectively, time $t_1$ defines the transition between the heating portion 602 and the sustaining portion 604 of the irradiance pulse 600. (FIG. 6 assumes that the irradiance pulse 600 commences at time $t_0=0$, so that the rise time interval from commencement to the peak of the pulse 600 is simply $t_1$. More generally, however, the rise-time interval is $t_1-t_0$.) After the interval $t_1$, i.e., during the sustaining portion 604 of the irradiance pulse, the heat flux will be decreasing in a manner that attempts to maintain the device side temperature $T_T(t)$ within the bounds, $T_{PL} \leq T_T(t) \leq T_P$, as shown in FIG. 7, to time instant $t_2$, after which the flux goes to zero as fast as possible to achieve rapid cooling of the device side. As shown in FIG. 7, the time at temperature interval, $t_{atT}$, is associated with device side temperatures that are within the bounds $T_{PL} \leq T_T(t) \leq T_P$. The time instances defining the start, $t_s$, and the end, $t_e$, of the interval $t_{atT}$, will always bound time instances $t_1$ and $t_2$, that is, $t_1$ and $t_2$ will always be included in the interval $t_{atT}$.

In this embodiment, as discussed in greater detail below, the optimization process determines optimal values for the heat flux profile model parameters c, a, and $t_1$, which result in minimal wafer vibration and thermal stress while achieving the temperature annealing requirements specified by the thermal cycle parameters shown in FIG. 7. If desired, the results of the optimization process can be used in a finite element analysis to provide the user with an estimate of the relative degree of wafer vibration and thermal stress for a given set of temperature annealing requirements. If the user has the option of varying the temperature annealing requirements, the user can use the estimates of relative wafer vibration and thermal stress to select temperature annealing requirements that provide the least amount of wafer vibration and thermal stress, thereby achieving the least risk in wafer breakage or damage.

The following discussion assists in illustrating how RFCR can achieve control of both the magnitude of wafer vibration and thermal stress, while achieving rapid heating of the surface to a peak temperature followed by a rapid cooling of the surface.

Generally, the degree of vibration induced on a mechanical object is dependent on a number of factors, such as the bulk material properties of the object, the object's boundary conditions, the initial conditions of the object, and the spatial and temporal distribution of the driving forces. These factors are precisely defined by the governing differential equations used to approximate the dynamic behavior of the object, and the vibration of the object can be viewed as a superposition of discrete resonant modes, each with distinct regions of motion and frequency of vibration. The present inventors have conceived that the degree of excitation can be estimated by transforming the governing differential equations, initial and boundary conditions and the driving forces into the frequency domain. Once transformed into the frequency domain, the degree of excitation of a particular resonant mode is given by the product of the frequency representation of the driving forces and the solution of the differential equation at the frequency of the resonant mode. In general, the frequency domain solution can be expressed as:

$$Z(r,\theta,\omega_{mn}) = H(r,\theta,\omega_{mn})S(r,\theta,\omega_{mn})F(r,\theta,\omega_{mn}) \quad (2)$$

where
- $Z(r,\theta,\omega_{mn})$ is the frequency representation of the transverse motion of the wafer at radial coordinates r and θ;
- $\omega_{mn}$ are the resonant frequencies of the wafer, where indices m and n represent the vibration modes (m,n) such that m is nodal diameter number and n is the nodal circle number;
- $H(r,\theta,\omega_{mn})$ is the frequency representation of the modal shape of the wafer at the resonant frequencies $\omega_{mn}$;
- $S(r,\theta,\omega_{mn})$ is the frequency representation of the relationship of the resulting stresses in the wafer due to the temperature gradient through its thickness; and
- $F(r,\theta,\omega_{mn})$ is the frequency representation of the heat flux applied to the device-side 122 of the wafer 120, which for an approximately uniformly applied flux becomes $F(\omega_{mn})$.

The present inventors have further conceived that for a particular set of wafer bulk material characteristics, physical dimensions, and boundary conditions defined by how the wafer is supported, the term $H(r,\theta,\omega_{mn})$ in Equation (2) is effectively a constant for each resonant frequency $\omega_{mn}$, though it may be a different constant value for different values of $\omega_{mn}$. In addition, for a flux that is approximately uniformly applied to the device-side 122 of the wafer 120, the term $S(r,\theta,\omega_{mn})$ in Equation (2) is also effectively a constant for each $\omega_{mn}$, and again, may have a different constant value for different values of $(r,\theta,\omega_{mn})$. For a fixed position on the wafer, Equation (2) can be simplified to:

$$Z(\omega_{mn}) = K_{mn}(r,\theta)F(\omega_{mn}) \quad (3)$$

where $K_{mn}$ represents the constant values of $H(r,\theta,\omega_{mn})$ and $S(r,\theta,\omega_{mn})$ which is a function of position on the wafer. Therefore, the present inventors have conceived that a reduction of the transverse vibration of the wafer will be achieved by reducing $F(\omega_{mn})$, which represents the energy spectral distribution of the applied heat flux in the frequency domain. Furthermore, changes in the bandwidth parameter a can either increase or decrease the energy spectral distribution of the applied flux over a broad range of frequencies, including but not limited to the resonant frequencies of the wafer. It follows that it is not necessary to identify the specific resonant modes and frequencies associated with the wafer to reduce the degree of wafer vibration. Rather, it is sufficient to know that changes in the bandwidth parameter a of the heat flux model can either increase or decrease the energy spectral distribution of the applied heat flux at the resonant frequencies (whatever they may be), which will then increase or decrease the magnitude of the wafer vibrations.

The present inventors have further observed that the energy spectral distribution of the applied heat flux controls the degree to which the resonant modes of the wafer will be excited. In this context, the present inventors have conceived that the heat flux applied during heating to the peak temperature should ideally satisfy a number of important criteria, in order to reduce wafer vibration. Firstly, the frequency representation of the heat flux should exhibit energy spectral densities at the relevant wafer resonant frequencies which are relatively small compared to energy spectral densities associated with a step application of the heat flux. This particular criterion implies that the heat flux should exhibit smooth and non-abrupt changes over time up to the point when peak temperature is reached. In particular, the rate of change of the flux should begin at a minimal value and then increase with time until either the peak temperature is reached or until the flux reaches its maximum rate of increase after which the rate of increase may be reduced or held constant until the peak temperature is reached. These criteria suggest that flux profile models used to describe the time domain profile of the applied heat flux should be defined using continuous time functions such as:

$$Q_h(t; c, a) = cf(t, a) = c\frac{e^{at} - 1}{k} \quad (4)$$

or $$Q_h(t; c, a) = cf(t, a) = c\left(1 - \frac{e^{-(t-k)a}}{1 + e^{-(t-k)a}}\right) \quad (5)$$

where
- Q(t;c,a) is irradiance flux as a function of time t and parameters a and c;
- a is the bandwidth parameter, which controls the frequency interval over which the energy spectral density distribution falls within the defined maximum and minimum values;
- c is the scaling parameter associated with the peak magnitude of the heating portion 602 of the irradiance pulse;
- e is the Euler number; and
- k is selected to accommodate the time interval $t_0 \leq t \leq t_1$, over which the functions will be used, where $t_1$ is a rise time of the heating portion from commencement to peak magnitude; in other words, equations (4) and (5) are used to model only the heating portion 602 of the pulse 600. For equation (4), $k = e^{at_1} - 1$; and for equation (5), $$k = \frac{6}{a}$$

with the further constraint $t_1 \leq 12/a$ to ensure that only the increasing flux region of the model is used.

Equations (4) and (5) share a number of properties in common. Both are non-linear functions, both employ exponential functions, both are continuous in the time domain, and each function's rate of change in the time domain increases monotonically from commencement until at least the time at which the function's value reaches 25% of its peak value. Thus, in illustrative embodiments, the flux profile model of the heating portion 602 of the irradiance pulse 600 may include a non-linear function, or an exponential function, or a function that is continuous in the time domain, or a function whose rate of change in the time domain increases monotonically from commencement at least until the function's value reaches 25% of its peak value. (For some applications, it may be advantageous for the flux profile model to include a function whose rate of change in the time domain increases monotonically from commencement until at least the time at which the function's value reaches 50% of its peak value, or even until at least the time at which the function's value reaches 95% of its peak value, to further reduce stress in the workpiece.) Both equation (4) and equation (5) yield initial flux values which are negligible at time t=0. For equation (4), Q(t=0)=0. Although the flux value of equation (5) at time t=0 is not precisely equal to zero, its value at time t=0 for typical parameter values employed in the present embodiment is a small fraction of the peak flux output of the irradiance pulse, and is typically smaller than the idle current output of the flash lamp 183 which would immediately precede the irradiance flash, as described in greater detail in the above-noted U.S. Pat. No. 7,781,947. Therefore, for practical purposes, in the present embodiment, $Q(t=0) \simeq 0$ for equation (5).

Equation (5) is also referred to as a sigmoidal function, although equation (4) is not. Thus, the flux profile model of the heating portion 602 of the irradiance pulse may include a function from the class of sigmoidal functions such as equation (5) for example, or a function from the class of exponential functions, of which both equations (4) and (5) are examples. Alternatively, however, from the discussion contained herein, it should be apparent to those skilled in the art that other functions meeting the previously mentioned heat flux criteria can also be substituted for equation (4) or (5) as the flux profile model.

Returning to Equation (3), the present inventors have further conceived that the transverse motion of the wafer at a particular point $(r,\theta)$ on the wafer can provide an indication of the magnitude of the spectral energy distribution of the applied heat flux, $F(\omega_{mn})$. In other words, measurements of the motion of the wafer at one or more particular points can be used to estimate whether the spectral energy density distribution is increasing or decreasing from a desired set of values.

This information can then be used to control and modify the applied flux so that the spectral energy density distribution is within a specified set of bounds. For example, assume an optimal set of values for the heat flux model parameters has been determined (as discussed below in connection with the pulse shape optimization routine shown in FIG. 4). These parameter values can then be used to estimate a target set of values for $F(\omega_{mn})$ and a set of bounds on the values that are based on the user's tolerance for variation on the temperature annealing requirements. The motion of the wafer can then be monitored at one or more selected points and estimates of nth derivatives, for example, $n=0, 1, 2, 3$, of the motion can be used to estimate and predict the motion of the wafer, which then allows an estimate of the change in $Z(\omega_{mn})$ to be made. This estimate of the change can be based on the ratio of any two estimates of $Z(\omega_{mn})$. Ideally, the ratio change should be equal to one. This ratio change in $Z(\omega_{mn})$ can then be directly related to a ratio change in $F(\omega_{mn})$. If that change is outside the predetermined bounds for $F(\omega_{mn})$, then the rate of change of the applied flux should be adjusted to bring the change in $F(\omega_{mn})$ back within the predetermined bounds. In more general terms, this allows the applied flux to be actively controlled so it maintains a target set of values in the frequency domain or alternatively, in the time domain, to achieve a minimal degree of wafer vibration. In other words, this permits active, closed-loop feedback control of the flux, if desired, as discussed below in connection with the heat-treating routine shown in FIG. 5. The selection of points to monitor the wafer's transverse motion depends on the form of $H(r,\theta,\omega_{mn})$ which is dependent on the boundary conditions or how the wafer is supported. For a wafer that is approximately freely supported, points near the edge of the wafer provide values of $k_{mn}$ that are near their maximum values for all relevant resonant frequencies $\omega_{mn}$, thereby providing the greatest sensitivity to detected changes in $F(\omega_{mn})$ for changes in $Z(\omega_{mn})$. Changing how the wafer is supported, that is, changing its boundary conditions, will change the physical location of points where values of $K_{mn}$ are near their maximum value.

Operation
Pulse Shape Optimization Routine

Figure 4A:
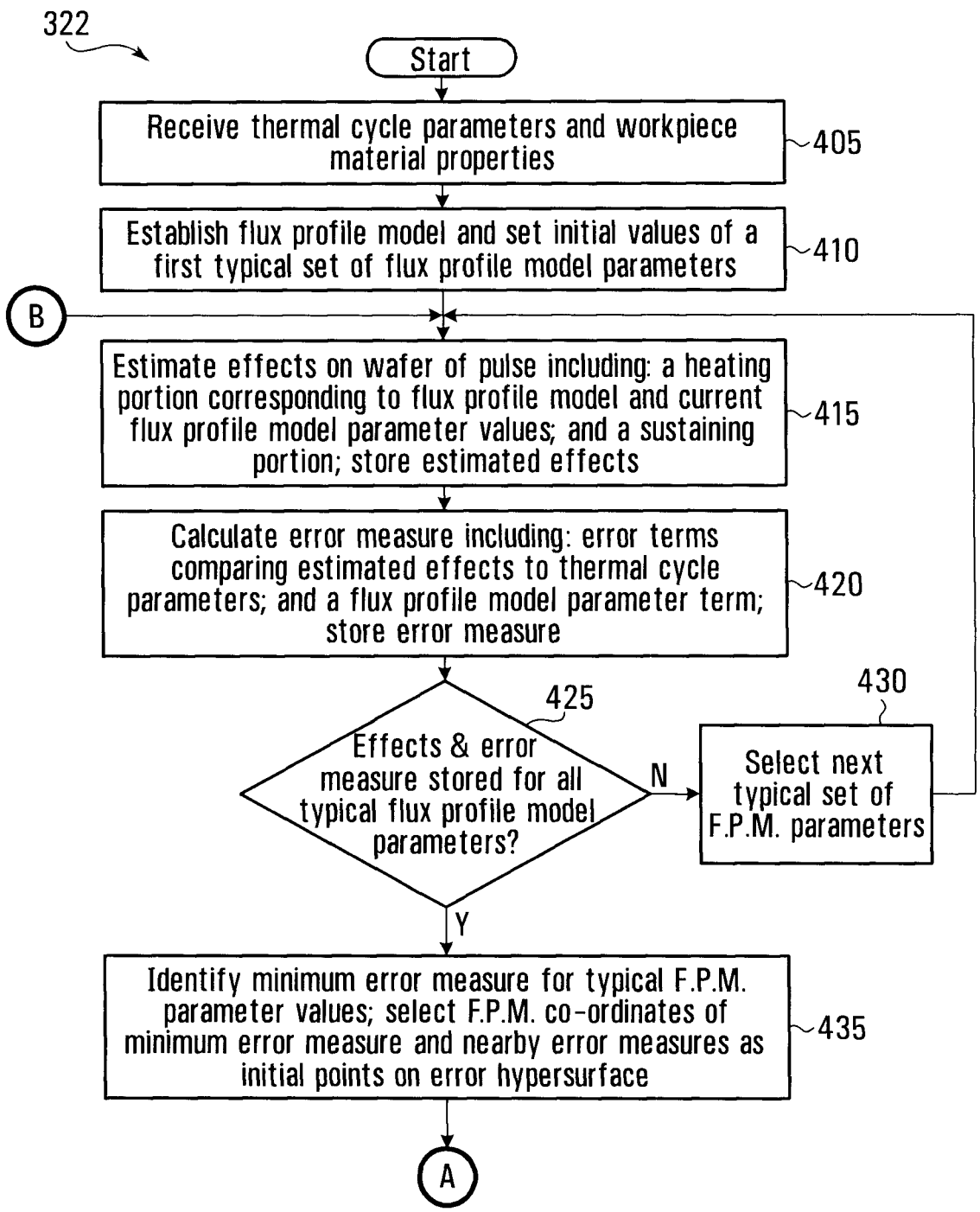
FIGS. 4A and 4B are a flowchart of a method of determining a shape of an irradiance pulse, to be carried out by the processor circuit of FIG. 3.
Figure 4B:
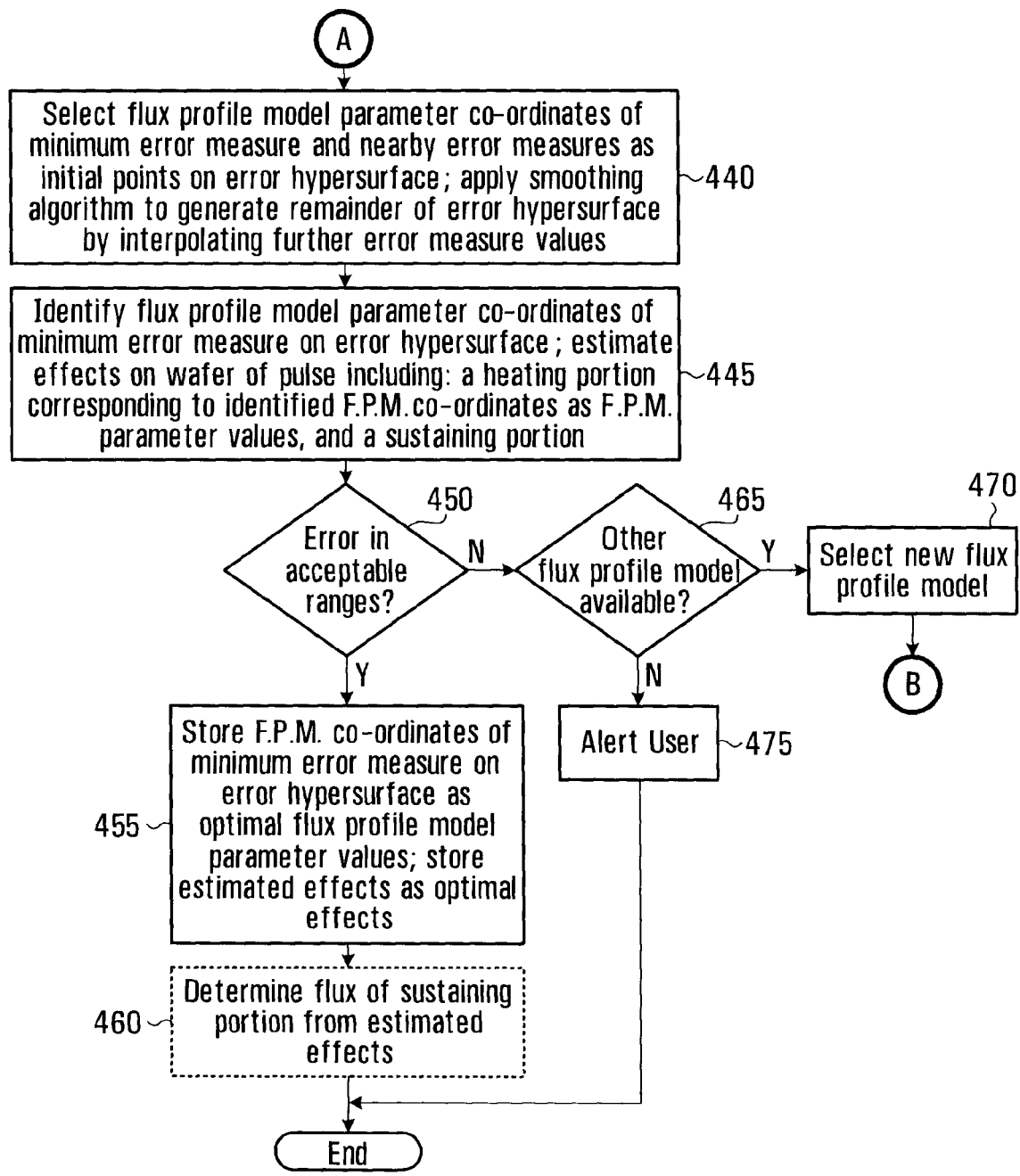

Referring to FIGS. 3, 4, 6 and 7, the pulse shape optimization routine is shown generally at 322 in FIG. 4. Generally, in this embodiment, the pulse shape optimization routine 322 configures the processor circuit 110 to determine the shape of the heating portion 602 of the irradiance pulse 600 by optimizing at least one parameter of the flux profile model of the heating portion 602 of the irradiance pulse 600 to satisfy the specified thermal cycle requirements, while minimizing frequency-domain energy spectral densities of the flux profile model at the resonant frequencies of the wafer 120, to minimize vibration of the wafer 120 at the resonant frequencies when the device side 122 of the wafer 120 is exposed to the irradiance pulse 600. More particularly, in this embodiment the at least one parameter of the flux profile model which the pulse shape optimization routine 322 directs the processor circuit 110 to optimize includes the bandwidth parameter a of the flux profile model associated with a rise rate of the heating portion 602 of the irradiance pulse 600.

In another aspect, in this embodiment the pulse shape optimization routine 322 configures the processor circuit 110 to receive thermal cycle parameters specifying requirements of the thermal cycle, and to determine a shape of the heating portion 602 of the irradiance pulse 600, by identifying at least one parameter of a flux profile model of the heating portion of the irradiance pulse to satisfy the requirements, where the flux profile model includes a function whose rate of change in the time domain increases monotonically from commencement until at least a time at which a value of the function reaches 25% of its peak value.

In yet another aspect, in this embodiment the pulse shape optimization routine 322 configures the processor circuit 110 to determine an optimal shape of a temporal temperature evolution of a workpiece to result from exposure of the workpiece to an irradiance pulse during a thermal cycle. The processor circuit receives thermal cycle parameters specifying requirements of the thermal cycle, and then determines the optimal shape of the temporal evolution of the workpiece, by optimizing at least one parameter of a flux profile model of a heating portion of the irradiance pulse to satisfy the requirements while minimizing frequency-domain energy spectral densities of the flux profile model at resonant frequencies of the workpiece, to minimize vibration of the workpiece at the resonant frequencies when the workpiece is exposed to the irradiance pulse.

In this embodiment, the pulse shape optimization routine 322 begins with a first block of codes 405, which directs the processor circuit 110 to receive thermal cycle parameters specifying requirements of a thermal cycle during which the wafer 120 is to be exposed to the irradiance pulse 600. More particularly, in this embodiment, the thermal cycle parameters which block 405 directs the processor circuit 110 to receive include the following requirements which are to result from application of the irradiance pulse 600 to the wafer: a peak temperature $T_P$ of the device side 122 of the wafer 120, a maximum temperature $T_{BMAX}$ of the substrate side 124 of the wafer 120, and a time-at-temperature interval $t_{atT}$ at which the temperature $T_T(t)$ of the device side 122 must remain within a predefined range from the peak device side temperature $T_P$. In the present embodiment, the predefined range is automatically defined as the range between the peak temperature and 50° C. less than the peak temperature, and thus, once the peak device side temperature $T_P$ has been received, block 405 directs the processor circuit to define a peak temperature range lower boundary parameter $T_{PL}=T_P-50°$ C., such that the time-at-temperature interval $t_{atT}$ specifies the time during which the temperature of the device side $T_T(t)$ is to remain within the range $T_{PL} \leq T_T(t) \leq T_P$. Alternatively, if desired, the predefined range (and thus the peak temperature range lower boundary parameter) may be specified by the user as one of the thermal cycle parameters which block 405 directs the processor circuit 110 to receive.

Also in this embodiment, the maximum backside temperature $T_{BMAX}$ is not necessarily intended to impose a restriction upon the global maximum of the temperature of the substrate side 124; rather, the maximum backside temperature $T_{BMAX}$ specifies a maximum permitted temperature of the substrate side 124 at a time $t_{BMAX}$ after the end of the irradiance pulse 600, at which a sufficient amount of heat has conducted from the device side into the bulk of the wafer to cause a difference between the device side and substrate side temperatures to fall to a value less than or equal to a specified threshold value $T_{TB}$ shown in FIG. 7. In this embodiment, the specified threshold $T_{TB}$ is a predefined default value of 20° C. Alternatively, however, other default values may be substituted, or as a further alternative, the threshold $T_{TB}$ may be an additional user-defined thermal cycle parameter.

In this embodiment, the thermal cycle parameters which block 405 directs the processor circuit 110 to receive also include an intermediate temperature $T_i$ of the substrate side 124 immediately prior to commencement of the irradiance pulse 600; alternatively, however, the intermediate temperature $T_i$ may be omitted from the thermal cycle parameters, in which case $T_i$ becomes an adjustable parameter which can be varied to assist in optimizing the flux profile model parameters. More generally, different thermal cycle parameters and/or different combinations of thermal cycle parameters may be received to specify different types of thermal cycle requirements, if desired.

In this embodiment block 405 directs the processor circuit 110 to prompt a user of the apparatus 100 to specify the above-noted thermal cycle parameters by selecting from among a plurality of predefined thermal cycles for which such parameters have been previously stored in the thermal cycle parameters store 323 in the storage medium 320, or by providing user input defining the thermal cycle parameters, or by identifying the storage location of a thermal cycle definition file containing the parameters. Block 405 directs the processor circuit 110 to store the received thermal cycle parameters in the thermal cycle parameters store 342 in the RAM 340. More particularly, block 405 directs the processor circuit 110 to store the peak device side temperature $T_P$, the time-at-temperature $t_{atT}$, the maximum backside temperature $T_{BMAX}$ and the intermediate temperature $T_i$ in a peak device side temperature storage area 343, a time-at-temperature storage area 344, a maximum backside temperature storage area 345 and an intermediate temperature storage area 346.

In this embodiment, block 405 also directs the processor circuit 110 to receive and store data representing material properties of the workpiece 106. More particularly, in this embodiment block 405 directs the processor circuit to receive and store data representing the thermal conductivity k(T) of the wafer 120 as a function of temperature, the heat capacity $c_P$(T) of the wafer as a function of temperature, the density ρ of the wafer, and the thickness $z_B$ of the wafer. In this embodiment, block 405 achieves this by prompting the user to select from one of a plurality of predefined wafer types for which such data have been stored in the workpiece properties store 321 in the storage medium 320. Block 405 directs the processor circuit to read the wafer properties k(T), $c_P$(T), ρ and $z_B$ from the storage area in the workpiece properties store 321 corresponding to the user-selected wafer type, and to copy these properties to a thermal conductivity storage area 312, a heat capacity storage area 314, a density storage area 316 and a thickness storage area 318, respectively, in the workpiece properties store 320 in the RAM 340. More particularly, in this embodiment, for the temperature-dependent properties k(T) and $c_P$(T), the workpiece properties store 321 stores a plurality of discrete values of k(T) and $c_P$(T), for a plurality of respective temperature values T. Block 405 directs the processor circuit to read the plurality of stored discrete values of k(T) and to apply a spline interpolation (or alternatively, a linear interpolation) to the stored values to estimate further values of k(T) not stored, over a desired temperature range. Block 405 directs the processor circuit to repeat this process for $c_P$(T), and to store the resulting stored and interpolated values of k(T) and $c_P$(T) in the thermal conductivity storage area 312 and the heat capacity storage area 314, respectively. For the purposes of the present embodiment, the temperature-dependent material properties are only pre-stored and interpolated for temperatures ranging from room temperature to the melting point of silicon, as temperatures outside this range are not expected. Alternatively, however, other embodiments may employ representations of the temperature-dependent material properties for different temperature ranges. In this embodiment, the slight temperature dependence of the density ρ of the wafer and of the thickness $z_B$ of the wafer are deemed negligible, and ρ and $z_B$ are treated as constants. Alternatively, if desired, these properties may also be treated as temperature-dependent properties in a manner similar to k(T) and $c_P$(T). As a further alternative, block 405 may provide the user with the option of manually entering either the workpiece material properties or a storage location of a material properties file in which the material properties are stored.

Generally, blocks 410 to 460 then direct the processor circuit 110 to determine the shape of the heating portion 602 of the irradiance pulse 600 by determining a heating portion pulse shape to heat the device side 122 to the peak device side temperature $T_P$, and to determine the shape of the sustaining portion 604 of the irradiance pulse 600 by determining a sustaining portion pulse shape to sustain the device side temperature $T_T(t)$ within the predefined range from the peak device side temperature $T_P$ for the time-at-temperature interval $t_{atT}$ while maintaining the backside temperature $T_B(t)$ below or equal to $T_{BMAX}$ at least until the associated time $t_{BMAX}$, as discussed in greater detail below.

In this embodiment, block 410 directs the processor circuit 110 to establish a flux profile model and an initial set of values of flux model parameters for the flux profile model.

To establish the flux profile model, in the present embodiment, block 410 directs the processor circuit 110 to prompt the user to select a flux profile model from among a set of pre-defined flux profile models stored in the flux profile models store 326 in the storage device 320. In this embodiment, the flux profile models store 326 stores representations of an exponential flux profile model defined by equation (4) above as well as a sigmoidal flux profile model defined by equation (5) above, which the user may select between, with equation (5) being the default flux profile model. Alternatively, the user may be permitted to select from among a larger set of possible flux profile models. As a further alternative, such a selection step may be omitted entirely: for example, in some embodiments the processor circuit 110 may initially select a default flux profile model, but may later proceed to successively select other available flux profile models if the initially selected flux profile model fails to yield tolerable errors as assessed at blocks 420 to 435 discussed below. As a further example, in other embodiments only a single available flux profile model may be defined. Block 410 directs the processor circuit to store the established flux profile model in the flux profile model store 350 in the RAM 340.

Once the flux profile model has been established, block 410 directs the processor circuit 110 to establish an initial set of values of flux profile model parameters for the established flux profile model. In this regard, in the present embodiment, the flux profile model has a plurality of flux profile model parameters, including the at least one parameter which the processor circuit is configured to optimize. More particularly, in this embodiment, the flux profile model parameters include a bandwidth parameter a associated with a rise rate of the heating portion 602 of the irradiance pulse 600, a scaling parameter c associated with the peak magnitude of the heating portion 602, and a rise time interval $t_1$ between a commencement of the heating portion 602 and the peak magnitude of the heating portion 602.

In this embodiment, the flux model profile parameters store 328 in the storage device 320 stores a plurality of sets of pre-defined "typical" flux model parameter values for each flux profile model stored in the flux profile models store 326. In this embodiment, for a given flux profile model, each set of typical parameter values $(a,c,t_1)$ is a unique combination of discrete predefined values of the three flux profile model parameters; for each parameter, the discrete predefined values span a range that encompasses the likely maximum and minimum possible value of the optimal value of the parameter. Accordingly, in this embodiment, block 410 directs the processor circuit 110 to read a first unique set of flux profile model parameter values $(a,c,t_1)$ from the flux profile model parameters store 328 corresponding to the flux profile model identified by the contents of the flux profile model store 350, and to copy these initial parameter values $(a,c,t_1)$ to a bandwidth parameter storage area 353, a scaling parameter storage area 354 and a rise time parameter storage area 355, respectively, in the flux profile model parameters store 352 in the RAM 340. Alternatively, different parameters or different combinations of parameters may be substituted. For example, if the intermediate temperature $T_i$ immediately preceding commencement of the irradiance pulse 600 was not specified at block 405 as one of the thermal cycle requirement parameters, then block 410 may direct the processor circuit 110 to also identify an initial value of the intermediate temperature $T_i$, and to copy the identified value to an intermediate temperature storage area 356 in the flux profile model parameters store 352 in the RAM 340.

In this embodiment, once the flux profile model and its initial parameter values have been established at block 410, block 415 directs the processor circuit 110 to estimate effects on the wafer 120 that would result from application of an irradiance pulse 600 including a heating portion 602 corresponding to the flux profile model and the current set of values of the flux profile model parameters. More particularly, in this embodiment block 415 directs the processor circuit to estimate effects on the wafer 120 that would result from application of an irradiance pulse 600 including both the heating portion 602 and the sustaining portion 604. More particularly still, in this embodiment the effects on the wafer 120 which the processor circuit 110 is configured to estimate include device side temperatures $\hat{T}_T(t)$, substrate side temperatures $\hat{T}_B(t)$, a peak device side temperature $\hat{T}_P$, a maximum substrate side temperature $\hat{T}_{BMAX}$, a time-at-temperature interval $\hat{t}_{atT}$ at which the device side temperature $\hat{T}_T(t)$ will remain within a predefined range from the peak device side temperature $\hat{T}_P$, and an in-range start time $\hat{t}_s$ at which the device side temperature $\hat{T}_T(t)$ first enters the predefined range from the peak device side temperature.

To achieve this, in the present embodiment, block 415 first sets a time interval $t_x$ over which the effects on the wafer are to be estimated, where $t_x$ is intended to be later than the time $t_{BMAX}$ at which the temperature of the substrate side 124 of the wafer 120 is not permitted to exceed the value $T_{BMAX}$ stored in the maximum backside temperature storage area 345 in the thermal cycle parameters store 342. In this embodiment, $t_x$ is initially set to a value approximately equal to the thermal time constant (i.e., a characteristic thermal conduction time through the thickness of the wafer) which the wafer would have if its entire bulk was at the desired peak temperature $T_P$; it will be appreciated that the thermal time constant of a silicon wafer tends to increase with temperature, so the thermal time constant assuming a uniform bulk temperature $T_P$ will tend to be significantly longer than the thermal time constant of the same wafer at the cooler intermediate temperature $T_i$, or the average thermal time constant over the course of the non-isothermal flash-induced heating and cooling described herein. As discussed below at block 415, if the initially selected value of $t_x$ is inadvertently too small, so that $t_x < t_{BMAX}$, or in other words, the difference between the device side and substrate side temperatures following the irradiance pulse does not fall below the threshold difference value $T_{TB}$ associated with the specified maximum backside temperature $T_{BMAX}$ prior to time $t_x$, then the value of $t_x$ will be increased by 50% and all required calculations will be repeated, until a value of $t_x$ has been obtained such that $t_x > t_{BMAX}$.

In this embodiment, block 415 then directs the processor circuit 110 to estimate the effects on the wafer from the heating portion 602 of the irradiance pulse 600 in accordance with the current contents of the flux profile model store 350 and the flux profile model parameters store 352 in the RAM 340. To achieve this, in this embodiment, block 415 directs the processor circuit 110 to numerically solve a differential transient heat conduction equation over the time intervals corresponding to and following the heating portion 602 and the sustaining portion 604 of the irradiance pulse 600, as discussed below.

More particularly, in this embodiment block 415 directs the processor circuit 110 to numerically solve the one-dimensional transient heat conduction equation given by:

$$\frac{k(T)}{c_p(T)\rho} \frac{\partial^2 \theta(z,t)}{\partial z^2} - \frac{\partial \theta(z,t)}{\partial t} = 0 \tag{6}$$

where:
- $k(T)$ is the thermal conductivity of the wafer as a function of temperature, stored in the thermal conductivity storage area 213;
- $c_P(T)$ is the heat capacity of the wafer as a function of temperature, stored in the heat capacity storage area 314;
- $\rho$ is the density of the wafer, stored in the density storage area 316; and
- $\theta = T(z,t) - T_i$ is the difference between the temperature of the wafer at position z and time t and the intermediate temperature $T_i$ of the wafer immediately preceding the flash, with z representing a vertical depth beneath the device side of the wafer such that $z_0 = 0$ represents the device side and $z = z_B$ representing the bottom side of the wafer, with the thickness $z_B$ being stored in the thickness storage area 318.

In this embodiment, block 415 first directs the processor circuit 110 to numerically solve the above equation for $\theta(z,t)$ over the time interval $t_0 \le t < t_1$, corresponding to the heating portion 602 of the irradiance pulse 600, wherein:

$$\theta(z,t=0) = 0 \tag{7}$$

specifies the initial conditions, namely, that the entire thickness of the wafer is at the intermediate temperature $T_i$ at time $t=0$ coinciding to commencement of the irradiance pulse;

$$\frac{\partial \theta(z_0, t)}{\partial z} = Q(t; c, a) \quad (8)$$

specifies the device side boundary condition, wherein Q(t; c,a) is the flux profile model stored in the flux profile model store 350 with bandwidth and scaling parameters a and c stored in the bandwidth and scaling parameter storage areas 353 and 354; and $$\frac{\partial \theta(z = z_B, t)}{\partial z} = 0 \quad (9)$$

specifies the backside boundary condition.

Block 415 directs the processor circuit 110 to store the numerically solved values for θ(z,t) over the time interval $t_0 \leq t < t_1$ in a temperature change storage area 379 defined within the estimated effects store 372.

In this embodiment, once equation (6) has been solved for the time interval $t_0 \leq t < t_1$ corresponding to the heating portion 602 of the irradiance pulse 600, block 415 then directs the processor circuit 110 to numerically solve equation (6) for θ(z,t) over time interval $t_1 \leq t < t_2$, corresponding to the sustaining portion 604 of the irradiance pulse 600. To identify the time $t_2$, it will be appreciated from FIG. 7 that $(t_2+L)=t_s+t_{atT}-\Delta t_e$, as discussed in greater detail earlier herein. However, for the purposes of the present embodiment, the thermal lag time L of the wafer is disregarded, so that $t_2 \cong t_s + t_{atT} - \Delta t_e$. In this embodiment, block 415 directs the processor circuit to examine the temperature difference values θ(z=0,t) for times t=0 to $t=t_1$, and to identify the in-range start time $t_s$ as the time t at which $\theta(0,t)=\theta(0,t_1)-50°$ C. In the present embodiment, for the purpose of calculating the time $t_2$, the time-at-temperature value $t_{atT}$ is read from the time-at-temperature parameter storage area 344, and the value of $\Delta t_e$ is initially set equal to a pre-defined estimate of 100 microseconds. (In some embodiments, this value may be subsequently adjusted following an initial execution of block 415, as discussed further below.) In this embodiment, in order to predict the effects of the sustaining portion 604 of the irradiance pulse upon the wafer, it is not necessary to calculate the actual flux that the sustaining portion will use to sustain the device side of the wafer at a constant temperature, for each iteration of block 415. Rather, in this embodiment equation (6) is numerically solved for the temperature change θ(z,t) over time interval $t_1 \leq t < t_2$ by imposing a boundary condition that the sustaining portion 604 will successfully maintain the device side temperature constant at the temperature to which the heating portion 602 had heated the device side by time $t_1$. To achieve this, in this embodiment block 415 directs the processor circuit to change the initial and boundary conditions with reference to time $t'=t-t_1$, wherein:

$$\theta(z, t'=0) = \theta(z, t_1) \quad (10)$$

specifies the initial conditions;

$$\theta(z_0, t') = \theta(z_0, t=t_1) \quad (11)$$

specifies the device side boundary condition, namely, that the device side temperature will be held constant at the temperature value that it had reached at time $t_1$ from exposure to the heating portion 602; and $$\frac{\partial \theta(z = z_B, t')}{\partial z} = 0 \quad (12)$$

specifies the backside boundary condition.

Block 415 directs the processor circuit 110 to store the numerically solved values for θ(z,t) over the time interval $t_1 \leq t < t_2$ corresponding to the sustaining portion 604 in the temperature change storage area 379.

In this embodiment, block 415 then directs the processor circuit 110 to numerically solve equation (6) for θ(z,t) over time interval $t_2 \leq t \leq t_x$ corresponding following the discontinuance at time $t_2$ of the irradiance flux at the end of the sustaining portion 604. To achieve this, block 415 directs the processor circuit 110 to change the initial and boundary conditions with reference to time $t''=t-t_2$, wherein:

$$\theta(z, t''=0) = \theta(z, t_2) \quad (13)$$

specifies the initial conditions;

$$\frac{\partial \theta(z = z_0, t'')}{\partial z} = 0 \quad (14)$$

specifies the device side boundary condition; and $$\frac{\partial \theta(z = z_B, t'')}{\partial z} = 0 \quad (15)$$

specifies the backside boundary condition.

Block 415 directs the processor circuit 110 to store the numerically solved values for θ(z,t) over the time interval $t_2 \leq t < t_x$ in the temperature change storage area 379.

In this embodiment, block 415 directs the processor circuit 110 to numerically solve equation (6) for θ(z,t) as described above using MATLAB™ software which is commercially available from The MathWorks, Inc. Alternatively, however, other suitable numerical methods may be substituted. Preferably, alternative numerical solution methods should ideally provide sufficient temporal and spatial resolution to ensure a solution with stable results, i.e., a small change in the values of the parameters for the differential equation should not produce a large change in the error measure results discussed below in connection with blocks 420 to 445. In this regard, instability of the results tends to decrease the smoothness of the error hypersurface discussed below: the less smooth the error hypersurface, the greater the likelihood that the optimization process will yield results which do not satisfy acceptable error ranges. Accordingly, even though high-quality numerical solution methods are typically associated with increased computation time, their use is advantageous for the purpose of the present embodiment. Alternatively, a faster, lower-quality numerical solution method may be substituted if desired, with a resulting trade-off in terms of stability and errors.

Thus, in this embodiment, block 415 directs the processor circuit to numerically solve for θ(z,t), for all relevant times $t_0 \leq t \leq t_x$ and wafer depths $0 \leq z \leq z_B$, as described above, and to store these values in the temperature change storage area 379. In this embodiment, block 415 further directs the processor circuit to use these numerical solutions for θ(z,t) to produce estimates of the temperature of the wafer, as follows:

$$\hat{T}(z,t) = \theta(z,t) + T_i \quad (16)$$

Block 415 directs the processor circuit to store the resulting temperature estimate values in a temperature estimates storage area 380 in the estimated effects store 372. In this embodiment, as the topside and backside wafer temperatures are of particular interest, block 415 further directs the processor circuit to copy the topside and backside wafer temperature estimate values, which are given by:

$$\hat{T}_T(t) = \theta(0,t) + T_i \quad (17)$$

$$\hat{T}_B(t) = \theta(z_B,t) + T_i \quad (18)$$

to the topside temperature estimates storage area 373 and the backside temperature estimates storage area 374 in the estimated effects store 372. In this embodiment, block 415 further directs the processor circuit to identify the highest topside temperature estimate value in the storage area 373 and to copy it to the peak topside temperature storage area 375. Likewise, in this embodiment block 415 directs the processor circuit to compare the contents of the topside and backside temperature estimates storage areas 373 and 374 for times subsequent to time $t_2$, to identify a time $t_{BMAX}$ subsequent to $t_2$ at which the difference between the topside and backside temperatures first equals or falls below the specified temperature difference $T_{TB}$, and to copy the backside temperature estimate value for time $t_{BMAX}$ to the peak backside temperature storage area 376. In this regard, as shown in FIG. 7, for the purpose of the present embodiment in which $T_{TB}$=20° C., the backside temperature $T_B(t)$ is expected to be a monotonically increasing function of time over the interval $t_0 \leq t \leq t_{BMAX}$, with the result that the maximum backside temperature $T_B(t)$ over this interval will occur precisely at time $t_{BMAX}$, i.e., $T_{BMAX} = T_B(t_{BMAX})$.

In this regard, it will be recalled that the peak backside temperature $T_{BMAX}$ is not intended to identify a global maximum of the backside temperature, but rather, is intended to specify the maximum backside temperature at a specific time $t_{BMAX}$ following the irradiance pulse, at which a sufficient amount of heat has conducted from the device side into the bulk of the wafer to cause the topside-to-backside temperature difference to fall below the specified threshold value $T_{TB}$ (which in this embodiment is a default difference value of 20° C.). If, however, no such time $t_{BMAX}$ is identified, or in other words, if the difference between the topside and backside temperatures exceeds the specified threshold value $T_{TB}$ for all times t in the range of $t_2 < t \leq t_x$, then this means that the effects of the irradiance pulse 600 on the wafer have not been calculated over a sufficiently long temporal range; accordingly, in such a case, block 415 directs the processor circuit 110 to increase the value $t_x$ by 50% and to numerically solve equation (6) above with boundary conditions (13), (14) and (15) for all times between the previous value of $t_x$ and the new increased value of $t_x$, in the same manner as described above Such increases of $t_x$ are repeated if necessary until $t_x$ is sufficiently long that the processor circuit is able to identify a time $t_{BMAX} > t_2$ at which the difference between the topside and backside temperatures has fallen to a value less than or equal to the threshold value $T_{TB}$.

In this embodiment, block 415 further directs the processor circuit 110 to estimate a time-at-temperature interval $\hat{t}_{atT}$ at which the device side temperature $\hat{T}_T(t)$ will remain within a predefined range from the peak device side temperature $\hat{T}_P$, as well as an in-range start time $\hat{t}_s$ and an in-range end time $\hat{t}_e$ marking the start and end of the time-at-temperature interval. To achieve this, block 415 directs the processor circuit to examine the contents of the topside temperature estimates storage area 373, and to set the in-range start time $\hat{t}_s$ equal to the earliest time value t at which the estimated device side temperature $\hat{T}_T(t)$ is equal to or exceeds $\hat{T}_{PL}$, where $\hat{T}_{PL}$ is a lower temperature range boundary defined as $\hat{T}_{PL} = \hat{T}_P - 50$, where $\hat{T}_P$ is the estimated peak device side temperature stored in the peak topside temperature storage area 375. Block 415 further directs the processor circuit to continue examining the contents of the topside temperature estimates storage area 373, and to identify the earliest time $\hat{t}_e$ subsequent to time $\hat{t}_s$ at which the estimated device side temperature $\hat{T}_T(t)$ is equal to or less than $\hat{T}_{PL}$. Block 415 directs the processor circuit to store the difference between these two times, $\hat{t}_{atT} = \hat{t}_e - \hat{t}_s$, in the estimated time-at-temperature storage area 377. Block 415 further directs the processor circuit to store the identified in-range start time $\hat{t}_s$ and the in-range end time $\hat{t}_e$ in an in-range times storage area 378.

If desired, once the in-range end time $\hat{t}_e$ has been identified, block 415 may also direct the processor circuit 110 to estimate the temperature drop-off time $\Delta t_e$, representing the time interval during which the device side temperature falls from its peak value to the lower temperature boundary value $T_{PL}$ following discontinuance of the sustaining portion 604. as shown in FIG. 7. It will be recalled that this time interval $\Delta t_e$ was initially set to a predefined estimate of 100 μsec for the purpose of estimating time $t_2$. In an illustrative variation of the present embodiment, block 415 directs the processor circuit to calculate this value as $\Delta \hat{t}_e = \hat{t}_e - t_2$ (recalling that the lag time L is ignored in the present embodiment). If the calculated value $\Delta \hat{t}_e$ deviates from the predefined estimate ($\Delta t_e = 100$ μsec) by more than a threshold amount, block 415 may direct the processor circuit to set the calculated value $\Delta \hat{t}_e$ as a new predefined estimate to determine a new value of time $t_2$, and may direct the processor circuit 110 back to block 415 to begin re-calculating all estimated effects again using the new value of $t_2$. Alternatively, this step may be omitted if desired.

Block 415 then directs the processor circuit 110 to store all of the above estimated effects in the storage medium 320 in association with the current flux profile model and the current flux profile model parameter values. More particularly, in this embodiment, the estimated effects and error measures store 330 defines a plurality of records: each record includes respective fields identifying the flux profile model, a unique set of typical flux profile model parameters, each of the estimated effects discussed above at block 415, and an associated error measure discussed below at block 420. For a given flux profile model, a plurality of such records are stored, one record for each unique combination of typical flux profile model parameters for which estimated effects and error measures are calculated at blocks 415 and 420. In this embodiment, block 415 directs the processor circuit to copy the entire contents of the flux profile model store 350, the flux profile model parameters store 352 and the estimated effects store 372, including the contents of all of the individual storage areas of these three stores, into respective fields of a corresponding record in the estimated effects and error measures store 330.

In this embodiment, blocks 420 to 445 then direct the processor circuit 110 to minimize errors between the estimated effects and the thermal cycle requirements specified by the thermal cycle parameters. More particularly, in this embodiment blocks 420 to 445 configure the processor circuit to minimize an error measure including error terms associated with the errors between the estimated effects and the thermal cycle requirements. In this embodiment, the error measure further includes a flux profile model parameter term associated with the at least one parameter of the flux profile model of the heating portion of the irradiance pulse, as discussed below.

To achieve this, in the present embodiment, block 420 directs the processor circuit 110 to calculate the errors between the estimated effects stored in the estimated effects store 372 and the thermal cycle requirements specified by the thermal cycle parameters stored in the thermal cycle parameters store 342. More particularly, in this embodiment, block 420 directs the processor circuit to calculate an error measure ê of the form:

$$\hat{e}(c, a, t_1) = \sqrt{\begin{array}{c}w_1\left(T_P - \hat{T}_P^{(c,a,t_1)}\right)^2 + w_2\left(T_{BMAX} - \hat{T}_{BMAX}^{(c,a,t_1)}\right)^2 + \\ w_3\left(t_{atT} - \hat{t}_{atT}^{(c,a,t_1)}\right)^2 + w_4 a^2\end{array}} \quad (19)$$

wherein $T_P$, $T_{BMAX}$ and $t_{atT}$ are the thermal cycle parameters stored in the peak device side temperature storage area 343, the maximum backside temperature storage area 345 and the time-at-temperature storage area 344 of the thermal cycle parameters store 342 in the RAM 340;

$\hat{T}_P$, $\hat{T}_{BMAX}$ and $\hat{t}_{atT}$ are the estimated effects values stored in the peak topside temperature estimate storage area 375, the peak backside temperature estimate storage area 376 and the time-at-temperature estimate storage area 377 in the estimated effects store 372 in the RAM 340;

c, a and $t_1$ are the current values of the flux profile model parameters stored in the scaling parameter storage area 354, the bandwidth parameter storage area 353 and the rise time parameter storage area 355 in the flux profile model parameters store 352 in the RAM 340; and $w_1$, $w_2$, $w_3$ and $w_4$ are weighting coefficients.

Generally, the weighting coefficients $w_1$, $w_2$, $w_3$ and $w_4$ may be selected to place greater or less weight upon each of the individual terms contained in the error measure.

Thus, in this embodiment, the error measure contains not only error terms associated with errors between the specified thermal cycle parameters and the estimated effects of the irradiance pulse 600, but also includes an additional flux profile model parameter term associated with the at least one flux profile model parameter. In this embodiment, the additional flux profile model parameter term is a bandwidth term $w_4 a^2$, although different flux profile model parameter terms may be appropriate for different flux profile models.

Generally, in illustrative embodiments, the flux profile model parameter term or terms to be included in the error measure should be selected to ensure that minimization of the error measure in the time domain also results in minimization of the energy spectral densities of a frequency domain representation of the flux profile model at the wafer's resonant frequencies. In this regard, it will be recalled from the discussion of underlying principles earlier herein that in order to reduce the energy spectral densities of a frequency domain representation of the flux profile model across a frequency range including the resonant frequencies of the wafer 120, the rate of change (slope) of the flux in the time domain should begin at a minimal value then increase with time until either the peak temperature is reached or until the flux reaches its maximum rate of increase. In the present embodiment, in which equation (5) above has been selected as the default flux profile model, decreasing the bandwidth parameter a tends to cause the flux profile model to have a decreased initial slope and a more gradual increase toward the peak. Accordingly, in this embodiment, minimizing the value of the bandwidth parameter a while minimizing the resulting errors between the specified thermal cycle parameters and the estimated effects of the resulting irradiance pulse upon the wafer tends to minimize the energy spectral densities of the flux profile model across a broad range of frequencies including the resonant frequencies of the wafer, thereby minimizing vibration of the wafer at the resonant frequencies when the wafer is exposed to the irradiance pulse. The inclusion of the flux profile model parameter term $w_4 a^2$ in the error measure to be minimized effectively serves to minimize the bandwidth parameter a.

In general, it should be possible to express any alternative flux profile model in a manner that also calls for minimization of a bandwidth parameter in order to decrease the energy spectral densities of the flux profile model at the resonant frequencies of the wafer. Alternatively, as this is a matter of choice of the form of expression of the flux profile model, if desired, a given flux profile model may be expressed in a form that calls for maximization rather than minimization of a bandwidth parameter a in order to reduce the energy spectral densities, in which case the error measure to be minimized may include a term of the form $w_4(1/a)^2$ or a similar term, in order to maximize the bandwidth parameter while minimizing errors.

More generally, other suitable error measures may be substituted if desired. Generally, it is preferable to select an error measure that provides a relatively smooth error hypersurface as discussed below in connection with blocks 435 to 445, to facilitate the identification of a global minimum or an acceptable local minimum.

In this embodiment, block 420 directs the processor circuit 110 to store the above-calculated error measure in the error measure store 385 in the RAM 340, in a field corresponding to the current values of the flux profile model parameters a, c and $t_1$. In this embodiment, the error measure store 385 effectively defines a four-dimensional array, in which an error measure value can be stored for each different combination of flux profile model parameters a, c and $t_1$. Alternatively, however, different numbers of parameters may be used in different embodiments. In this embodiment, block 420 also directs the processor circuit to store the calculated error measure in the storage medium 320, in an error measure field (not shown) of the record in the estimated effects and error measures store 330 which corresponds to the current flux profile model and the current values of the flux profile model parameters a, c and $t_1$.

In this embodiment, blocks 425 and 430 then direct the processor circuit 110 to select a new set of values of the flux profile model parameters, to estimate effects on the wafer that would result from application of an irradiance pulse corresponding to the flux profile model and the new set of values of the flux profile model parameters, to calculate an error measure corresponding to errors between the estimated effects and the thermal cycle requirements specified by the thermal cycle parameters, and to repeat these steps of selecting the new set of values, estimating the effects on the wafer and calculating the error measure, over a range of possible values for each flux profile model parameter.

In this regard, the present embodiment advantageously employs a number of tactics to reduce the computation time required to determine an optimal pulse shape. Conceptually, the simplest way to minimize the error measure would be to calculate the error measure for every possible combination of flux profile model parameters a, c and $t_1$ over their entire possible ranges, and to simply keep track of which combination of parameters a, c and $t_1$ yielded the lowest error measure. Accordingly, an alternative embodiment may take precisely that approach, if sufficient computational resources are available. Pragmatically, however, to calculate the error measure for every possible combination of flux profile model parameters a, c and $t_1$ is inefficient. Therefore, in the present embodiment, several tactics are employed to attempt to minimize the number of different combinations of the parameters a, c and $t_1$ which will have to be considered before the combination yielding the minimum error measure is identified. More particularly, in this embodiment, rather than calculating estimated effects and an error measure for every possible combination of every possible incremental value of each of the parameters a, c and $t_1$, in this embodiment such estimated effects are only directly calculated for the sets of "typical" parameter values discussed above at block 410. For each parameter, the typical values for which estimated effects and an error measure are calculated are discrete, coarsely spaced values which span a range encompassing the likely maximum and minimum possible values of the optimal value of the parameter, but which omit many possible finely spaced incremental values between each pair of adjacent coarsely spaced discrete values. For the omitted finely spaced incremental parameter values between each pair of adjacent "typical" values, an error measure is interpolated by a smoothing algorithm as discussed below at block 440, thereby avoiding the need to calculate estimated effects and an error measure for every possible combination of such finely spaced values.

Accordingly, in this embodiment, block 425 first directs the processor circuit 110 to determine whether estimated effects and an error measure have been calculated and stored in the estimated effects and error measures store 330 for all possible combinations of coarsely spaced "typical" flux profile model parameter values.

If not, then block 430 directs the processor circuit 110 to select the next possible unique combination of coarsely spaced "typical" flux profile model parameter values (a,c,$t_1$), and to store these values in the bandwidth parameter storage area 353, the scaling parameter storage area 354 and the rise time storage area 355 in the flux profile model parameters store 352. Block 430 then directs the processor circuit back to blocks 415 and 420, to calculate estimated effects and an error measure for corresponding to the new flux profile model parameter values, and to store the estimated effects and the error measure along with the new flux profile model parameter values in a new record in the estimated effects and error measures store 330.

If at block 425 it is determined that a record containing estimated effects and an error measure value has been stored in the estimated effects and error measure store 330 for every possible combination of coarsely spaced "typical" flux profile model parameter values, block 435 directs the processor circuit to identify the minimum calculated error measure and its associated set of flux model parameter values. More particularly, in this embodiment block 435 directs the processor circuit 110 to locate the record in the estimated effects and error measure store 330 containing the lowest error measure value. Block 435 then directs the processor circuit to copy the contents of this record, including at least the flux profile model parameter values (a,c,$t_1$), the estimated peak device side temperature $\hat{T}_P$, the estimated maximum substrate side temperature $\hat{T}_{BMAX}$, the estimated time-at-temperature interval $t_{atT}$, the complete set of estimated temperature values $\hat{T}(z,t)$, and the error measure value $\hat{e}$, into corresponding storage areas 363, 364, 365, 367, 368, 369, 361 and 362, respectively, in the optimized flux profile model store 360. Although these stored values correspond to the optimal values of the flux profile model parameters from among the coarsely spaced "typical" values, these values will be overwritten at block 445 below if an even lower error measure on an interpolated error measure hypersurface is located.

In this embodiment, block 440 then directs the processor circuit to interpolate error measure values to generate a smoothed error hypersurface including at least the minimum calculated error measure and calculated error measures for flux model parameter values surrounding the set of flux model parameter values associated with the minimum calculated error measure.

To achieve this, in the present embodiment block 440 first directs the processor circuit to address the optimized flux profile model store 360 and to select the minimum error measure and its associated set of coarsely spaced flux profile model parameter values which were located and stored at block 435: these parameter values act as the co-ordinates $(a_0, c_0, (t_1)_0)$ of an associated initial or central error measure point $e_0$ on a multidimensional error measure hypersurface. In this embodiment, block 440 then directs the processor circuit to identify surrounding error measure points on the error hypersurface, corresponding to the error measure values associated with neighboring values of the coarsely spaced "typical" parameters associated with the minimum error measure value. If the co-ordinates associated with the minimum error measure are arbitrarily labelled as $(a_0, c_0, (t_1)_0)$, then block 440 directs the processor circuit to identify a set of 27 nearest sets of co-ordinates (a,c,$t_1$) from among the coarsely spaced values, having the closest Euclidean distances from the point $(a_0, c_0, (t_1)_0)$. Thus, these 27 nearest sets of co-ordinates represent 27 unique combinations of flux profile model parameters. In this embodiment, for each one of these 27 combinations of flux model parameter values, block 440 directs the processor circuit to locate the corresponding record in the estimated effects and error measures store 330, and to copy the unique combination of flux profile model parameters and its associated error measure value to the error measure hypersurface store 387 in the RAM 340. Thus, the error measure hypersurface is initially populated with 27 error measure values, including the minimum error measure value associated with any of the coarsely spaced "typical" flux model parameter values for which error measures were calculated at block 420, and 26 error measure values associated with neighboring flux profile model parameter co-ordinates. These 27 sets of error measure values and their associated flux profile model parameters effectively define an initial set of 27 coarsely spaced points on a four-dimensional error hypersurface, with each point having co-ordinates of the form (a,c,$t_1$,e).

In this embodiment, block 440 then directs the processor circuit 110 to interpolate further error measure values or data points on the four-dimensional error hypersurface, corresponding to finely spaced incremental values of the flux profile model parameters lying between the neighboring coarsely spaced "typical" values that correspond to the initial 27 points on the hypersurface (i.e., for further combinations of finely spaced bandwidth parameter values between $a_{-1}$ and $a_1$, scaling parameter values between $c_{-1}$ and $c_1$, and rise time parameters between $(t_1)_{-1}$ and $(t_1)_1$). More particularly, in this embodiment block 440 directs the processor circuit to apply a multi-dimensional interpolation procedure which assumes a model for the error hypersurface, such as a multi-dimensional polynomial, or multi-dimensional spline, for example. In this embodiment, the multi-dimensional interpolation procedure is selected to interpolate a sufficiently large number of finely spaced points (a,c,$t_1$,e) to result in an error hypersurface that exhibits a non-abrupt nature, i.e. is "smooth". More particularly still, in this embodiment block 440 directs the processor circuit 110 to execute a multidimensional smoothing function included within the SURFPACK™ software library available from the Sandia National Laboratories. Alternatively, other suitable interpolation and smoothing methods may be substituted. In this embodiment, block 440 directs the processor circuit to store the additional finely spaced error hypersurface points $(a,c,t_1,e)$ generated by the smoothing function in the error measure hypersurface store 387, along with the initial set of 27 coarsely spaced points discussed above.

In this embodiment, block 445 then directs the processor circuit to identify, as optimal flux profile model parameter values, a set of flux profile model parameter values associated with a minimum error measure value on the smoothed error hypersurface represented by the contents of the error measure hypersurface store 387. To achieve this, in the present embodiment, block 445 directs the processor circuit to execute a minimization function included in the MATLAB™ software available from The MathWorks, Inc., to identify the co-ordinates $(a_M, c_M, t_{1M}, e_M)$ of the minimum error measure value lying on the smoothed error hypersurface represented by the contents of the error measure hypersurface store 387. Alternatively, other suitable methods for identifying the co-ordinates of the minimum error measure on the error measure hypersurface may be substituted. (For example, if desired, rather than employ the built-in minimization function of the MATLAB™ software, block 445 may instead direct the processor circuit to use the MATLAB™ software or any suitable alternative to identify the gradient or Hessian at the central point $(a_0, c_0, (t_1)_0, e_0)$ on the error hypersurface which corresponded to the minimum error measure from among the coarsely spaced typical flux profile model parameter values, to determine a direction of decreasing error measure values e with respect to parameters $(a,c,t_1)$. The parameters may then be adjusted in the identified direction and the process may be repeated until the minimum error measure has been located.)

In this embodiment, upon identifying the co-ordinates $(a_M, c_M, t_{1M}, e_M)$ of the minimum error measure value on the error measure hypersurface, block 445 directs the processor circuit 110 to copy the co-ordinate values $a_M, c_M$ and $t_{1M}$ to the corresponding storage areas 353, 354 and 355 of the flux profile model parameters store 352, and to copy the co-ordinates $(a_M, c_M, t_{1M}, e_M)$ to the error measure store 385. Block 445 then directs the processor circuit to estimate the effects upon the workpiece of an irradiance pulse 600 including a heating portion 602 corresponding to the contents of the flux profile model store 350 and the flux profile model parameters stored in the storage areas 353, 354 and 355, in the same manner as described above at block 415. Block 445 directs the processor circuit to store the resulting estimated effects in the appropriate storage areas 373 to 380 of the estimated effects store 372. Block 445 further directs the processor circuit 110 to generate a record in the estimated effects and error measures store 330 including identifications of the co-ordinates $(a_M, c_M, t_{1M}, e_M)$ and all of the estimated effects.

In this embodiment, block 450 then directs the processor circuit 110 to compare the estimated effects for the optimized pulse shape to the thermal cycle requirements specified by the user, to determine whether the errors between the two fall within acceptable ranges. In this embodiment, the acceptable error ranges are predefined by a default difference value for each of the thermal cycle parameters. Alternatively, the default difference values may be input by the user at block 405 above; more generally, other suitable ways of defining acceptable error ranges may be substituted. In the present embodiment, block 450 directs the processor circuit 110 to compare the estimated peak device side temperature, the estimated maximum backside temperature and the estimated time-at-temperature stored in their respective storage areas 367, 368 and 369 of the optimized flux profile model store 360, to the peak temperature, maximum backside temperature and time-at-temperature values stored in the storage areas 343, 345 and 344 of the thermal cycle parameters store 342, and to determine whether the error between each requirement and the corresponding estimated effect falls within the error range deemed acceptable for that particular requirement.

In this embodiment, if it is determined at block 450 that any one of the errors between the estimated effects and the thermal cycle parameters falls outside the acceptable error range for the requirement in question, block 465 directs the processor circuit 110 to determine whether the flux profile models store 326 in the storage medium 320 contains an identification of a different flux profile model for which estimated effects and error measures have not yet been determined. If so, block 470 directs the processor circuit to select a new flux profile model and an initial set of "typical" flux profile model parameters for the new flux profile model, in the same manner as described above at block 410. The processor circuit is then directed back to block 415, to execute blocks 415 to 450 for the new flux profile model.

Conversely, if at block 465 it is determined that no other available flux profile models exist, block 475 directs the processor circuit 110 to alert the user that the pulse shape optimization routine 322 was unable to identify parameters for any available flux profile model to satisfy the specified requirements. Preferably, block 475 also directs the processor circuit to inform the user of the estimated effects, particularly whichever estimated effect(s) fell outside the acceptable error range. If desired, block 475 may prompt the user to try again, by specifying a new flux profile model at block 410 or by inputting different thermal cycle parameters at block 405 (in the event that the initially specified thermal cycle parameters may not be physically realizable with the selected flux profile model).

If at block 450 it is determined that all of the errors fall within acceptable ranges, then it is concluded that the pulse shape optimization routine 322 has successfully optimized the set of flux profile model parameters a, c and $t_1$ to satisfy the thermal cycle requirements within the acceptable error ranges, while at the same time minimizing frequency domain energy spectral densities of the flux profile model at the resonant frequencies of the wafer 120. This will serve to minimize vibration of the wafer 120 at the resonant frequencies when the wafer 120 is exposed to the irradiance pulse 600 whose heating portion 602 is modeled by the optimized flux profile model parameters. In such a case, block 455 directs the processor circuit 110 to copy the co-ordinates $(a_M, c_M, t_{1M}, e_M)$ of the minimum error value on the error measure hypersurface to their corresponding storage areas 363, 364, 365 and 362 in the optimal flux profile model store 360. Block 455 further directs the processor circuit 110 to copy the associated estimated effects, including at least the peak device side temperature, peak backside temperature, time-at-temperature and temperature evolution, from the storage areas 373, 374, 377 and 380 in the estimated effects store 372, to the corresponding storage areas 367, 368, 369 and 361 of the optimized flux profile model store 360. In this embodiment, block 455 further directs the processor circuit 110 to create a record in the optimal flux profile model store 334, including the contents of the thermal cycle parameters store 340, the workpiece properties store 310, the flux profile model store 350 and the optimized flux profile model store 360. Thus, in future executions of the pulse shape optimization routine 322, an additional block of codes (not shown) may be provided immediately after block 410, to determine whether the optimal flux profile model store 334 already contains a record with thermal cycle parameters, workpiece material properties and a flux profile model which are all identical to those specified by the user at blocks 405 and 410; if so, the processor circuit may be directed to simply copy the optimized flux profile model parameters from the previously stored record rather than executing blocks 415 to 475.

Thus, following execution of block 455, the processor circuit 110 has effectively determined an optimal shape of the irradiance pulse 600. The shape of the heating portion 602 is determined by the flux profile model and the optimized flux profile model parameters. The shape of the sustaining portion 604 is effectively determined by the set of estimated temperature values $\hat{T}(z,t)$ stored in the temperature estimates storage area 361: for example, in the alternative embodiment discussed further below in which real-time closed-loop feedback control of the irradiance pulse is employed, the temperature estimate values $\hat{T}(z=0,t)$ for the device side for times $(t_1+L) < t \le (t_2+L)$ corresponding to the sustaining portion may be compared to real-time device side temperature measurements during this interval, and in the event of any deviation greater than a permissible threshold, the current being supplied to the flash lamp to generate the sustaining portion may be either increased or decreased to reduce the magnitude of the deviation.

Thus, the temperature estimate values $\hat{T}(z=0,t)$ effectively determine the shape of the sustaining portion without having to directly calculate the irradiance flux of the sustaining portion. Indeed, similar reasoning applies to the heating portion 602 of the irradiance pulse 600: once the desired device side temperature estimates $\hat{T}(z=0,t)$ have been determined for times $0 \le t \le (t_1+L)$, these estimates effectively determine the shape of the heating portion 602: the current being supplied to the flash lamp to generate the heating portion may be continuously adjusted with each real-time device side temperature measurement, to reduce any deviation between the estimated and measured device side temperatures. Thus, the determination of the temperature estimates $\hat{T}(z,t)$ that would result from the optimized irradiance pulse 600 provides a useful and industrially applicable result, without the need to calculate any actual irradiance flux values.

However, for embodiments in which real-time closed-loop feedback control during the flash is not employed, it may be desirable to express the shape of the sustaining portion 604 in terms of irradiance flux rather than the resulting temperatures. Likewise, for some embodiments it may be desirable to express the shape of the heating portion 602 in terms of an irradiance flux time sequence of data rather than as a flux profile model and a set of optimized flux profile model parameters. Accordingly, in such an embodiment, block 460 directs the processor circuit 110 to use the flux profile model equation stored in the flux profile model store 350 and the optimized flux profile model parameters stored in the registers 363, 364 and 365 to generate a time series of flux values Q(t) for the heating portion 602 of the irradiance pulse 600, and to store these flux values in the fields of the optimized flux time sequence storage area 370 corresponding to times $t_0 \le t < t_1$. In this embodiment, block 460 then directs the processor circuit 110 to use the temperature estimates $\hat{T}(z,t)$ stored in the temperature estimates storage area 361 of the optimized flux profile model 360, to generate a time series of flux values Q(t) for the time interval $t_1 \le t < t_2$ corresponding to the sustaining portion 604. To achieve this, block 460 directs the processor circuit to generate the time series for the sustaining portion as:

$$Q(t) \approx \frac{k(T_M(t))(\hat{T}(z_1, t) - \hat{T}(z_0, t))}{z_1 - z_0} \quad (20)$$

wherein:
- $z_0=0$ is the location of the device side of the wafer;
- $z_1$ is the distance of the first discrete step down from the device side used in solving the differential equation (6) at block 415 above;
- $T_M(t)$ is the mean of all temperature estimates $\hat{T}(z,t)$ at time t for all thickness values $z=z_0$ to $z=z_B$ through the thickness of the wafer; and $k(T_M(t))$ is the heat capacity of the wafer 120 at temperature $T_M(t)$.

In this embodiment, block 460 directs the processor circuit 110 to store these flux values Q(t) for the time interval $t_1 \le t < t_2$ corresponding to the sustaining portion 604 in the optimized flux time sequence store 370. Block 460 also directs the processor circuit to store zero flux values Q(t)=0 for times $t_2 \le t < t_x$ during which the wafer 120 is not irradiated. Thus, following execution of block 460, the optimized flux time sequence storage area 370 contains a complete numeric representation of the irradiance pulse 600, including both the heating portion 602 and the sustaining portion 604. Accordingly, in this embodiment the results of the optimization process have been expressed in two different forms, $\hat{T}(z,t)$ and Q(t), either one of which may be useful and industrially applicable by itself. If desired, block 460 may further direct the processor circuit 110 to determine of the electric current values i(t) that will be required for a particular irradiance system to generate the optimized flux values Q(t), as discussed in greater detail below at block 510 of the heat treating routine.

In this embodiment, the pulse shape optimization routine is then ended.

Heat-Treating Routine

Figure 5:
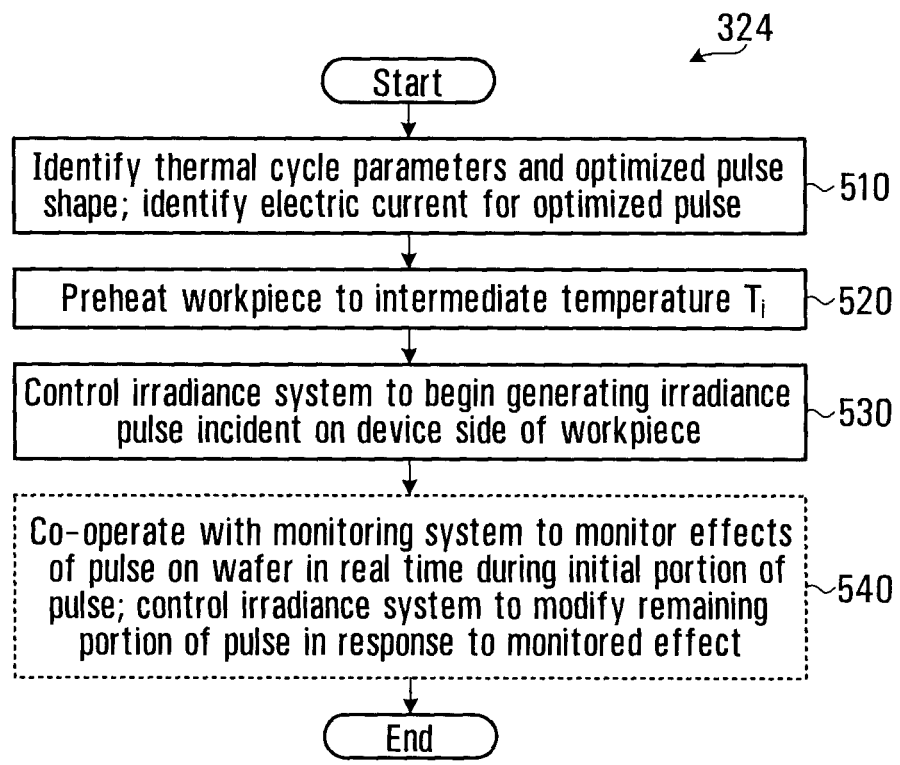
FIG. 5 is a flowchart of a heat-treating routine including the generation of an irradiance pulse according to the first embodiment.

Referring to FIGS. 1, 2, 3, 5 and 6, the heat-treating routine is shown generally at 324 in FIG. 5. In this embodiment, the same apparatus 100 that determines the optimal pulse shape as described above in connection with the pulse shape optimization routine 322, also generates the irradiance pulse 600 incident on the wafer 120 under the direction of the heat-treating routine 324. Alternatively, however, the irradiance pulse 600 may be generated by a different apparatus. As a further alternative, other embodiments may determine the optimal shape of the irradiance pulse 600 as described above without generating the pulse itself. Such embodiments may have utility and industrial applicability for a variety of purposes: for example, such embodiments may be used for simulations to test the effects of pulse shapes without sacrificing expensive wafers, or as a further example, such embodiments may be used by a provider of scientific or engineering consultancy services to determine and sell optimized pulse shapes to users of heat-treating apparatus to satisfy the users' specified thermal cycle requirements.

In this embodiment, the apparatus 100 includes an irradiance system in communication with the processor circuit 110, namely, the topside irradiance system 180 and the backside irradiance system 150. In the present embodiment, the topside irradiance system 180 includes at least one arc lamp and a power supply including a current amplifier having negligible noise at resonant frequencies of the workpiece, and the processor circuit is configured to control the current amplifier to supply an electrical pulse to the arc lamp to generate the irradiance pulse. More particularly, in this embodiment the at least one arc lamp includes the flash lamp 183, the power supply includes the topside heating power supply system 191, and the current amplifier includes the high-speed power amplifier 294. The high-speed power amplifier 294 is selected to have negligible noise at the resonant frequencies of the workpiece, which in this embodiment include circular vibration mode frequencies of approximately 113 Hz (mode (0,1)), 476 Hz (mode (0,2)), and 1080 Hz (mode (0,3)), as well as a diameter mode frequency of approximately 60 Hz (mode (2,0)), when the wafer is at room temperature. In this embodiment, the processor circuit 110 is configured to control the current amplifier, or more particularly the high-speed power amplifier 294, to generate the irradiance pulse incident on the device side 122 of the wafer 120.

In this embodiment, the heat-treating routine 324 begins with a first block of codes 510, which directs the processor circuit 110 to identify the thermal cycle parameters defining the requirements of the thermal cycle, and to identify the optimized pulse shape intended to satisfy those requirements. In this embodiment, the thermal cycle parameters have already been stored in the thermal cycle parameters store 342, a time sequence representation Q(t) of the optimized irradiance pulse shape has already been stored in the optimized flux time sequence storage area 370, and the estimated temporal temperature evolution of the wafer $\hat{T}(z,t)$ has been stored in the temperature estimates storage area 361, as discussed above in connection with the pulse shape optimization routine 322. Alternatively, if such values have not already been calculated and stored, block 510 may direct the processor circuit 110 to execute the pulse shape optimization routine 322 as a subroutine.

In this embodiment block 510 further directs the processor circuit 110 to convert the time sequence representation Q(t) of the optimized irradiance pulse shape into electrical current values i(t) for controlling the electrical current which is to be supplied to the topside irradiance system 180 to generate the optimized irradiance pulse. For ease of illustration, the following assumes that only a single flash lamp 183 and its power supply system 191 are used to generate the irradiance pulse 600, although the same approach may be applied to two or more of the flash lamps 182, 183, 185 and 187 to generate the irradiance pulse if desired. In this embodiment, block 510 directs the processor circuit 110 to convert the optimized flux values Q(t) into electrical current values i(t) as follows:

$$i(t) \approx \frac{Q(t) A_W}{V_L(i(t)) \varepsilon_{TW}} \quad (21)$$

wherein:
 $V_L(i(t))$ is the measured or estimated non-linear voltage relationship of the flash lamp for a given lamp current;
 $\varepsilon_{TW}$ is the power coupling efficiency between the flash lamp and the wafer; and
 $A_W$ is the area of the wafer.

In this embodiment, block 510 directs the processor circuit 110 to numerically solve the above non-linear equation for i(t), using a numerical solution method provided in MAT-LAB, or alternatively, any other suitable numerical solution method. Block 510 directs the processor circuit to store the resulting electric current values i(t) in the optimized current storage area 371 in the RAM 340.

In this embodiment, block 520 then directs the processor circuit 110 to control the backside irradiance system 150 to begin irradiating the substrate side 124 of the wafer 120, to preheat the substrate side 124 to the intermediate temperature $T_i$ stored in the intermediate temperature storage area 346 in the thermal cycle parameters store 342. In this embodiment, the pre-heating occurs at a rate which is slow compared to the thermal time constant of the wafer 120, such as a rate of about 50 to 400° C./sec, for example. In this embodiment, block 520 directs the processor circuit 110 to monitor temperature measurement signals received from the backside temperature measurement system 236, thereby monitoring the temperature of the substrate side 124 in real time during the thermal cycle. Alternatively, if desired, the backside temperature measurement system 236 may be omitted and the processor circuit may control the backside irradiance system to preheat the wafer based on predicted rather than measured temperatures.

In this embodiment, the pre-heating stage is discontinued and the irradiance pulse is commenced immediately upon arrival of the substrate side 124 of the wafer at the intermediate temperature $T_i$. Alternatively, however, in other embodiments, different pre-heating temperature-time profiles may be substituted: to name but one example, some embodiments may involve a pre-heating stage which holds the wafer 120 at constant intermediate temperature $T_i$ for a time period preceding commencement of the irradiance pulse. In this embodiment, immediately upon completion of the pre-heating stage, block 530 directs the processor circuit 110 to control the backside irradiance system 150 to discontinue irradiance of the substrate side 124 of the wafer 120, and further directs the processor circuit to control the topside irradiance system 180 to begin generating the irradiance pulse 600 incident on the device side 122 of the wafer 120. More particularly, in this embodiment, block 530 directs the processor circuit 110 to control the current amplifier, or more particularly the high-speed power amplifier 294, to cause electrical energy stored in the transient energy power system 292 to be discharged through the flash lamp 183 in a controlled manner, to generate the irradiance pulse 600 according to the flux values Q(t) for both the heating portion 602 and the sustaining portion 604 of the irradiance pulse 600. More particularly still, in this embodiment block 530 directs the processor circuit to control the high-speed power amplifier 294 to cause it to supply electric current to the flash lamp 183 in accordance with the optimized electric current values i(t) which were stored in the optimized current storage area 371 at block 510 above. In this embodiment, although the use of a single flash lamp 183 is described for ease of illustration, alternatively, two, three or all four of the flash lamps 182, 183, 185 and 187 may be discharged simultaneously if desired, or may be discharged in a sequential temporally overlapping fashion as described below in relation to an alternative embodiment. More generally, other suitable ways of generating the irradiance pulse 600 may be substituted.

In this embodiment, the heat-treating routine continues at block 530 until the entire irradiance pulse 600 has been generated, and the heat-treating routine 324 is then ended. Alternatively, however, if desired, real-time closed-loop feedback control of the irradiance pulse 600 may be provided, as discussed below under the heading, "Alternatives". In some such embodiments, instead of using flux values Q(t) to generate the sustaining portion 604 of the irradiance pulse, real-time feedback control may be used during the sustaining portion 604 to sustain the temperature of the device side at the peak temperature achieved by the heating portion 602.

Simulated Example

Referring to FIGS. 8, 9, 10 and 11, finite element modeling has been used to demonstrate the effectiveness of an illustrative embodiment in reducing vibration of the wafer 120 when exposed to an irradiance pulse.

Figure 8:
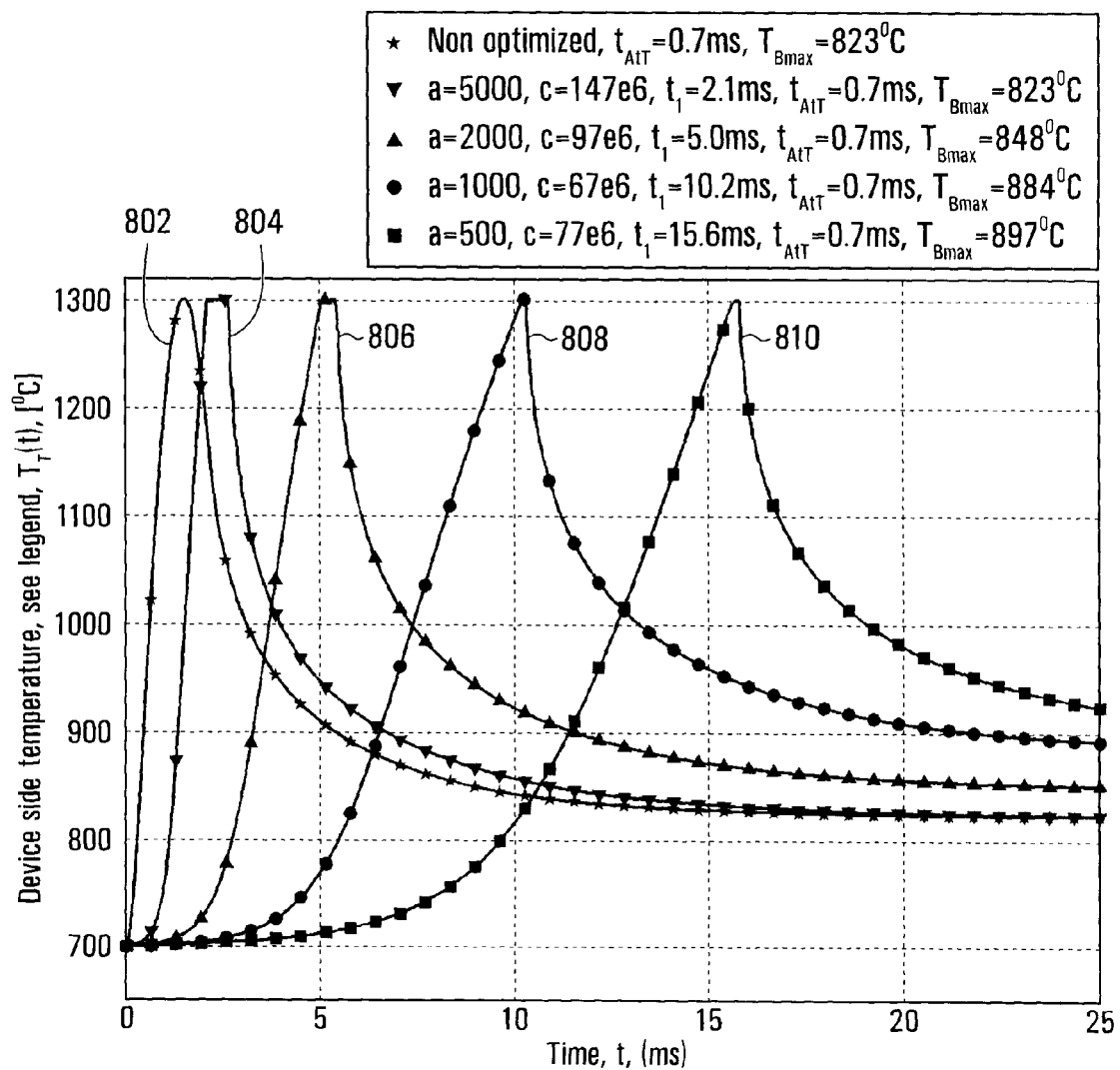
FIG. 8 shows five simulated temperature curves in the time domain of a surface of a semiconductor wafer being exposed to a conventional irradiance pulse and to four modified irradiance pulses.

FIG. 8 shows five device-side temperature curves, representing the temperature of the device side 122 when exposed to five different irradiance pulses. More particularly, FIG. 8 shows the following temperature profiles: a conventional temperature curve 802 resulting from application of a conventional non-optimized pulse to the device side 122; a first modified temperature curve 804 resulting from application of a first modified pulse; a second modified temperature curve 806 resulting from application of a second modified pulse; a third modified temperature curve 808 resulting from application of a third modified pulse; and a fourth modified temperature curve 810 resulting from application of a fourth modified pulse.

In this example, three of four user-specified thermal cycle parameters are identical for all five of the temperature curves shown in FIG. 8: all five temperature curves are designed to heat the device side 122 from an intermediate temperature of $T_i=700°$ C. to a peak device-side temperature of $T_P=1300°$ C., and to sustain the device side within 50° C. of the peak temperature for a time-at-temperature interval of $t_{atT}=0.7$ ms. However, the maximum bottom side temperature thermal cycle parameter $T_{BMAX}$ has the same user-specified value of $T_{BMAX}=823°$ C. only for the conventional temperature curve 802 and the first modified temperature curve 804; the value of the thermal cycle parameter $T_{BMAX}$ has been varied for the second, third, and fourth modified temperature curves 806, 808 and 810, respectively. More particularly, in this example, the conventional temperature curve 802 corresponds to a conventional irradiance pulse in which a capacitor pair is discharged through a 30 µH inductor. The first, second, third, fourth modified temperature curves 804, 806, 808, and 810 correspond to modified irradiance pulses whose heating portions 602 are modeled by equation (5) above. The first modified pulse corresponding to the first modified temperature curve 804 reflects a reduction in the energy spectral densities of the flux profile model at the resonant frequencies of the wafer, obtained by optimizing the flux profile model parameters a, c and $t_1$ for the same specified thermal cycle parameters $T_i=700°$ C., $T_P=1300°$ C., $t_{atT}=0.7$ ms and $T_{BMAX}=823°$ C., in the manner described above in connection with the pulse shape optimization routine 322. The second, third and fourth modified pulses corresponding to temperature curves 806, 808 and 810 reflect further reductions in the energy spectral densities of the flux profile model at the resonant frequencies of the wafer, obtained by successively increasing the value of the maximum backside temperature parameter $T_{BMAX}$ to 848° C., 884° C., and 897° C., respectively, with the other thermal cycle parameters unchanged, and optimizing the flux profile model parameters a, c and $t_1$ for each respective set of thermal cycle parameters in the manner described above in connection with the pulse shape optimization routine 322.

Figure 9:
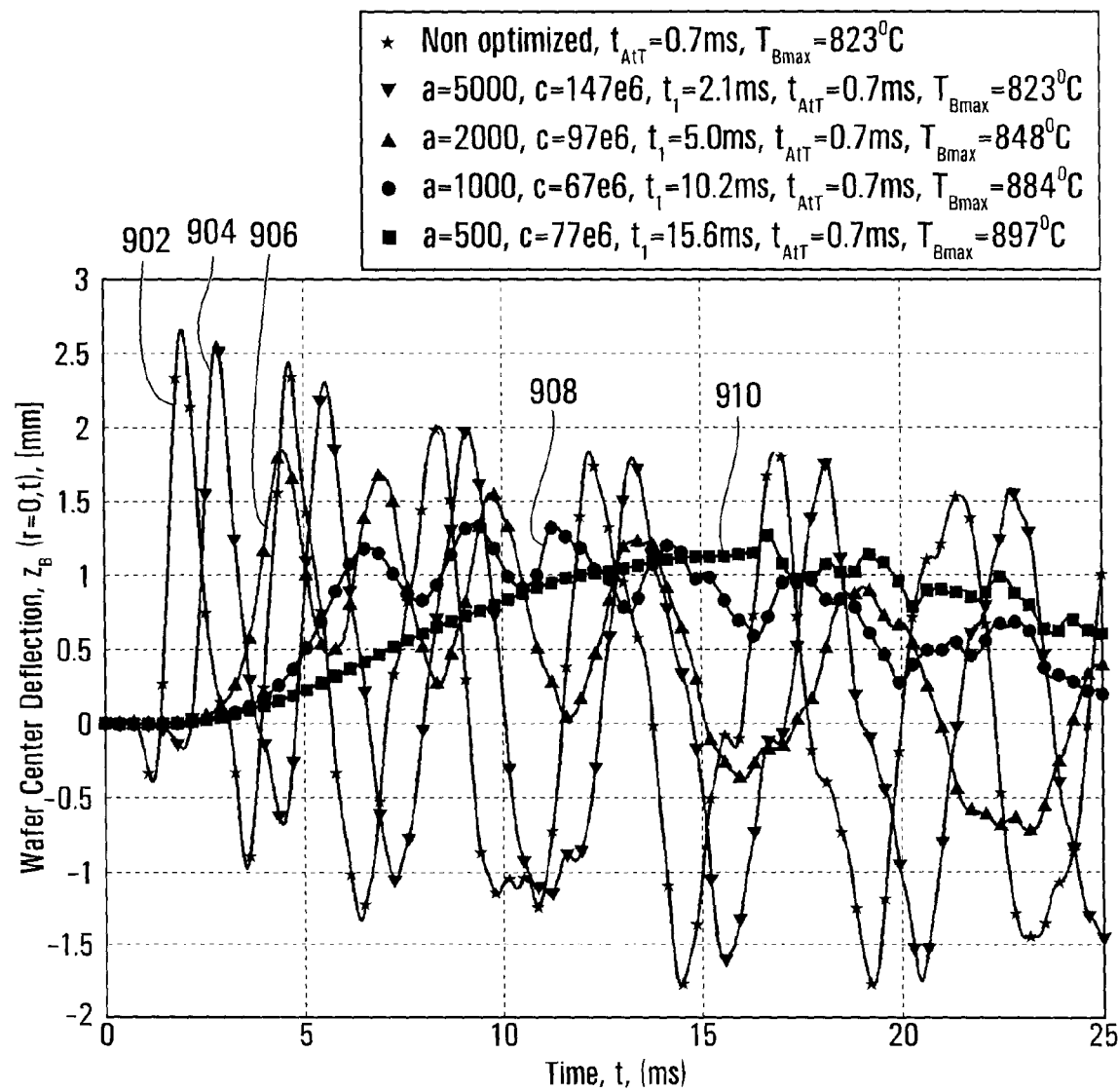
FIG. 9 shows five simulated graphical representations in the time domain of vibrational motion of a center of a semiconductor wafer when experiencing the five respective temperature curves shown in FIG. 8.
Figure 10:
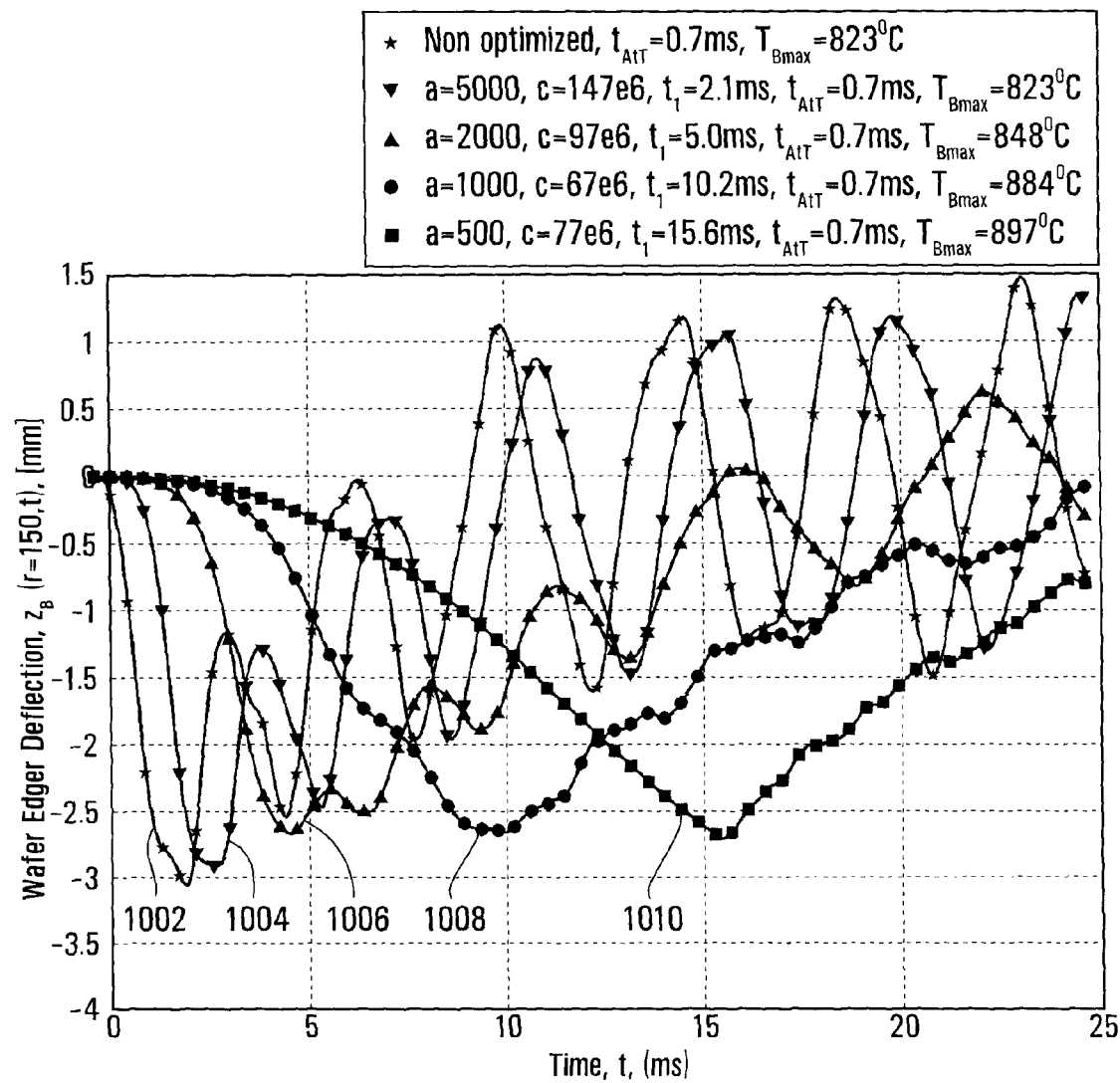
FIG. 10 shows five simulated graphical representations in the time domain of vibrational motion of an outer perimeter of a semiconductor wafer when experiencing the five respective temperature curves shown in FIG. 8.
Figure 11:
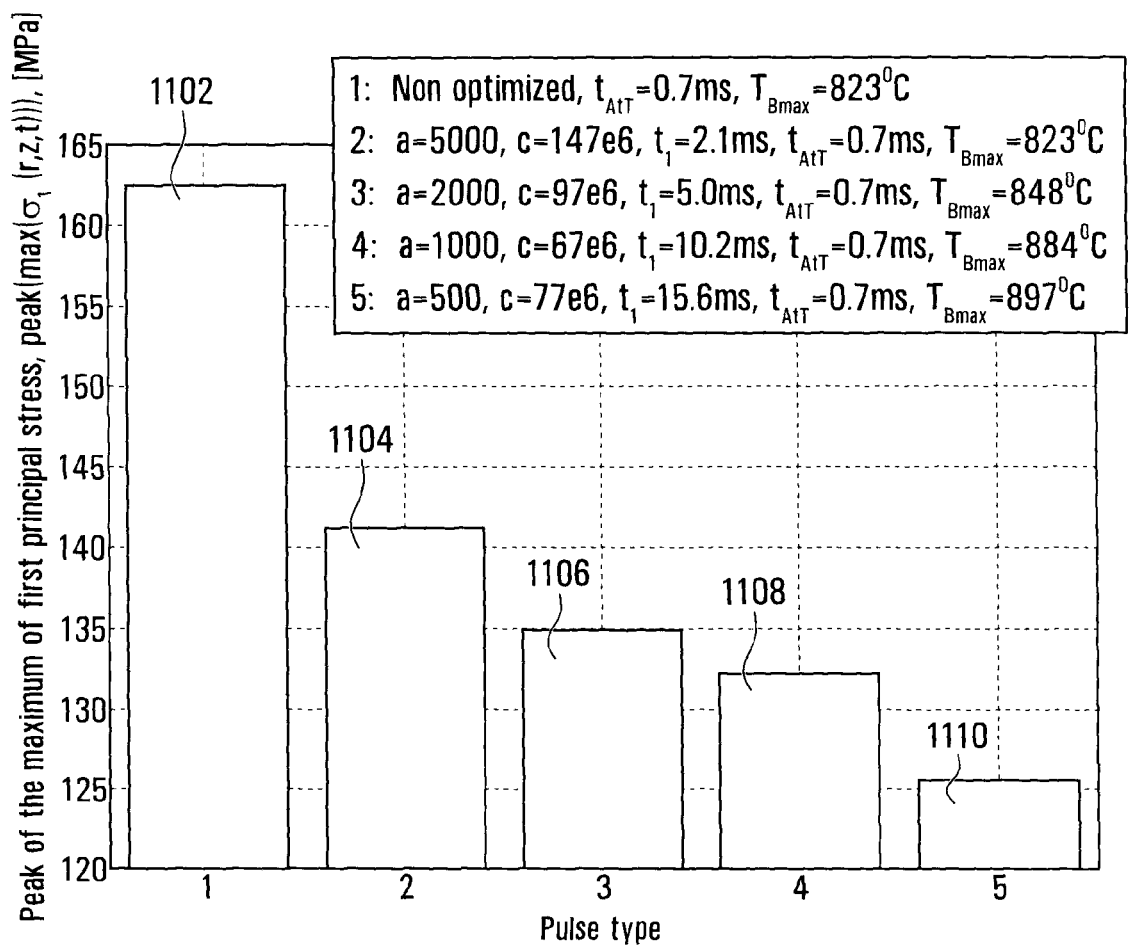
FIG. 11 shows five simulated graphical representations of peak stress in a semiconductor wafer when experiencing the five respective temperature curves shown in FIG. 8.

Thus, in this example, a comparison of the wafer deflection and peak stress values shown in FIGS. 9-11 associated with the conventional temperature curve 802 to those associated with the first modified temperature curve 804, illustrates reductions in wafer motion and stress obtained by optimizing the flux profile model parameters for a fixed set of thermal cycle parameters including a relatively low value of the parameter $T_{BMAX}$. Further comparisons to the wafer deflection and peak stress values shown in FIGS. 9-11 associated with the second, third and fourth modified temperature curves 806, 808 and 810 illustrate further reductions in wafer motion and stress that can be achieved by increasing the value of the parameter $T_{BMAX}$ prior to optimization of the flux profile model parameters.

FIG. 9 illustrates the thermally induced motion of the center of the wafer 120 when experiencing the temperature curves shown in FIG. 8. A conventional center motion curve 902 illustrates motion of the center of the wafer when exposed to the conventional pulse that results in the conventional temperature curve 802; a first modified center motion curve 904 illustrates the motion of the center of the wafer when exposed to the first modified pulse that results in the first modified temperature curve 804; a second modified center motion curve 906 illustrates the motion of the center of the wafer when exposed to the second modified pulse that results in the second modified temperature curve 806; a third modified center motion curve 908 illustrates the motion of the center of the wafer when exposed to the third modified pulse that results in the third modified temperature curve 808, and a fourth modified center motion curve 910 illustrates the motion of the center of the wafer when exposed to the fourth modified pulse that results in the fourth modified temperature curve 810.

In the conventional center motion curve 902, the wafer can be seen strongly vibrating at the (0,2) vibrational mode, which at an elevated bulk temperature of about 700° C. has a frequency of about 400 Hz that corresponds to a period of about 2.5 ms. Vibration at this same frequency can be seen at reduced amplitude in the first modified center motion curve 904, at further reduced amplitude in the second modified center motion curve 906, and at even further reduced amplitude in the third modified center motion curve 908. In the fourth modified center motion curve 910, the amplitude of vibration at this frequency has been almost eliminated and is not readily apparent from a visual inspection of FIG. 9. Overall, in comparison to the conventional center motion curve 902, it can be seen that the amplitude and velocity of the motion of the center of the wafer are appreciably reduced in the first modified center motion curve 904, and are greatly reduced in the fourth modified center motion curve 910.

Similarly, FIG. 10 illustrates the thermally induced motion of the outer perimeter or edge of the wafer 120 when exposed to the irradiance pulses shown in FIG. 8. A conventional edge motion curve 1002 illustrates motion of the edge of the wafer when exposed to the conventional pulse that results in the conventional temperature curve 802; a first modified edge motion curve 1004 illustrates the motion of the edge of the wafer when exposed to the first modified pulse that results in the first modified temperature curve 804; a second modified edge motion curve 1006 illustrates the motion of the edge of the wafer when exposed to the second modified pulse that results in the second modified temperature curve 806; a third modified edge motion curve 1008 illustrates the motion of the edge of the wafer when exposed to the third modified pulse that results in the third modified temperature curve 808; and a fourth modified edge motion curve 1010 illustrates the motion of the edge of the wafer when exposed to the fourth modified pulse that results in the fourth modified temperature curve 810.

In comparison to the conventional edge motion curve 1002, the amplitude and velocity of the motion of the edge of the wafer are appreciably reduced in the first modified edge motion curve 1004, and are greatly reduced in the fourth modified edge motion curve 1010 with a notable reduction in higher-frequency vibrations.

FIG. 11 illustrates the peak maximum principal stress in the wafer 120 when exposed to the irradiance pulses corresponding to the device side temperature curves shown in FIG. 8. A conventional stress level 1102 results from exposure of the device side 122 to the conventional irradiance pulse which produces the conventional temperature curve 802; a first modified stress level 1104 results from exposure to the first modified pulse which produces the first modified temperature curve 804; a second modified stress level 1106 results from exposure to the second modified pulse which produces the second modified temperature curve 806; a third modified stress level 1108 results from exposure to the third modified pulse which produces the third modified temperature curve 808; and a fourth modified stress level 1110 results from exposure to the fourth modified pulse which produces the fourth modified temperature curve 810. In this example, in comparison to the conventional stress level 1102, the first modified stress level 1104 is significantly lowered, and the fourth modified stress level 1110 is greatly lowered.

Thus, comparisons of the first modified center motion curve 904, the first modified edge motion curve 1004, and the first modified stress level 1104, to the conventional center motion curve 902, the conventional edge motion curve 1002, and the conventional stress level 1102, respectively, illustrate that for a given fixed set of thermal cycle parameters, reductions in wafer stress and vibration are obtained by replacing a conventional irradiance pulse shape with an optimized irradiance pulse shape determined by the pulse shape optimization routine 322 in the manner described above. Further comparisons of the conventional motion curves and conventional stress level to the motion curves and stress levels associated with the second, third and fourth modified irradiance pulses used to produce the second, third and fourth modified temperature curves 806, 808 and 810, respectively, illustrate that further reductions in wafer stress and vibration are obtained by increasing the thermal cycle parameter $T_{BMAX}$ and using the pulse shape optimization routine to determine an optimal pulse shape for the revised set of thermal cycle parameters in the manner described above.

Figure 12:
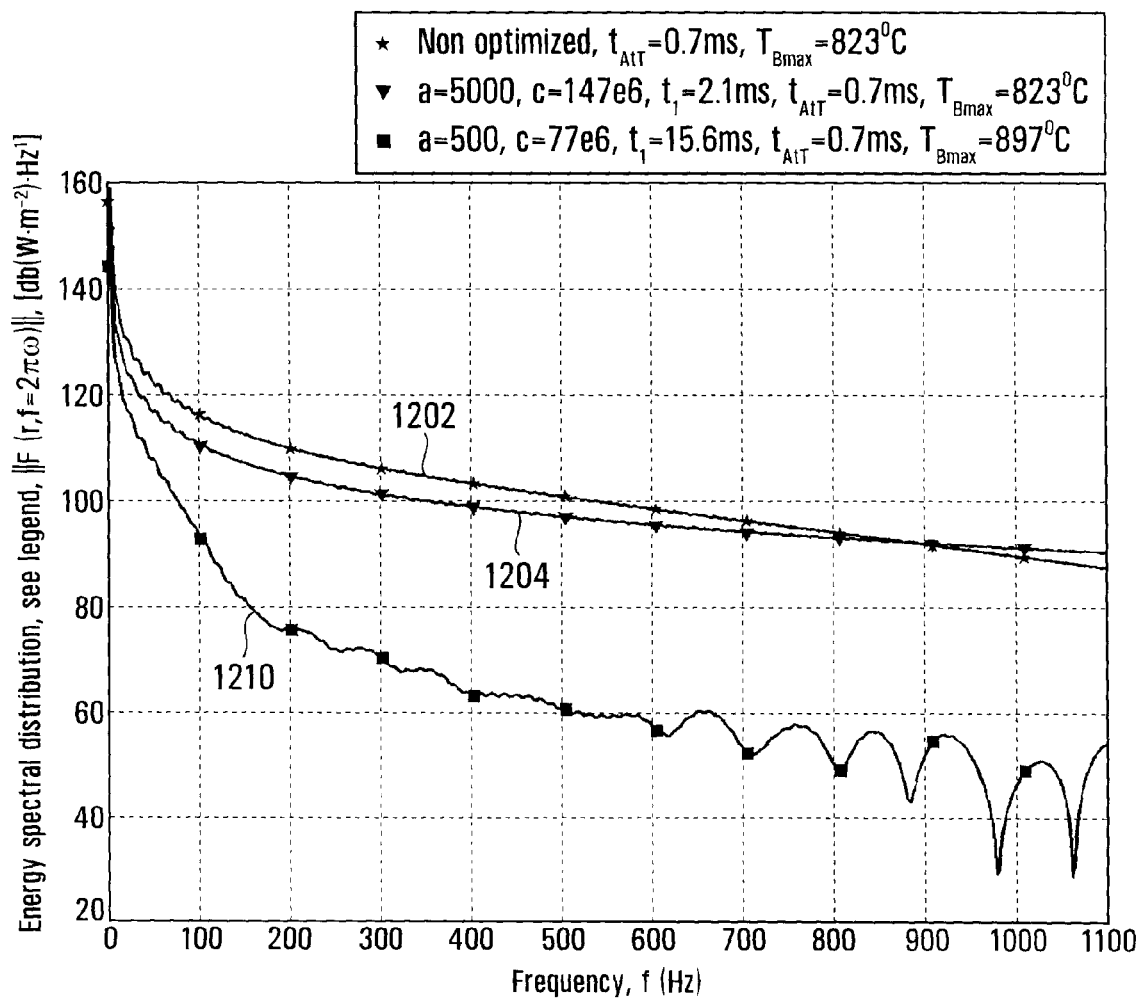
FIG. 12 shows the energy spectral densities in the frequency domain of a conventional irradiance pulse and of two modified irradiance pulses, corresponding to three of the temperature curves shown in FIG. 8.

FIG. 12 illustrates the energy spectral densities in the frequency domain of a conventional irradiance pulse and of an optimized irradiance pulse. A conventional energy spectral density curve 1202 illustrates the energy spectral density, as a function of frequency, of the conventional irradiance pulse used to produce the conventional device side temperature curve 802. A modified energy spectral density curve 1204 illustrates the energy spectral density, as a function of frequency, of the first modified irradiance pulse used to produce the first modified temperature curve 804. Another modified energy spectral density curve 1210 illustrates the energy spectral density, as a function of frequency, of the fourth modified irradiance pulse used to produce the fourth modified temperature curve 810. A comparison of the modified energy spectral density curve 1204 to the conventional energy spectral density curve 1202 shows that the first modified pulse has lower energy spectral densities than the conventional pulse over a broad range of frequencies, including at least the frequencies of the fundamental and second circular vibration modes (modes (0,1) and (0,2)) of the wafer 120 mentioned above. Thus, for a given fixed set of thermal cycle parameters, excitation of the wafer's vibration modes can be reduced by substituting an optimized pulse for a conventional pulse. Similarly, a comparison of the curves 1202 and 1210 shows that the fourth modified pulse has even lower energy spectral densities than the conventional pulse over a broad range of frequencies including all of the specific vibration modes mentioned above, illustrating that further reductions in excitation of the wafer's vibration modes can be achieved by increasing the thermal cycle parameter $T_{BMAX}$.

Alternatives:

Referring back to FIGS. 3 and 4, in alternative embodiments, blocks 415 to 425 may be modified by relying upon pre-calculated estimated effect values rather than calculating the estimated effects that the irradiance pulse will have upon the workpiece. In one such embodiment, the estimated effects and error measures store 330 is pre-populated with a plurality of sets of estimated effects for each predefined flux profile model. More particularly, in this embodiment, for each predefined flux profile model (such as equation (5) for example), the estimated effects and error measures store 330 stores a set of estimated effects and error measures for each one of a plurality of permissible combinations of flux profile model parameters a, c and $t_1$, thermal cycle parameters $T_P$, $t_{atT}$, $T_{BMAX}$ and $T_i$, and wafer properties k(T), $c_P$(T), $\rho$ and $z_B$ In one variation of such an embodiment, such estimated effects and error measures are stored only for the same coarsely spaced values of the flux profile model parameters as discussed above at block 415 rather than for all permissible values, in which case the pulse shape optimization routine 322 may be modified by replacing blocks 415 and 420 with a simple search for the estimated effects and error measure values for each currently addressed combination of flux profile model parameters, from among the pre-calculated records corresponding to the specified thermal cycle parameters and wafer properties. In another variation of such an embodiment, estimated effects and error measures may be pre-calculated and stored for all permissible incremental values of the flux profile model parameter values, including the finely spaced values for which estimated effects and error measure values were interpolated rather than calculated at block 440, in which case the pulse shape optimization routine may be further modified by replacing blocks 435, 440 and 445 with a simple search for the record containing the lowest error measure value from among the records corresponding to the specified thermal cycle parameter values and wafer properties.

Alternatively, pre-calculated values may be used in other ways, and the pulse shape optimization routine may be modified to include different manners of user interaction. In one such alternative embodiment, typical flux model parameter values and typical values of the time-at-temperature thermal cycle parameter $t_{AtT}$ are used to pre-calculate estimated effects of typical pulses for a given wafer type. The flux model parameters (e.g., (a,c,$t_1$)) are used to provide the temperature solution for the heating portion (time $t_0$ to $t_1$) and the $t_{AtT}$ values are used to provide the temperature solution for the sustaining portion and for the interval thereafter when the flash lamp is turned off. For example, using the flux model described by equation (5), the typical values of $t_1$ may include the values {1, 2, 5, 10, 20} ms, typical values of the bandwidth parameter a may include {250, 500, 1000, 2000, 5000}/sec, typical values of the scaling parameter c may include {80, 100, 120, 150, 180}×10$^6$ W/m$^2$, and typical values of the time-at-temperature parameter $t_{AtT}$ may include {1, 2, 3, 5, 10} ms. For each of the 625 combinations of these values, the complete solution of estimated effects T(z,t) is determined and all the estimated effect parameters shown in FIG. 7 are stored. When the user specifies the requirements for the thermal cycle parameters, an error measure is calculated for each of the 625 combinations of parameters. One of the user specified requirements is $t_{AtT}$, so the error values for model parameters nearest the user-specified $t_{AtT}$ value can be determined rapidly, and the lowest such error value and its associated parameter values are presented to the user. If this presented error value is acceptable, then the presented flux profile model parameter values may be identified as sufficiently optimized, and the optimization process may be ended. Alternatively, if the presented error value is not accepted by the user but is close to being acceptable, then the user may direct the system to use the actual user-specified value of $t_{AtT}$ to search for a set of values for the flux model parameters that provide an acceptable error value, which would correspond to a near optimal set of model parameter values. Such a search may be carried out in a manner similar to that described above in connection with the pulse shape optimization routine. The user may also decide to change the thermal cycle requirements, in which case a possible new set of values of model parameters and error measure will be rapidly presented.

Referring back to FIGS. 1, 2, 3, 4 and 5, in an alternative embodiment, the heat-treating routine 324 shown in FIG. 5 includes real-time closed-loop feedback control of the irradiance pulse 600. To achieve this, in the present embodiment, the apparatus 100 further includes the monitoring system 230 in communication with the processor circuit 110, and the processor circuit is configured to cooperate with the monitoring system to monitor an effect of the irradiance pulse 600 on the wafer 120 in real time during the irradiance pulse 600, and to control the irradiance system to modify the irradiance pulse in response to the monitored effect.

In this embodiment the monitoring system 230 includes two monitoring systems, namely, a temperature measurement system configured to measure a surface temperature of the wafer 120 during the irradiance pulse, and a wafer deformation system configured to monitor deformation of the wafer during the irradiance pulse. More particularly, in this embodiment the temperature measurement system includes the topside temperature measurement system 234, and the wafer deformation system includes the wafer motion measurement system 232.

More particularly still, in this embodiment the topside temperature measurement system 234 includes the ultrafast radiometer 102, identical to that disclosed in the incorporated U.S. Pat. No. 7,445,382, configured to produce real-time temperature measurements of the device side 122 of the wafer 120 during the irradiance pulse 600 at a sampling rate of 100 kHz, so that the device side temperature is measured once every ten microseconds. (In this embodiment the backside temperature measurement system 236 also continues to measure the temperature of the substrate side 124 of the wafer, before, during and after the irradiance pulse 600. In the present embodiment, as backside temperature measurements are not used for real-time feedback control of the irradiance pulse 600, the backside temperature measurement system measures the substrate side temperature at a slower sampling rate of 1 kHz.)

In this embodiment, block 530 of the heat-treating routine 324 is modified, by omitting any use of irradiance flux values or electrical current values to generate the sustaining portion 604 of the irradiance pulse 600. Rather, in this embodiment, the heating portion 602 is generated in the same manner as described above in connection with the first embodiment, but the sustaining portion 604 is generated solely by closed-loop feedback control of the electric current being supplied to the topside flash lamp to sustain the device side temperature at the estimated device-side temperature $\hat{T}_Z(t)$ for the duration of the sustaining portion, as discussed below.

In this embodiment, the heat-treating routine 324 shown in FIG. 5 is further modified to include an additional block 540 of codes. Immediately following commencement of the irradiance pulse at block 530, block 540 directs the processor circuit 110 to cooperate with the topside temperature measurement system 234 to monitor the actual temperature effects of the irradiance pulse 600 on the wafer 120 in real time, including device-side temperatures $T_Z(t)$ measured at ten-microsecond intervals, during the pulse 600. Block 540 directs the processor circuit 110 to compare this measured device-side temperature trajectory $T_Z(t)$ with the estimated device-side temperature trajectory $\hat{T}_Z(t)=\hat{T}(z=0,t)$ stored in the temperature estimates storage area 361 for the optimized irradiance pulse 600, and to determine whether the measured temperature trajectory deviates from the estimated temperature trajectory by more than a threshold amount. If so, block 540 directs the processor circuit 110 to control the topside irradiance system 180 to attempt to reduce the deviation. For example, if, following an initial portion of the pulse, the measured topside temperature trajectory is hotter (or cooler) than the estimated topside temperature trajectory, block 540 directs the processor circuit 110 to modify a remaining portion of the pulse by controlling the high-speed power amplifier 294 to decrease (or increase) the rate at which electrical energy is discharged through the flash lamp 183 by the transient energy power system 292, to attempt to bring the measured trajectory $T_Z(t)$ closer to the estimated trajectory $\hat{T}_Z(t)$. More particularly, in this embodiment block 540 directs the processor circuit 110 to achieve such control using a proportional-integral-derivative (PID) control method.

Alternatively, a predictive control strategy for a delayed dynamic system, or more generally different control methods, may be substituted.

Alternatively, or in addition, block 540 may direct the processor circuit 110 to co-operate with the wafer motion measurement system 232, to monitor deformation of the wafer 120 during the irradiance pulse 600, and to control the topside irradiance system 180 to modify the pulse in response to the measured deformation. More particularly, as noted above, in this embodiment the wafer deformation measuring system 232 is configured to measure deformation of the wafer 120 by estimating a set of normals to the backside surface 124 of the wafer, as described in the "Other Illustrative Alternatives" section of the incorporated PCT publication no. WO 2009/137940. In this embodiment, a modified block 540 directs the processor circuit to directly convert the estimated surface normals into wafer edge and center deflection measurements.

The resulting measurements of wafer motion can then be used in a number of ways to achieve closed-loop feedback control of the irradiance pulse. For example, as discussed above under the heading, "Underlying Principles", the time domain measurements of transverse motion of the wafer and estimates of the nth derivatives of the wafer's motion can be used to estimate a change in the frequency domain representation $Z(\omega_{mn})$ of the wafer's transverse motion, based on at least one set of any two estimates of $Z(\omega_{mn})$, and the associated ratio change in $Z(\omega_{mn})$ can be directly related to a ratio change in the frequency domain representation of the flux $F(\omega_{mn})$. If this latter change is outside a set of predetermined bounds for $F(\omega_{mn})$, the rate of change of flux in the time domain is adjusted to bring the change in $F(\omega_{mn})$ back within the predetermined bounds.

Alternatively, the wafer motion measurements may be used in the time domain for similar feedback control of the irradiance pulse 600. For example, in one such embodiment, estimates of the motion of the edge and of the center of the wafer 120 can be obtained using finite element analysis, in the same manner as the wafer center and edge deflections discussed above in connection with FIGS. 9 and 10. If the measured wafer or edge deflections exceed the estimated deflections, a modified block 540 may direct the processor circuit 110 to control the high-speed power amplifier 294 to adjust the rate at which electrical energy is being discharged from the transient energy power system 292 through the flash lamp 183, to attempt to reduce excitation of the higher-frequency modes. In another such embodiment, such deformation feedback control may be combined with temperature feedback control as described above, and the deformation-driven feedback control may be limited to making adjustments that do not cause the measured device side temperature $T_T(t)$ to deviate from the estimated temperature $\hat{T}(0,t)$ by more than the predefined threshold amount.

As a further example, in another illustrative embodiment, a deformation profile is defined over the heating portion 602 and the sustaining portion 604 for at least one point on the wafer, subject to a reduced set of thermal cycle parameters including a target peak temperature $T_P$ and a time-at-temperature $t_{atT}$. More particularly, the deformation profile for the heating portion 602 follows a general profile based on finite element predictions that provides minimal vibration, and the deformation profile of the sustaining portion maintains the wafer deformation that exists at the point in time the peak temperature is reached. The rate at which electrical energy is being discharged from the transient energy power system 292 through the flash lamp 183 is adjusted to maintain the deviation between the predicted and measured deformation profiles within a user-defined or predefined bound until the peak temperature is reached and the time-at-temperature interval is achieved.

Referring back to FIGS. 1 and 2, although only a single flash lamp 183 was described above for illustrative purposes, if desired, the topside irradiance system 180 may include four separately controllable flash lamps 182, 183, 185 and 187, each having a separately controllable topside heating power supply system 189, 191, 193 and 195. The separately controllable topside heating power supply systems 189, 193 and 195 may be identical to the topside heating power supply system 191 described above.

Alternatively, in a further embodiment, each of the topside heating power supply systems 189, 191, 193 and 195, including its high-speed power amplifier, may be omitted and replaced with power control circuitry identical to the power control circuits disclosed in the incorporated PCT publication no. WO 2008/131513 or in the earlier incorporated US patent application publication no. US 2007/0069161. Such an alternative may advantageously facilitate software or firmware retrofits of existing heat-treating apparatus that may have been constructed according to the above PCT or US specifications, without requiring hardware modifications to the high-voltage power supply circuitry.

Referring to FIGS. 1, 2 and 5, in such an embodiment, block 530 of the heat-treating routine 324 may be modified, to configure the processor circuit 110 to control the topside irradiance system 180 to generate the irradiance pulse 600 by superposing a plurality of irradiance pulses to approximate the determined shape of the irradiance pulse. The topside irradiance system disclosed in the incorporated PCT publication no. WO 2008/131513 is already structurally configured to superpose multiple pulses to approximate a desired pulse shape, but the desired pulse shape disclosed in this PCT publication differs from the desired pulse shape of the present embodiment. As disclosed in WO 2008/131513, the processor circuit is capable of storing a respective capacitor bank charging voltage for each one of the four power supply systems 189, 191, 193 and 195, and a respective discharge time at which each of the power supplies is to begin discharging through its respective flash lamp. Each of the power supplies also includes a rudimentary power reduction circuit and power boost circuit for modifying the power rate at which each capacitor bank discharges, if desired. In WO 2008/131513, however, all of the capacitor banks are typically charged to the same voltage of 2700 V, so that the irradiance pulse produced by each flash lamp effectively has the same amplitude, and the power reduction and power boost circuits are used only for closed loop real-time feedback control. In the main embodiment of WO 2008/131513, the flash lamps 182 and 187 are discharged simultaneously at time t=0, to collectively produce an irradiance pulse twice as large as the pulse of any one of the flash lamps in isolation; the flash lamp 183 is then discharged at a later time t=0.8 ms, and the flash lamp 185 is discharged at a later time t=1.8 ms. In contrast, in the present embodiment, the charging voltages and discharge times are varied. In particular, the capacitor bank for the flash lamp 182 is charged to a first voltage $V_1 \ll V_{MAX}$, where $V_{MAX}$ is the maximum charging voltage of the capacitor bank (in this case, 2700 V); the capacitor bank for the flash lamp 187 is charged to a second voltage $V_2$ such that $V_1 < V_2 \ll V_{MAX}$ the capacitor bank for the flash lamp 183 is charged to $V_{MAX}$; and the capacitor bank for the flash lamp 185 is charged to a third voltage $V_3$ such that $V_1 < V_2 < V_3 < V_{MAX}$. At time $t_0$, discharge of the flash lamp 182 is commenced, to produce a comparatively small irradiance pulse. At time $t_a > t_0$, before the first irradiance pulse has completed its discharge, discharge of the flash lamp 187 is commenced, to produce a second pulse whose amplitude is somewhat larger than that of the first pulse, but still much less than the maximum amplitude that each flash lamp is capable of producing. At time $t_b > t_a$, before the second irradiance pulse has completed its discharge, discharge of the flash lamp 183 is commenced, to produce a third pulse whose amplitude is considerably larger than that of the first pulse or the second pulse. At time $t_c > t_b$, before the third irradiance pulse has completed its discharge, discharge of the flash lamp 185 is commenced, to produce a fourth pulse whose amplitude is somewhat larger than that of the first or the second pulse, but smaller than that of the third pulse. Each one of the four pulses temporally overlaps with at least one of the other four pulses, so that the four pulses effectively superpose to form a single irradiance pulse. The first and second pulses and a leading edge of the third pulse superpose to approximate the heating portion 602 of the irradiance pulse 600, while a trailing edge of the third pulse superposes with the fourth pulse to approximate the sustaining portion 604 of the irradiance pulse.

In another similar embodiment, the capacitor bank for the flash lamp 183 is charged to a first voltage $V_1 \ll V_{MAX}$, where $V_{MAX}$ is the maximum charging voltage of the capacitor bank (in this case, 2700 V); the capacitor bank for the flash lamp 185 is charged to a second voltage $V_2$ such that $V_1 < V_2 \ll V_{MAX}$; and the capacitor banks for the flash lamps 182 and 187 are both charged to the same voltage $V_3$ such that $V_1 < V_2 < V_3 \leq V_{MAX}$. At time $t_0$, discharge of the flash lamp 183 is commenced, to produce a comparatively small irradiance pulse. At time $t_a > t_0$, before the first irradiance pulse has completed its discharge, discharge of the flash lamp 185 is commenced, to produce a second pulse whose amplitude is somewhat larger than that of the first pulse, but still much less than the maximum amplitude that each flash lamp is capable of producing. At time $t_b > t_a$, before the second irradiance pulse has completed its discharge, simultaneous discharge of the flash lamps 182 and 187 is commenced, to produce a third pulse whose amplitude is considerably larger than that of the first pulse or the second pulse. Each one of the three pulses temporally overlaps with at least one of the other two pulses, so that the three pulses effectively superpose to form a single irradiance pulse, to approximate the heating portion 602 and the sustaining portion 604 of the irradiance pulse 600.

In the two similar embodiments described immediately above, the processor circuit 110 is configured to control the irradiance system to cause each interval between commencement of any two of the plurality of irradiance pulses to be unequal to each period of each respective one of the resonant frequencies of the wafer.

If desired, the power reduction and boost circuits of the power supply systems 189, 191, 193 and 195 may also be controlled by the processor circuit 110 to either weaken a pulse by dissipating some of its supplied electrical discharge through a resistor, or to boost the rise rate of the pulse by redirecting its supplied electrical discharge through a lower-inductance electrical pathway than its primary discharge pathway. Although WO 2008/131513 discloses such pulse modification for the purpose of real-time closed loop feedback control of the irradiance pulse, in the present embodiment the power reduction and boost circuits may be strategically employed for the initial shaping of the pulses which are to be superposed, in order to broaden the range of pulse shapes that can be easily formed using only the four flash lamps 182, 183, 185 and 187. Alternatively, a larger number of small flash lamps may be substituted, in order to more easily superpose a larger number of smaller pulses into the desired pulse shape. Such embodiments should preferably be designed to avoid or minimize any spatial non-uniformity in the irradiance flux with which the wafer is irradiated. As discussed in greater detail in commonly owned U.S. Pat. No. 6,303,411, spatially non-uniform irradiance induces lateral thermal gradients across the device side of the wafer, which may tend to cause numerous problems such as crystal plane slippage or crystal lattice breakage, warpage, defect generation, or non-uniform performance-related characteristics. In addition, non-uniform irradiance of the device side may tend to unnecessarily stimulate diameter-mode resonant frequencies of the wafer.

Referring back to FIG. 6, in a further illustrative embodiment, the processor circuit 110 is configured to cause the heating portion 602 to have a duration between about one-eighth and about one-half of a period of a fundamental vibrational mode of the wafer. It will be recalled that in the present embodiment, the fundamental circular vibration mode (0,1) has a resonant frequency of about 113 Hz, corresponding to a period of about 8.8 milliseconds, and thus, the above range corresponds to a heating portion duration between about 1.1 and about 4.4 milliseconds. Accordingly, in this embodiment, the processor circuit 110 is configured to cause the heating portion to have a duration between about 1.2 and about 4.2 ms.

Similarly, in a further alternative embodiment, the processor circuit 110 is configured to cause the heating portion 602 to have a duration between about one-tenth and about four times a thermal time constant of the wafer. In this embodiment, the thermal time constant of the wafer, also referred to as the thermal conduction time of the wafer, refers to the time required for heat to travel from the device side 122 through the thickness of the wafer, and is typically about 15 ms for a silicon semiconductor wafer at room temperature (though the thermal time "constant" may actually vary with temperature). Accordingly, in this embodiment, the processor circuit is configured to cause the heating portion 602 to have a duration between about 1.5 and about 60 ms.

More generally, while specific embodiments have been described and illustrated, such embodiments should be considered illustrative of the invention only and not as limiting the invention as construed in accordance with the accompanying claims.

What is claimed is:

1. A method of determining a shape of an irradiance pulse to which a workpiece is to be exposed during a thermal cycle, the method comprising:

a) receiving, with a processor circuit, thermal cycle parameters specifying requirements of the thermal cycle;

b) determining, with the processor circuit, a shape of a heating portion of the irradiance pulse, wherein determining comprises optimizing at least one parameter of a flux profile model of the heating portion of the irradiance pulse to satisfy the requirements while minimizing frequency-domain energy spectral densities of the flux profile model at resonant frequencies of the workpiece, to minimize vibration of the workpiece at the resonant frequencies when the workpiece is exposed to the irradiance pulse; and c) generating the irradiance pulse, incident on the workpiece.

2. The method of claim 1 wherein: the workpiece comprises a semiconductor wafer having a device side which is to be exposed to the irradiance pulse during the thermal cycle; wherein determining the shape of the heating portion of the irradiance pulse comprises optimizing the at least one parameter of the flux profile model of the heating portion of the irradiance pulse to satisfy the requirements while minimizing frequency-domain energy spectral densities of the flux profile model at resonant frequencies of the semiconductor wafer, to minimize vibration of the wafer at the resonant frequencies when the device side is exposed to the irradiance pulse; and wherein generating the irradiance pulse incident on the workpiece comprises generating the irradiance pulse incident on the wafer.

3. The method of claim 2 wherein optimizing causes the heating portion to have a duration between about one-eighth and about one-half of a period of a fundamental vibrational mode of the wafer.

4. The method of claim 3 wherein optimizing causes the heating portion to have a duration between about 1.2 and about 4.2 ms.

5. The method of claim 2 wherein optimizing causes the heating portion to have a duration between about one-tenth and about four times a thermal time constant of the wafer.

6. The method of claim 5 wherein optimizing causes the heating portion to have a duration between about 1.5 and about 60 ms.

7. The method of claim 2 wherein optimizing comprises optimizing a bandwidth parameter of the flux profile model associated with a rise rate of the heating portion of the irradiance pulse.

8. The method of claim 7 wherein the flux profile model comprises a non-linear function.

9. The method of claim 8 wherein the flux profile model comprises a function from the class of exponential functions.

10. The method of claim 8 wherein the flux profile model comprises a function from the class of sigmoidal functions.

11. The method of claim 7 wherein the flux profile model comprises a function whose rate of change in the time domain increases monotonically from commencement until at least a time at which a value of the function reaches 25% of its peak value.

12. The method of claim 7 wherein the flux profile model comprises a function whose rate of change in the time domain increases monotonically from commencement until at least a time at which a value of the function reaches 95% of its peak value.

13. The method of claim 7 wherein the flux profile model comprises a function of the form:

$$Q_h(t; c, a) = cf(t, a) = c\frac{e^{at}-1}{k}$$

wherein:
Q(t;c,a) is irradiance flux as a function of time t and parameters a and c;
a is the bandwidth parameter;
c is a scaling parameter associated with a peak magnitude of the heating portion;
e is the Euler number; and
k is defined as $k = e^{at_1} - 1$, where $t_1$ is a rise time of the heating portion from commencement to peak magnitude.

14. The method of claim 7 wherein the flux profile model comprises a function of the form:

$$Q_h(t; c, a) = cf(t, a) = c\left(1 - \frac{e^{-(t-k)a}}{1 + e^{-(t-k)a}}\right)$$

wherein:
Q(t;c,a) is irradiance flux as a function of time t and parameters a and c;
a is the bandwidth parameter;
c is a scaling parameter associated with a peak magnitude of the heating portion;
e is the Euler number; and
k is defined as $$k = \frac{6}{a}.$$

15. The method of claim 7 further comprising identifying a value of a scaling parameter of the flux profile model associated with a peak magnitude of the heating portion of the irradiance pulse.

16. The method of claim 15 further comprising identifying a value of a rise time parameter of the flux profile model representing a time interval between a commencement of the irradiance pulse and the peak magnitude.

17. The method of claim 2 wherein the flux profile model has a plurality of flux profile model parameters comprising the at least one parameter, and wherein optimizing comprises estimating effects on the wafer that would result from application of an irradiance pulse comprising a heating portion corresponding to the flux profile model and an initial set of values of the flux profile model parameters.

18. The method of claim 17 wherein estimating effects comprises estimating temperatures $\hat{T}(z,t)$ of the wafer as a function of wafer depth z and time t.

19. The method of claim 17 wherein estimating effects comprises estimating device side temperatures $\hat{T}_T(t)$ and substrate side temperatures $\hat{T}_B(t)$ of the wafer.

20. The method of claim 19 wherein estimating effects further comprises estimating a peak device side temperature $\hat{T}_P$ and a maximum substrate side temperature $\hat{T}_{BMAX}$ of the wafer.

21. The method of claim 20 wherein estimating effects further comprises estimating a time-at-temperature interval $\hat{t}_{atT}$ at which the device side temperature $\hat{T}_T(t)$ will remain within a predefined range from the peak device side temperature $\hat{T}_P$, and a start time $t_s$ and an end time $t_e$ of the time-at-temperature interval.

22. The method of claim 17 wherein optimizing comprises minimizing errors between the estimated effects and the thermal cycle requirements specified by the thermal cycle parameters.

23. The method of claim 22 wherein minimizing comprises minimizing an error measure, the error measure comprising error terms associated with the errors between the estimated effects and the thermal cycle requirements and a flux profile model parameter term associated with the at least one parameter of the flux profile model of the heating portion of the irradiance pulse.

24. The method of claim 23 wherein minimizing comprises calculating the errors between the estimated effects and the thermal cycle requirements specified by the thermal cycle parameters.

25. The method of claim 24 wherein:
estimating effects comprises estimating at least a peak device side temperature $\hat{T}_P$, a maximum substrate side temperature $\hat{T}_{BMAX}$ of the wafer, and a time-at-temperature interval $\hat{t}_{atT}$ at which the device side temperature $\hat{T}_T(t)$ will remain within a predefined range from the peak device side temperature $\hat{T}_P$;
receiving the thermal cycle parameters comprises receiving at least a peak device side temperature $T_P$ of the wafer, a maximum substrate side temperature $T_{BMAX}$ of the wafer, and a time-at-temperature interval $t_{atT}$ at which the device side temperature $T_T(t)$ must remain within the predefined range from the peak device side temperature $T_P$ to result from application of the irradiance pulse to the wafer;
the initial values of the flux profile model parameters comprise at least a bandwidth parameter a associated with a rise rate of the heating portion of the irradiance pulse, a scaling parameter c associated with the peak magnitude of the heating portion, and a time interval $t_1$ between a commencement of the heating portion and a peak magnitude of the heating portion; and
calculating the error measure comprises calculating an error measure ê as:

$$\hat{e}(c, a, t_1) = \sqrt{w_1\left(T_P - \hat{T}_P^{(c,a,t_1)}\right)^2 + w_2\left(T_{BMAX} - \hat{T}_{BMAX}^{(c,a,t_1)}\right)^2 + w_3\left(t_{atT} - \hat{t}_{atT}^{(c,a,t_1)}\right)^2 + w_4 a^2}$$

wherein $w_1$, $w_2$, $w_3$ and $w_4$ are weighting coefficients.

26. The method of claim 24 further comprising:
selecting a new set of values of the flux profile model parameters;
estimating effects on the wafer that would result from application of an irradiance pulse corresponding to the flux profile model and the new set of values of the flux profile model parameters;
calculating an error measure corresponding to the errors between the estimated effects and the thermal cycle requirements specified by the thermal cycle parameters;
repeating the selecting of the new set of values, the estimating of the effects on the wafer and the calculating of the error measure over a range of possible values for each flux profile model parameter; and
identifying the minimum calculated error measure and its associated set of flux model parameter values.

27. The method of claim 26 further comprising:
interpolating error measure values to generate a smoothed error hypersurface including at least the minimum calculated error measure and calculated error measures for flux model parameter values surrounding the set of flux model parameter values associated with the minimum calculated error measure;

identifying, as optimal flux profile model parameter values, a set of flux profile model parameter values associated with a minimum error measure value on the smoothed error hypersurface.

28. The method of claim 2 further comprising determining, with the processor circuit, a shape of a sustaining portion of the irradiance pulse which immediately follows the heating portion of the pulse.

29. The method of claim 28 wherein receiving the thermal cycle parameters comprises receiving at least a peak device side temperature $T_P$ of the wafer and a time-at-temperature interval $t_{atT}$ at which the device side temperature $T_T(t)$ must remain within a predefined range from the peak device side temperature $T_P$, wherein determining the shape of the heating portion of the irradiance pulse comprises determining a heating portion pulse shape to heat the device side to the peak device side temperature $T_P$, and wherein determining the shape of the sustaining portion comprises determining a sustaining portion pulse shape to sustain the device side temperature $T_T(t)$ within the predefined range from the peak device side temperature $T_P$ for the time-at-temperature interval $t_{atT}$.

30. The method of claim 2 wherein generating the irradiance pulse comprises superposing a plurality of irradiance pulses to approximate the determined shape of the irradiance pulse.

31. The method of claim 30 wherein each interval between commencement of any two of the plurality of irradiance pulses is unequal to each period of each respective one of the resonant frequencies of the wafer.

32. The method of claim 2 wherein generating the irradiance pulse comprises controlling a current amplifier in electrical communication with at least one flash lamp.

33. The method of claim 32 wherein controlling a current amplifier comprises controlling a switch mode power supply.

34. The method of claim 32 wherein controlling comprises controlling a current amplifier having negligible noise at the resonant frequencies of the wafer.

35. The method of claim 2 further comprising monitoring an effect of the irradiance pulse on the wafer in real time during the irradiance pulse and modifying the irradiance pulse in response to the monitored effect.

36. The method of claim 35 wherein monitoring comprises monitoring a surface temperature of the wafer during the irradiance pulse.

37. The method of claim 35 wherein monitoring comprises monitoring deformation of the wafer during the irradiance pulse.

38. The method of claim 2 wherein the wafer comprises a 300 mm diameter semiconductor wafer, and wherein the resonant frequencies of the wafer comprise circular vibration mode frequencies of approximately 113 Hz (mode (0,1)), 476 Hz (mode (0,2)), and 1080 Hz (mode (0,3)).

39. An apparatus for determining a shape of an irradiance pulse to which a workpiece is to be exposed during a thermal cycle, the apparatus comprising:

a processor circuit configured to:
a) receive thermal cycle parameters specifying requirements of the thermal cycle;
b) determine a shape of a heating portion of the irradiance pulse, by optimizing at least one parameter of a flux profile model of the heating portion of the irradiance pulse to satisfy the requirements while minimizing frequency-domain energy spectral densities of the flux profile model at resonant frequencies of the workpiece, to minimize vibration of the workpiece at the resonant frequencies when the workpiece is exposed to the irradiance pulse; and an irradiance system configured to generate the irradiance pulse, incident on the workpiece.

40. The apparatus of claim 39, wherein: the workpiece comprises a semiconductor wafer having a device side which is to be exposed to the irradiance pulse during the thermal cycle; wherein the processor circuit is configured to determine the shape of the heating portion of the irradiance pulse by optimizing the at least one parameter of the flux profile model of the heating portion of the irradiance pulse to satisfy the requirements while minimizing frequency-domain energy spectral densities of the flux profile model at resonant frequencies of the wafer, to minimize vibration of the wafer at the resonant frequencies when the device side of the wafer is exposed to the irradiance pulse; and wherein the irradiance system is configured to generate the irradiance pulse, incident on the wafer.

41. The apparatus of claim 40 wherein the processor circuit is configured to cause the heating portion to have a duration between about one-eighth and about one-half of a period of a fundamental vibrational mode of the wafer.

42. The apparatus of claim 41 wherein the processor circuit is configured to cause the heating portion to have a duration between about 1.2 and about 4.2 ms.

43. The apparatus of claim 40 wherein the processor circuit is configured to cause the heating portion to have a duration between about one-tenth and about four times a thermal time constant of the wafer.

44. The apparatus of claim 43 wherein the processor circuit is configured to cause the heating portion to have a duration between about 1.5 and about 60 ms.

45. The apparatus claim 40 wherein the processor circuit is configured to optimize a bandwidth parameter of the flux profile model associated with a rise rate of the heating portion of the irradiance pulse.

46. The apparatus of claim 45 wherein the flux profile model comprises a non-linear function.

47. The apparatus of claim 46 wherein the flux profile model comprises a function from the class of exponential functions.

48. The apparatus of claim 46 wherein the flux profile model comprises a function from the class of sigmoidal functions.

49. The apparatus of claim 45 wherein the flux profile model comprises a function whose rate of change in the time domain increases monotonically from commencement until at least a time at which a value of the function reaches 25% of its peak value.

50. The apparatus of claim 45 wherein the flux profile model comprises a function whose rate of change in the time domain increases monotonically from commencement until at least a time at which a value of the function reaches 95% of its peak value.

51. The apparatus of claim 45 wherein the flux profile model comprises a function of the form:

$$Q_h(t, c, a) = cf(t, a) = c\frac{e^{at} - 1}{k}$$

wherein:
Q(t;c,a) is irradiance flux as a function of time t and parameters a and c;

a is the bandwidth parameter;

c is a scaling parameter associated with a peak magnitude of the heating portion;

e is the Euler number; and k is defined as $k=e^{at_1}-1$, where $t_1$ is a rise time of the heating portion from commencement to peak magnitude.

52. The apparatus of claim 45 wherein the flux profile model comprises a function of the form:

$$Q_h(t; c, a) = cf(t, a) = c\left(1 - \frac{e^{-(t-k)a}}{1 + e^{-(t-k)a}}\right)$$

wherein:

Q(t;c,a) is irradiance flux as a function of time t and parameters a and c;

a is the bandwidth parameter;

c is a scaling parameter associated with a peak magnitude of the heating portion;

e is the Euler number; and k is defined as $$k = \frac{6}{a}.$$

53. The apparatus of claim 45 wherein the processor circuit is configured to identify a value of a scaling parameter of the flux profile model associated with a peak magnitude of the heating portion of the irradiance pulse.

54. The apparatus of claim 53 wherein the processor circuit is configured to identify a value of a rise time parameter of the flux profile model representing a time interval between a commencement of the irradiance pulse and the peak magnitude.

55. The apparatus of claim 40 wherein the flux profile model has a plurality of flux profile model parameters comprising the at least one parameter, and wherein the processor circuit is configured to estimate effects on the wafer that would result from application of an irradiance pulse comprising a heating portion corresponding to the flux profile model and an initial set of values of the flux profile model parameters.

56. The apparatus of claim 55 wherein the effects on the wafer which the processor circuit is configured to estimate comprise temperatures $\hat{T}(z,t)$ of the wafer as a function of wafer depth z and time t.

57. The apparatus of claim 55 wherein the effects on the wafer which the processor circuit is configured to estimate comprise device side temperatures $\hat{T}_T(t)$ and substrate side temperatures $\hat{T}_B(t)$ of the wafer.

58. The apparatus of claim 57 wherein the effects on the wafer which the processor circuit is configured to estimate further comprise a peak device side temperature $\hat{T}_P$ and a maximum substrate side temperature $\hat{T}_{BMAX}$ of the wafer.

59. The apparatus of claim 58 wherein the effects on the wafer which the processor circuit is configured to estimate further comprise a time-at-temperature interval $\hat{t}_{atT}$ at which the device side temperature $\hat{T}_T(t)$ will remain within a predefined range from the peak device side temperature $\hat{T}_P$, and a start time $t_s$ and an end time $t_e$ of the time-at-temperature interval.

60. The apparatus of claim 55 wherein the processor circuit is configured to minimize errors between the estimated effects and the thermal cycle requirements specified by the thermal cycle parameters.

61. The apparatus of claim 55 wherein the processor circuit is configured to minimize an error measure, the error measure comprising error terms associated with the errors between the estimated effects and the thermal cycle requirements and a flux profile model parameter term associated with the at least one parameter of the flux profile model of the heating portion of the irradiance pulse.

62. The apparatus of claim 61 wherein the processor circuit is configured to calculate the errors between the estimated effects and the thermal cycle requirements specified by the thermal cycle parameters.

63. The apparatus of claim 62 wherein:

the effects on the wafer which the processor circuit is configured to estimate comprise at least a peak device side temperature $\hat{T}P$, a maximum substrate side temperature $\hat{T}_{BMAX}$ of the wafer, and a time-at-temperature interval $\hat{t}_{atT}$ at which the device side temperature $\hat{T}_T(t)$ will remain within a predefined range from the peak device side temperature $\hat{T}_P$;

the thermal cycle parameters which the processor circuit is configured to receive comprise at least a peak device side temperature $T_P$ of the wafer, a maximum substrate side temperature $T_{BMAX}$ of the wafer, and a time-at-temperature interval $t_{atT}$ at which the device side temperature $T_T(t)$ must remain within the predefined range from the peak device side temperature $T_P$ to result from application of the irradiance pulse to the wafer;

the initial values of the flux profile model parameters comprise at least a bandwidth parameter a associated with a rise rate of the heating portion of the irradiance pulse, a scaling parameter c associated with the peak magnitude of the heating portion, and a time interval $t_1$ between a commencement of the heating portion and a peak magnitude of the heating portion; and the error measure which the processor circuit is configured to calculate comprises an error measure $\hat{e}$ of the form:

$$\hat{e}(c, a, t_1) = \sqrt{w_1\left(T_P - \hat{T}_P^{(c,a,t_1)}\right)^2 + w_2\left(T_{BMAX} - \hat{T}_{BMAX}^{(c,a,t_1)}\right)^2 + w_3\left(t_{atT} - \hat{t}_{atT}^{(c,a,t_1)}\right)^2 + w_4 a^2}$$

wherein $w_1$, $w_2$, $w_3$ and $w_4$ are weighting coefficients.

64. The apparatus of claim 62 wherein the processor circuit is further configured to:

select a new set of values of the flux profile model parameters;

estimate effects on the wafer that would result from application of an irradiance pulse corresponding to the flux profile model and the new set of values of the flux profile model parameters;

calculate an error measure corresponding to the errors between the estimated effects and the thermal cycle requirements specified by the thermal cycle parameters; and repeat the steps of selecting the new set of values, estimating the effects on the wafer and calculating the error measure over a range of possible values for each flux profile model parameter; and identify the minimum calculated error measure and its associated set of flux model parameter values.

65. The apparatus of claim 64 wherein the processor circuit is further configured to:

interpolate error measure values to generate a smoothed error hypersurface including at least the minimum calculated error measure and calculated error measures for flux model parameter values surrounding the set of flux model parameter values associated with the minimum calculated error measure;

identify, as optimal flux profile model parameter values, a set of flux profile model parameter values associated with a minimum error measure value on the smoothed error hypersurface.

66. The apparatus of claim 40 wherein the processor circuit is further configured to determine a shape of a sustaining portion of the irradiance pulse which immediately follows the heating portion of the pulse.

67. The apparatus of claim 66 wherein the thermal cycle parameters which the processor circuit is configured to receive comprise at least a peak device side temperature $T_P$ of the wafer and a time-at-temperature interval $t_{atT}$ at which the device side temperature $T_T$ (t) must remain within a predefined range from the peak device side temperature $T_P$, wherein the processor circuit is configured to determine the shape of the heating portion of the irradiance pulse by determining a heating portion pulse shape to heat the device side to the peak device side temperature $T_P$, and wherein the processor circuit is configured to determine the shape of the sustaining portion by determining a sustaining portion pulse shape to sustain the device side temperature $T_T$ (t) within the predefined range from the peak device side temperature $T_P$ for the time-at-temperature interval $t_{atT}$.

68. The apparatus of claim 40 wherein the processor circuit is configured to control the irradiance system to generate the irradiance pulse, incident on the wafer.

69. The apparatus of claim 68 wherein the processor circuit is configured to control the irradiance system to generate the irradiance pulse by superposing a plurality of irradiance pulses to approximate the determined shape of the irradiance pulse.

70. The apparatus of claim 69 wherein the processor circuit is configured to control the irradiance system to cause each interval between commencement of any two of the plurality of irradiance pulses to be unequal to each period of each respective one of the resonant frequencies of the wafer.

71. The apparatus of claim 68 wherein the irradiance system comprises a current amplifier in electrical communication with at least one flash lamp, and wherein the processor circuit is configured to generate the irradiance pulse by controlling the current amplifier.

72. The apparatus of claim 71 wherein the current amplifier comprises a switch mode power supply.

73. The apparatus of claim 71 wherein the current amplifier has negligible noise at the resonant frequencies of the wafer.

74. The apparatus of claim 68 further comprising a monitoring system in communication with the processor circuit, wherein the processor circuit is configured to cooperate with the monitoring system to monitor an effect of the irradiance pulse on the wafer in real time during the irradiance pulse, and wherein the processor circuit is configured to control the irradiance system to modify the irradiance pulse in response to the monitored effect.

75. The apparatus of claim 74 wherein the monitoring system comprises a temperature measurement system configured to measure a surface temperature of the wafer during the irradiance pulse.

76. The apparatus of claim 74 wherein the monitoring system comprises a wafer deformation system configured to monitor deformation of the wafer during the irradiance pulse.

77. The apparatus of claim 40 wherein the wafer comprises a 300 mm diameter semiconductor wafer, and wherein the resonant frequencies of the wafer comprise circular vibration mode frequencies of approximately 113 Hz (mode (0,1)), 476 Hz (mode (0,2)), and 1080 Hz (mode (0,3)).

78. An apparatus for determining a shape of an irradiance pulse to which a workpiece is to be exposed during a thermal cycle, the apparatus comprising:
a) means for receiving thermal cycle parameters specifying requirements of the thermal cycle;
b) means for determining a shape of a heating portion of the irradiance pulse, wherein the means for determining comprises means for optimizing at least one parameter of a flux profile model of the heating portion of the irradiance pulse to satisfy the requirements while minimizing frequency-domain energy spectral densities of the flux profile model at resonant frequencies of the workpiece, to minimize vibration of the workpiece at the resonant frequencies when the workpiece is exposed to the irradiance pulse; and
c) means for generating the irradiance pulse, incident on the workpiece.

79. The apparatus of claim 78, wherein: the workpiece comprises a semiconductor wafer having a device side which is to be exposed to the irradiance pulse during the thermal cycle; wherein the means for optimizing comprises means for optimizing the at least one parameter of the flux profile model of the heating portion of the irradiance pulse to satisfy the requirements while minimizing frequency-domain energy spectral densities of the flux profile model at resonant frequencies of the wafer, to minimize vibration of the wafer at the resonant frequencies when the device side of the wafer is exposed to the irradiance pulse; and wherein the means for generating the irradiance pulse incident on the workpiece comprises means for generating the irradiance pulse incident on the wafer.

80. A non-transitory computer-readable medium for directing a at least one processor circuit to determine a shape of an irradiance pulse to which a workpiece is to be exposed during a thermal cycle, the computer-readable medium storing:
a) instruction codes for configuring the at least one processor circuit to receive thermal cycle parameters specifying requirements of the thermal cycle;
b) instruction codes for configuring the at least one processor circuit to determine a shape of a heating portion of the irradiance pulse, by optimizing at least one parameter of a flux profile model of the heating portion of the irradiance pulse to satisfy the requirements while minimizing frequency-domain energy spectral densities of the flux profile model at resonant frequencies of the workpiece, to minimize vibration of the workpiece at the resonant frequencies when the workpiece is exposed to the irradiance pulse; and
c) instruction codes for configuring the at least one processor circuit to control an irradiance system to generate the irradiance pulse, incident on the workpiece.

81. The medium of claim 80 wherein: the workpiece comprises a semiconductor wafer having a device side which is to be exposed to the irradiance pulse during the thermal cycle; wherein the instruction codes for configuring the processor circuit to determine the shape of the heating portion of the irradiance pulse comprise instruction codes for configuring the processor circuit to optimize the at least one parameter of the flux profile model of the heating portion of the irradiance pulse to satisfy the requirements while minimizing frequency-domain energy spectral densities of the flux profile model at resonant frequencies of the wafer, to minimize vibration of the wafer at the resonant frequencies when the device side of the wafer is exposed to the irradiance pulse; and wherein the instruction codes for configuring the at least one processor circuit to control the irradiance system to generate the irradiance pulse incident on the workpiece comprise instruction codes for configuring the at least one processor circuit to control the irradiance system to generate the irradiance pulse incident on the wafer.

* * * * *